US012763691B1

(12) United States Patent
Vinciarelli

(10) Patent No.: US 12,763,691 B1
(45) Date of Patent: Oct. 13, 2026

(54) MULTI-PHASE DISTRIBUTED-OUTPUT POWER CONVERTERS

(71) Applicant: Vicor Corporation, Andover, MA (US)

(72) Inventor: Patrizio Vinciarelli, Boston, MA (US)

(73) Assignee: Vicor Corporation, Andover, MA (US)

( * ) Notice: Subject to any disclaimer, the term of this patent is extended or adjusted under 35 U.S.C. 154(b) by 211 days.

(21) Appl. No.: 18/802,177

(22) Filed: Aug. 13, 2024

Related U.S. Application Data

(60) Provisional application No. 63/532,666, filed on Aug. 14, 2023.

(51) Int. Cl.

| | |
|---|---|
| ***H02M 3/335*** | (2006.01) |
| ***H01F 27/30*** | (2006.01) |
| ***H02M 1/00*** | (2006.01) |
| ***H05K 1/02*** | (2006.01) |
| ***H05K 1/14*** | (2006.01) |
| ***H05K 1/181*** | (2026.01) |
| ***H05K 3/28*** | (2006.01) |

(52) U.S. Cl.
CPC ...... *H02M 3/33561* (2013.01); *H01F 27/306* (2013.01); *H02M 1/0064* (2021.05); *H02M 3/33569* (2013.01); *H05K 1/0298* (2013.01); *H05K 1/141* (2013.01); *H05K 1/181* (2013.01); *H05K 3/284* (2013.01); *H05K 2201/086* (2013.01); *H05K 2201/10053* (2013.01); *H05K 2203/1316* (2013.01)

(58) Field of Classification Search
CPC ............ H02M 3/33561; H02M 1/0064; H01F 27/306
USPC .......................................................... 361/748
See application file for complete search history.

(56) References Cited

U.S. PATENT DOCUMENTS

| | | | |
|---|---|---|---|
| 4,665,357 | A | 5/1987 | Herbert |
| 4,845,606 | A | 7/1989 | Herbert |
| 4,916,576 | A | 4/1990 | Herbert |
| 6,362,986 | B1 | 3/2002 | Schultz et al. |
| 6,820,321 | B2 | 11/2004 | Harding |
| 6,930,893 | B2 | 8/2005 | Vinciarelli |
| 6,975,098 | B2 | 12/2005 | Vinciarelli |
| 6,984,965 | B2 | 1/2006 | Vinciarelli |

(Continued)

OTHER PUBLICATIONS

U.S. Appl. No. 16/878,263, Lavery et al., filed May 19, 2020.

(Continued)

*Primary Examiner* — Andargie M Aychillhum
(74) *Attorney, Agent, or Firm* — Fish & Richardson P.C.

(57) ABSTRACT

A distributed-output multi-cell power converter utilizes a multiplicity of magnetic core elements, switching elements, and terminal connections in a step and repeat pattern. Stepped secondary-winding elements reduce converter output resistance and improve converter efficiency and scalability to support the high current requirements of very large scale integrated ("VLSI") circuits. The multi-cell power converter can use two-phase cells with three or five core legs, or three-phase cells with four or seven core legs. Some examples of the multi-cell converter include integrated secondary-side switching devices having control circuitry that monitors circuit conditions to determine when the switching device is to be ON and OFF, thereby eliminating the need for secondary-side switch control signals and signal buses, primary-to-secondary interface circuitry and centralized drive circuitry.

28 Claims, 26 Drawing Sheets

(56) References Cited

U.S. PATENT DOCUMENTS

| | | | | |
|---|---|---|---|---|
| 6,985,341 | B2 | 1/2006 | Vinciarelli et al. | |
| 7,145,786 | B2 | 12/2006 | Vinciarelli | |
| 7,187,263 | B2 | 3/2007 | Vinciarelli | |
| 7,915,991 | B2 | 3/2011 | Waffenschmidt et al. | |
| 8,203,418 | B2 | 6/2012 | Harrison et al. | |
| 8,772,909 | B1 | 7/2014 | Vinciarelli | |
| 9,166,481 | B1 | 10/2015 | Vinciarelli et al. | |
| 9,508,485 | B1 | 11/2016 | Vinciarelli | |
| 9,508,486 | B2 | 11/2016 | Piascik | |
| 9,516,761 | B2 | 12/2016 | Vinciarelli et al. | |
| 9,571,084 | B1 | 2/2017 | Vinciarelli | |
| 10,014,798 | B1 | 7/2018 | Vinciarelli | |
| 10,128,764 | B1 | 11/2018 | Vinciarelli | |
| 10,158,357 | B1 | 12/2018 | Vinciarelli et al. | |
| 10,264,664 | B1 | 4/2019 | Vinciarelli et al. | |
| 10,277,105 | B1 | 4/2019 | Vinciarelli et al. | |
| 10,454,380 | B1 | 10/2019 | Vinciarelli | |
| 10,468,181 | B1 | 11/2019 | Vinciarelli | |
| 10,651,744 | B1 | 5/2020 | Vinciarelli | |
| 10,785,871 | B1 | 9/2020 | Vinciarelli | |
| 10,903,734 | B1 | 1/2021 | Vinciarelli | |
| 10,938,311 | B1 * | 3/2021 | Vinciarelli | H05K 1/0298 |
| 10,998,903 | B1 | 5/2021 | Vinciarelli et al. | |
| 11,018,594 | B1 | 5/2021 | Vinciarelli | |
| 11,101,795 | B1 | 8/2021 | Vinciarelli et al. | |
| 11,264,911 | B1 | 3/2022 | Vinciarelli | |
| 11,271,490 | B1 | 3/2022 | Vinciarelli | |
| 11,682,980 | B1 | 6/2023 | Vinciarelli | |
| 11,870,340 | B1 | 1/2024 | Vinciarelli et al. | |
| 11,876,520 | B1 | 1/2024 | Vinciarelli et al. | |
| 12,283,881 | B1 | 4/2025 | Vinciarelli et al. | |
| 12,289,060 | B1 | 4/2025 | Vinciarelli | |
| 2005/0270745 | A1 | 12/2005 | Chen et al. | |
| 2006/0086981 | A1 | 4/2006 | Yamaguchi et al. | |
| 2013/0187737 | A1 | 7/2013 | Li et al. | |
| 2013/0249659 | A1 | 9/2013 | Tseng et al. | |
| 2014/0266546 | A1 | 9/2014 | Mao | |
| 2016/0086723 | A1 | 3/2016 | Su et al. | |
| 2016/0120034 | A1 * | 4/2016 | Chen | H05K 1/18 361/748 |

OTHER PUBLICATIONS

U.S. Appl. No. 16/878,280, Vinciarelli., filed May 19, 2020.

U.S. Appl. No. 17/881,144, Vinciarelli., filed Aug. 4, 2022.

U.S. Appl. No. 18/201,725, Vinciarelli et al., filed May 24, 2023.

U.S. Appl. No. 18/212,639, Vinciarelli et al., filed Jun. 21, 2023.

Baek et al., "LEGO-PoL: A 93.1% 54V-1.5V 300A Merged-Two-Stage Hybrid Converter with a Linear Extendable Group Operated Point-of-Load (LEGO-PoL) Architecture," IEEE, 2019, 8 pages.

Chen et al., "Power Architecture and Magnetics to Unlock the Potential of WBG Semiconductor Devices," Princeton University Power Electronics Research Group, 2021, 43 pages.

Elasser et al., "Vertical Stacked 48V-1V LEGO-PoL CPU Voltage Regulator with 1 A/mm2 Current Density," Paper No. 1405, Mar. 22, 2022, 20 pages.

Gallagher, "Coupled inductors improve multiphase buck efficiency," Pulse Electronics, 2012, 7 pages.

Herbert, "Design and Application of Matrix Transformers and Symmetrical Converters," Presented at the Fifth International High Frequency Power Conversion Conference, Santa Clara, CA, USA, May 11, 1990, 174 pages.

* cited by examiner

MULTI-PHASE DISTRIBUTED-OUTPUT POWER CONVERTERS

CROSS-REFERENCE TO RELATED APPLICATIONS

This application claims priority to U.S. provisional patent application 63/532,666, filed on Aug. 14, 2023, herein incorporated by reference in its entirety.

FIELD OF THE INVENTION

This invention relates to the field of power conversion, and more specifically to multi-cell and distributed-output power converters.

BACKGROUND

In contemporary electronic systems, space is at a premium on customer circuit boards, e.g. on a circuit board near a processor. Additionally, efficiency and thermal management considerations place limits on the power dissipation of power supplies at, or near, the point of load. As feature sizes decrease and transistor counts increase, so too do the power supply current requirements for very large scale integrated ("VLSI") semiconductor dies such as central processing units ("CPU"), graphics processing units ("GPU"), and application specific integrated circuits ("ASIC"). Current requirements for such devices now commonly exceed 1,000 amps at less than 1V, creating challenges to supply such high currents in the space allocated.

Matrix transformer structures are described in E. Herbert, Design and Application of Matrix Transformers and Symmetrical Converters, Fifth International High Frequency Power Conversion Conference '90, Santa Clara, CA May 11, 1990; Herbert, Flat Matrix Transformer, U.S. Pat. No. 4,665,357 issued May 12, 1987; and Herbert, High Frequency Matrix Transformer, U.S. Pat. No. 4,845,606 issued Jul. 4, 1989.

The following disclosure describes advancements in power converter output and winding structures, and in power converter components, to improve converter performance.

SUMMARY

In a general aspect, an apparatus including a switching power converter is provided. The switching power converter includes: a multi-layer printed circuit board ("PCB") including a plurality of conductive layers and a plurality of insulation layers, each conductive layer being separated from one or more adjacent conductive layers by one or more respective insulation layers, wherein the multi-layer printed circuit board defines a plurality of core leg apertures at a plurality of leg locations; a magnetically permeable core structure including a plurality of core legs that pass through the core leg apertures, the magnetically permeable core structure defining magnetic paths that pass through the conductive layers in at least two of the leg locations; a plurality of primary windings formed in the conductive layers, each primary winding extending between respective leg locations; a plurality of secondary winding elements formed in the conductive layers, each winding element passing between respective leg locations; and a plurality of converter cell elements, each converter cell element including a switch and one of the plurality of secondary winding elements, wherein the secondary winding element of each converter cell element is arranged between respective leg locations and overlaps a portion of a respective primary winding, the secondary winding element having a first end connected to a terminal of the respective switch and a second end connected to an output terminal. The primary windings are configured to be individually driven in a series of converter operating cycles to cause the winding elements to provide power to the output via at least one output terminal.

Implementations can include one or more of the following features. The magnetic paths can form loops, the magnetically permeable core structure can form a plurality of channels each passing through one or more loops formed by the magnetic paths, the converter cell elements can be physically arranged in a step and repeat pattern, in a plurality of groups, the winding element in each group of cell elements can be arranged between the respective leg locations along the respective channel to overlap the respective primary winding.

The switching power converter can further include a plurality of self-contained switching modules, each self-contained switching module can include switching devices that are driven by a logic circuit that receives inputs from terminals of the switching devices within the self-contained switching module, and the logic circuit does not receive any control signal that comes from a source outside of the self-contained switching module.

The plurality of primary windings can include a first primary winding and a second primary winding that are interleaved with each other.

The loops forming each respective channel can be arranged in a straight line from one end of the PCB to an opposite of the PCB in parallel with the other channels in the plurality of channels such that the primary windings are in parallel.

The switching power converter can further include: a plurality of smart dual switching ("SDS") devices, each including SDS circuitry constructed and arranged as a self-contained electronic switching device. The SDS circuitry can include: a first electronic switch having a first control terminal, a first switched terminal, and a first common terminal; a second electronic switch having a second control terminal, a second switched terminal, and a second common terminal; a first SDS control circuit having an input connected to the first switched terminal, an input connected to the second switched terminal, and an output connected to the first control terminal, the first SDS control circuit being constructed and arranged to turn the first electronic switch ON and OFF under first predetermined conditions; and a second SDS control circuit having an input connected to the first switched terminal, an input connected to the second switched terminal, and an output connected to the second control terminal, the second SDS control circuit being constructed and arranged to turn the second electronic switch ON and OFF under second predetermined conditions. The switch of each of the plurality of converter cell elements can include a respective electronic switch in a respective SDS device.

The switching power converter can further include a plurality of smart switching devices constructed and arranged as a self-contained electronic switching device. The smart switching devices can include: a first electronic switch having a first control terminal, a first switched terminal, and a first common terminal; and a first control circuit having an input connected to the first switched terminal, an input for connection to a second switched terminal, and an output connected to the first control terminal, the first control circuit being constructed and arranged to turn the first electronic switch ON and OFF under first predetermined conditions. The switch of each of the plurality of converter cell elements can include a respective electronic switch in a respective smart switching device.

The plurality of primary windings can include n primary windings, each primary winding can include at least two winding segments that extend along a row direction. The magnetically permeable core structure can include core legs arranged in 2×n+1 rows and a plurality of columns, each column having 2×n+1 core legs.

The plurality of primary windings can include 3 primary windings, each primary winding extending along a row direction. The magnetically permeable core structure can include core legs arranged in a plurality of rows and a plurality of columns, each column having 4 core legs.

The apparatus can include: a plurality of primary switches electrically connected to the plurality of primary windings; and a switch controller constructed and arranged to operate the primary switches to drive the primary windings in the series of converter operating cycles.

The switch controller can be configured to operate the primary switches in the series of converter operating cycles at a frequency above 2 MHz.

The plurality of primary windings can include two primary windings, and the switch controller can be configured to operate the primary switches to cause current flowing in each primary winding to be approximately 90 or 270 degrees out of phase with current flowing in the other primary winding.

The plurality of primary windings can include three primary windings, and the switch controller can be configured to operate the primary switches to cause current flowing in each primary winding to be approximately 120 degrees out of phase with current flowing in the other two primary windings.

Each primary winding can be electrically connected to, and extend between, a respective input terminal on one end of the PCB and a common node located at the other end of the PCB.

Each primary winding can be electrically connected to, and extend between, a respective input terminal on one end of the PCB and a respective output terminal located at the other end of the PCB.

The apparatus can include a first package that includes the switching power converter. The magnetically permeable core structure can be formed by a cured magnetically-permeable encapsulation compound that encapsulates the power converter including the printed circuit board and components mounted to the printed circuit board, the cured magnetically-permeable encapsulation compound can extend through the leg apertures in the printed circuit board to form core legs, and the cured magnetically-permeable encapsulation compound can have a relative magnetic permeability of at least 10. In some examples, the printed circuit board lacks conductive traces for transmitting control signals to the switches in the converter cell elements from a source that is external to the first package. The apparatus can further include driver circuitry including the primary switches, and the driver circuitry can be enclosed in a second package that is separate from the first package.

The cured magnetically-permeable encapsulation compound can include cured ferrite mold compound.

The switch controller can be configured to: detect a load current; compare the load current with a threshold current value to generate a comparison result signal; and selectively disable a selected set of primary switches and the respective primary winding based on the comparison result signal indicating that the load current is below the threshold current value.

The plurality of primary windings can include n primary windings, the threshold current value can be approximately equal to a full load current divided by n.

The apparatus can include a first package that includes the switching power converter. The magnetically permeable core structure can be formed by a cured magnetically-permeable encapsulation compound that encapsulates the power converter including the printed circuit board and components mounted to the printed circuit board. The cured magnetically-permeable encapsulation compound can extend through the leg apertures in the printed circuit board to form the core legs. The cured magnetically-permeable encapsulation compound can have a relative magnetic permeability of at least 10. In some examples, the printed circuit board lacks conductive traces for transmitting control signals to the switches in the converter cell elements from a source that is external to the first package. The apparatus can further include driver circuitry including the primary switches, and the driver circuitry can be enclosed in a second package that is separate from the first package.

The switching power converter can include a plurality of magnetically-permeable core pieces disposed on at least one of a top surface or a bottom surface of the printed circuit board. The magnetically-permeable core pieces can be configured to enhance stability of the printed circuit board when the printed circuit board is disposed in a mold cavity during an encapsulation process in which the magnetically-permeable encapsulation compound is injected into the mold cavity to cause the printed circuit board to be encapsulated by the magnetically-permeable encapsulation compound.

The plurality of primary windings can include three primary windings. The switching power converter can include a plurality of smart dual switching ("SDS") devices, each including SDS circuitry constructed and arranged as a self-contained electronic switching device. The switch of each of the plurality of converter cell elements can include a respective electronic switch in a respective SDS device. The magnetically permeable core structure can include core legs arranged in a plurality of rows and columns, each column having 3 or more core legs.

The plurality of primary windings can include three primary windings. The switching power converter can further include a plurality of smart switching (SSW) devices, each including SSW circuitry constructed and arranged as a self-contained electronic switching device. The switch of each of the plurality of converter cell elements can include a respective electronic switch in a respective SSW device. The magnetically permeable core structure can include core legs arranged in at least four rows and a plurality of columns, each column having at least 4 core legs.

The apparatus can further include three input terminals. Each input terminal can be electrically connected to a first end of a respective primary winding.

The apparatus can further include three primary-output terminals. Each primary-output terminal can be electrically connected to a second end of a respective primary winding.

The apparatus can include: a plurality of primary switches electrically connected to the plurality of primary windings; and a switch controller constructed and arranged to operate the primary switches to drive the primary windings. The switch controller can be configured to: detect the load current; compare the load current with the threshold current value to generate a comparison result signal; and selectively disable selected primary switches and the respective primary winding based on the comparison result signal indicating that the load current is below the threshold current value.

The apparatus can include a first package that includes the switching power converter. The magnetically permeable core structure can be formed by a cured magnetically-permeable encapsulation compound that encapsulates the power converter including the PCB and components mounted to the PCB, in which the cured magnetically permeable compound extends through the leg apertures in the PCB to form the core legs, and the cured magnetically-permeable encapsulation compound has a relative magnetic permeability of at least 10. In some examples, the printed circuit board lacks conductive traces for transmitting control signals to the switches in the converter cell elements from a source that is external to the first package. Driver circuitry and primary switches can be enclosed in a second package that is separate from the first package.

The power converter can include a plurality of magnetically-permeable core pieces disposed on at least one of a top surface or a bottom surface of the printed circuit board. The magnetically-permeable core pieces can be configured to enhance stability of the printed circuit board when the printed circuit board is disposed in a mold cavity during an encapsulation process in which the magnetically-permeable encapsulation compound is injected into the mold cavity to cause the printed circuit board to be encapsulated by the magnetically-permeable encapsulation compound.

The apparatus can include: magnetically permeable material extending through the leg apertures in the PCB to form the core legs; a plurality of magnetically-permeable core pieces disposed on a top surface, a bottom surface, or both surfaces, of the PCB, on or adjacent to, at least two core legs; and a molded package enclosing the switching power converter including encapsulation compound covering the PCB of the power converter and components mounted to the PCB of the power converter.

The first package can include: one or more conductive metal layers on at least one exterior surface, the one or more conductive metal layers forming a plurality of electrical contacts on the at least one exterior surface of the first package; one or more trenches formed in the cured encapsulation compound, each trench extending from a respective portion of a respective electrical contact on the at least one exterior surface to a respective conductive feature or component on the printed circuit board; and a conductive layer formed on or in each of the trenches and electrically connecting the respective electrical contact on the exterior surface to the respective conductive feature or component on the PCB.

The molded package can include: one or more conductive metal layers on at least one exterior surface, the one or more conductive metal layers forming a plurality of electrical contacts on the at least one exterior surface of the molded package; one or more trenches formed in the cured encapsulation compound, each trench extending from a respective portion of a respective electrical contact on the at least one exterior surface to a respective conductive feature or component on the printed circuit board; and a conductive layer formed on or in each of the trenches and electrically connecting the respective electrical contact on the exterior surface to the respective conductive feature or component on the PCB.

The molded package can include one or more conductive metal layers on at least one exterior surface, the one or more conductive metal layers forming a plurality of electrical contacts on the at least one exterior surface of the molded package. Each switch can include one or more drain contacts formed on a first surface of the switch and one or more source contacts formed on a second opposite side of the switch, the one or more drain contacts being mounted to a respective surface of the PCB and the one or more source contacts facing away from the respective surface of the PCB. A plurality of trenches can be formed in the cured encapsulation compound, each trench extending from a respective portion of a respective electrical contact on the at least one exterior surface to a respective conductive feature or component on the printed circuit board. A conductive layer can be formed on or in each of the trenches and electrically connecting the respective electrical contact on the exterior surface to the respective conductive feature or component on the PCB. The respective conductive feature or component of at least some of the trenches can include the source terminals of each switch.

The first package can include: one or more conductive metal layers on at least one exterior surface of the first package that form a plurality of electrical contacts on the at least one exterior surface of the first package. The cured magnetically-permeable encapsulation compound can define a plurality of terminal holes that extend from the one or more exterior surfaces to one or more of the conductive layers in the printed circuit board, the terminal holes exposing respective portions of the one or more conductive layers. The first package can include a conductive terminal in each of the terminal holes, and an electrical connection between the conductive terminal and a respective electrical contact on the exterior surface of the first package.

The first package can include: one or more conductive metal layers on at least one exterior surface, the one or more conductive metal layers forming a plurality of electrical contacts on the at least one exterior surface of the first package; one or more trenches formed in the cured encapsulation compound, each trench extending from a respective portion of a respective electrical contact on the at least one exterior surface to a respective conductive feature or component on the printed circuit board; and a conductive layer formed on or in each of the trenches and electrically connecting the respective electrical contact on the exterior surface to the respective conductive feature or component on the PCB.

The plurality of secondary winding elements can include a first set, a second set and a third set of secondary winding elements. A first primary winding can overlap the secondary winding elements in the first set, a second primary winding can overlap the secondary winding elements in the second set, and a third primary winding can overlap the secondary winding elements in the third set.

The switching power converter can be configured to drive the three primary windings in staggered phases including a first phase, a second phase which trails the first phase by 120 degrees, and a third phase which trails the second phase by 120 degrees. During the first phase, a first set of primary switches can be configured to drive the first primary winding and an output current can flow alternately through the first set of secondary winding elements. During the second phase, a second set of primary switches can be configured to drive the second primary winding and an output current can flow alternately through the second set of secondary winding elements. During the third phase, a third set of primary switches can be configured to drive the third primary winding and an output current can flow alternately through the third set of secondary winding elements.

The three primary windings can include a first primary winding, a second primary winding, and a third primary winding, each extending parallel to the row direction. The plurality of secondary windings can include a first secondary winding that overlaps the first primary winding, a second secondary winding that overlaps the second primary winding, and a third secondary winding that overlaps the third primary winding.

The first secondary winding can be connected to the second secondary winding, and the second secondary winding can be connected to the third secondary winding.

The plurality of secondary windings can include two or more sets of secondary windings, each set of secondary windings can include conductive traces that electrically connect the switches in one column to output terminals in an adjacent column.

The plurality of converter cell elements can include pairs of switches, each pair of switches can include a first switch on a top side of the PCB and a second switch on a bottom side of the PCB, the first switch can have a footprint that overlaps the footprint of the second switch.

For each pair of switches, the first switch can include one or more drain contacts formed on a surface of the first switch facing towards the top surface PCB and one or more source contacts formed on a surface of the first switch facing away from the PCB, the second switch can include one or more drain contacts formed on a surface of the second switch facing towards the bottom surface of the PCB and one or more source contacts formed on a surface of the second switch facing away from the PCB. The first package can include: one or more conductive metal layers on a top exterior surface, the one or more conductive metal layers forming a plurality of electrical contacts on the top exterior surface of the first package; first set of one or more trenches formed in the cured encapsulation compound, each trench extending from a respective portion of a respective electrical contact on the top exterior surface to respective one or more source contacts of a corresponding first switch; and a conductive layer formed on or in each of the first set of trenches and electrically connecting the respective electrical contact on the top exterior surface to the respective one or more source contacts of the corresponding first switch. The first package can include: one or more conductive metal layers on a bottom exterior surface, the one or more conductive metal layers forming a plurality of electrical contacts on the bottom exterior surface of the first package; second set of one or more trenches formed in the cured encapsulation compound, each trench extending from a respective portion of a respective electrical contact on the bottom exterior surface to respective one or more source contacts of a corresponding second switch; and a conductive layer formed on or in each of the second set of trenches and electrically connecting the respective electrical contact on the bottom exterior surface to the respective one or more source contacts of the corresponding second switch.

For each pair of switches, the first switch can include a first smart dual switching device, and the second switch can include a second smart dual switching device.

For each of at least some pairs of switches, the first switch and the second switch can be connected in parallel.

For each of at least some pairs of switches, the first switch can be connected to secondary windings formed on a first conductive layer of the PCB, and the second switch can be connected to secondary windings formed on a second conductive layer of the PCB different from the first conductive layer.

The switches can be arranged in rows and columns. Each of at least some of the secondary windings can include conductive traces that electrically connect a switch at one column to two output terminals at an adjacent column, and the two output terminals can be positioned on two sides of another switch at the adjacent column.

The plurality of primary windings can include a first primary winding, a second primary winding, and a third primary winding. Each of the first, second, and third primary windings can extend along a respective row direction. The plurality of secondary windings can include a first set of secondary windings that overlap the first primary winding, a second set of secondary windings that overlap the second primary winding, and a third set of secondary windings that overlap the third primary winding. Each of the first, second, and third set of secondary windings can include at least two secondary windings, each of the at least two secondary windings can include conductive traces that electrically connect a switch at one column to two output terminals at an adjacent column, and the two output terminals can be positioned on two sides of another switch at the adjacent column.

The currents flowing in the primary windings can be summed at the common node to produce substantially zero net primary current at the common node.

The plurality of secondary windings can include a plurality of sets of secondary windings, each set of secondary windings can include a plurality of secondary windings that are disposed along a lengthwise direction of a corresponding primary winding and overlap the primary winding.

The secondary winding elements can have conductive regions with geometry configured to achieve a range of 1.4 to 1.8 squares per secondary winding element.

Each switch can include one or more drain contacts formed on a first surface of the switch and one or more source contacts formed on a second opposite side of the switch, the one or more drain contacts being mounted to a respective surface of the PCB and the one or more source contacts facing away from the respective surface of the PCB.

The plurality of converter cell elements can include a switch on a top side of the PCB and a second switch on a bottom side of the PCB, the first switch can have a footprint that overlaps the footprint of the second switch. For each pair of switches, the first switch can include one or more drain contacts formed on a surface of the first switch facing towards the top surface PCB and one or more source contacts formed on a surface of the first switch facing away from the PCB, the second switch can include one or more drain contacts formed on a surface of the second switch facing towards the bottom surface of the PCB and one or more source contacts formed on a surface of the second switch facing away from the PCB.

The apparatus can further include a semiconductor load including at least one GPU, CPU, or ASIC, the semiconductor load having a load footprint, and a plurality of power input terminals located within the load footprint. The switching power converter can further include a converter footprint. The output terminals of the switching power converter can be arranged within the converter footprint, and the switching power converter can be configured to occupy, in whole or in part, the load footprint.

The apparatus can further include: a first package including the switching power converter and a second package including a second switching power converter, the second switching power converter can also have a multi-layer printed circuit board, a magnetically permeable core structure, a plurality of primary windings, a plurality of secondary winding elements, and a plurality of converter cell elements. Each primary output terminal of the first package can be connected to a respective input terminal of the second package, such that the primary windings of the first package are connected in series with the primary windings of the second package. The output terminals of the first package can be connected in parallel with the output terminals of the second package.

In another general aspect, a method of converting power is provided. The method includes: providing a multi-layer printed circuit board ("PCB") including a plurality of conductive layers and a plurality of insulation layers, each conductive layer being separated from one or more adjacent conductive layers by one or more respective insulation layers, the multi-layer printed circuit board defining a plurality of core leg apertures at a plurality of leg locations; providing a magnetically permeable core structure including a plurality of core legs that pass through the core leg apertures, the magnetically permeable core structure defining magnetic paths that pass through the conductive layers in at least two of the leg locations; providing a plurality of primary windings formed in the conductive layers, each primary winding extending between respective leg locations; providing a plurality of secondary winding elements formed in the conductive layers, each winding element passing between respective leg locations; and providing a plurality of converter cell elements, each converter cell element including a switch, and one of the plurality of secondary winding elements. The winding element of each converter cell element is arranged between respective leg locations and overlaps a portion of a respective primary winding, the secondary winding element having a first end connected to a terminal of the respective switch and a second end connected to an output terminal. The method includes driving the primary windings in a series of converter operating cycles to cause the winding elements to provide power to the output via at least one output terminal.

Implementations can include one or more of the following features. The magnetic paths can form loops, the magnetically permeable core structure can form a plurality of channels each passing through one or more loops formed by the magnetic paths, the converter cell elements can be physically arranged in a step and repeat pattern, in a plurality of groups, the winding elements in each group of cell elements can be arranged between the respective leg locations along the respective channel to overlap the respective primary winding.

The plurality of primary windings can include a first primary winding and a second primary winding that are interleaved with each other.

The loops forming each respective channel can be arranged in a straight line from one end of the PCB to an opposite end of the PCB in parallel with the other channels in the plurality of channels.

The method can include providing a plurality of smart dual switching ("SDS") devices, each including SDS circuitry constructed and arranged as a self-contained electronic switching device. The SDS circuitry can include: a first electronic switch having a first control terminal, a first switched terminal, and a first common terminal; a second electronic switch having a second control terminal, a second switched terminal, and a second common terminal; a first SDS control circuit having an input connected to the first switched terminal, an input connected to the second switched terminal, and an output connected to the first control terminal; and a second SDS control circuit having an input connected to the first switched terminal, an input connected to the second switched terminal, and an output connected to the second control terminal. The switch of each of the plurality of converter cell elements can include a respective electronic switch in a respective SDS device. The method can include using the first SDS control circuit to turn the first electronic switch ON and OFF under first predetermined conditions, and using the second SDS control circuit to turn the second electronic switch ON and OFF under second predetermined conditions.

The method can include providing a plurality of smart switching devices constructed and arranged as a self-contained electronic switching device. The smart switching devices can include: a first electronic switch having a first control terminal, a first switched terminal, and a first common terminal; and a first control circuit having an input connected to the first switched terminal, an input for connection to a second switched terminal, and an output connected to the first control terminal, the first control circuit being constructed and arranged to turn the first electronic switch ON and OFF under first predetermined conditions. The switch of each of the plurality of converter cell elements can include a respective electronic switch in a respective smart switching device.

The plurality of primary windings can include n primary windings, each primary winding can include at least two winding segments that extend along a row direction. The magnetically permeable core structure can include core legs arranged in $2\times n+1$ rows and a plurality of columns, each column having $2\times n+1$ core legs.

Providing the plurality of primary windings can include providing three primary windings, each primary winding extending along a row direction. The magnetically permeable core structure can include core legs arranged in a plurality of rows and a plurality of columns, each column having four core legs.

The method can include providing a plurality of primary switches electrically connected to the plurality of primary windings; and using a switch controller to operate the primary switches to drive the primary windings in the series of converter operating cycles.

The method can include using the switch controller to operate the primary switches in the series of converter operating cycles at a frequency above 2 MHz.

The method can include using the switch controller to operate the primary switches in the series of converter operating cycles at a frequency above 5 MHz.

The plurality of primary windings can include two primary windings, and the method can include using the switch controller to operate the primary switches to cause current flowing in each primary winding to be approximately 90 or 270 degrees out of phase with current flowing in the other primary winding.

The plurality of primary windings can include three primary windings, and the method can include using the switch controller to operate the primary switches to cause current flowing in each primary winding to be approximately 120 degrees out of phase with current flowing in the other two primary windings.

Each primary winding can be electrically connected to, and extend between, a respective input terminal on one end of the PCB and a common node located at the other end of the PCB.

Each primary winding can be electrically connected to, and extend between, a respective input terminal on one end of the PCB and a respective output terminal located at the other end of the PCB.

The method can include providing a first package that includes the multi-layer printed circuit board, the magnetically permeable core structure, the plurality of primary windings, the plurality of secondary winding elements, and the plurality of converter cell elements. The magnetically permeable core structure can be formed by a cured magnetically-permeable encapsulation compound that encapsulates the power converter including the PCB and components mounted to the PCB, the cured magnetically-permeable encapsulation compound can extend through the leg apertures in the PCB to form core legs, and the cured magnetically-permeable encapsulation compound can have a relative magnetic permeability of at least 10. In some examples, the printed circuit board lacks conductive traces for transmitting control signals to the switches in the converter cell elements from a source that is external to the first package. The method can further include using driver circuitry including the primary switches to drive the primary windings in the first package, and the driver circuitry can be enclosed in a second package that is separate from the first package.

The method can include using the switch controller to: detect a load current; compare the load current with a threshold current value to generate a comparison result signal; and selectively disable the selected set of primary switches and the respective primary winding based on the comparison result signal indicating that the load current is below the threshold current value.

The plurality of primary windings can include n primary windings, the threshold current value can be approximately equal to a full load current divided by n.

The method can include providing a first package that includes the switching power converter, wherein the magnetically permeable core structure is formed by a cured magnetically-permeable encapsulation compound that encapsulates the power converter including the PCB and components mounted to the PCB, the cured magnetically-permeable encapsulation compound extends through the leg apertures in the PCB to form the core legs, and the cured magnetically-permeable encapsulation compound has a relative magnetic permeability of at least 10. In some examples, the printed circuit board lacks conductive traces for transmitting control signals to the switches in the converter cell elements from a source that is external to the first package. The method can further include using driver circuitry including the primary switches to drive the primary windings in the first package, and the driver circuitry can be enclosed in a second package that is separate from the first package.

The first package can include a plurality of magnetically-permeable core pieces disposed on at least one of a top surface or a bottom surface of the printed circuit board. The magnetically-permeable core pieces can be configured to enhance stability of the printed circuit board when the printed circuit board is disposed in a mold cavity during an encapsulation process in which the magnetically-permeable encapsulation compound is injected into the mold cavity to cause the printed circuit board to be encapsulated by the magnetically-permeable encapsulation compound.

The plurality of primary windings can include three primary windings. The switching power converter can include a plurality of smart dual switching ("SDS") devices, each including SDS circuitry constructed and arranged as a self-contained electronic switching device. The switch of each of the plurality of converter cell elements can include a respective electronic switch in a respective SDS device. The magnetically permeable core structure can include core legs arranged in at least 3 rows and a plurality of columns, each column having 3 or more core legs.

Providing the plurality of primary windings can include providing three primary windings. The method can include providing a plurality of smart switching (SSW) devices, each including SSW circuitry constructed and arranged as a self-contained electronic switching device. The switch of each of the plurality of converter cell elements can include a respective electronic switch in a respective SSW device. Providing the magnetically permeable core structure can include providing core legs arranged in four rows and a plurality of columns, each column having at least 4 core legs.

The method can further include providing three input terminals, wherein each input terminal can be electrically connected to a first end of a respective primary winding.

The method can further include providing three primary-output terminals, wherein each primary output terminal can be electrically connected to a second end of a respective primary winding.

The method can include: operating a plurality of primary switches to drive the plurality of primary windings; and using a switch controller to operate the primary switches to drive the primary windings, including using the switch controller to: detect the load current; compare the load current with the threshold current value to generate a comparison result signal; and selectively disable primary switches and the respective primary winding based on the comparison result signal indicating that the load current is below the threshold current value.

The method can include providing a first package that includes the switching power converter, wherein the magnetically permeable core structure can be formed by a cured magnetically-permeable encapsulation compound that encapsulates the power converter including the PCB and components mounted to the PCB, the cured magnetically-permeable encapsulation compound can extend through the leg apertures in the PCB to form the core legs, and the cured magnetically-permeable encapsulation compound can have a relative magnetic permeability of at least 10. In some examples, the printed circuit board lacks conductive traces for transmitting control signals to the switches in the converter cell elements from a source that is external to the first package. The method can further include using driver circuitry and the primary switches to drive the primary windings in the first package, and the driver circuitry and the primary switches can be enclosed in a second package that is separate from the first package.

The first package can include a plurality of magnetically-permeable core pieces disposed on at least one of a top surface or a bottom surface of the printed circuit board. The magnetically-permeable core pieces can be configured to enhance stability of the printed circuit board when the printed circuit board is disposed in a mold cavity during an encapsulation process in which the magnetically-permeable encapsulation compound is injected into the mold cavity to cause the printed circuit board to be encapsulated by the magnetically-permeable encapsulation compound.

The method can include: providing magnetically permeable material extending through the leg apertures in the PCB to form the core legs; providing a plurality of magnetically-permeable core pieces disposed on a top surface, a bottom surface, or both surfaces, of the PCB, on or adjacent to, at least two core legs; and providing a molded package enclosing the switching power converter including encapsulation compound covering the PCB of the power converter and components mounted to the PCB of the power converter.

Providing the first package can include: providing one or more conductive metal layers on at least one exterior surface of the first package that form a plurality of electrical contacts on the at least one exterior surface of the first package; forming one or more trenches in the cured encapsulation compound, each trench extending from a respective portion of a respective electrical contact on the at least one exterior surface to a respective conductive feature or component on the printed circuit board; and forming a conductive layer on or in each of the trenches and electrically connecting the respective electrical contact on the exterior surface to the respective conductive feature or component on the PCB.

The first package can include a plurality of magnetically-permeable core pieces disposed on at least one of a top surface or a bottom surface of the printed circuit board. Forming one or more trenches can include applying a laser to remove some of the encapsulation compound from a surface of the PCB in at least one area adjacent to at least one smart dual switching device and on top of the at least one smart dual switching device. The laser can have a wavelength selected such that the laser removes the encapsulant compound at a rate that is at least an order of magnitude greater than a rate at which material is removed from the at least one smart dual switching device. The laser can pass over the at least one smart dual switching device in the process of forming the one or more trenches.

Providing the molded package can include: providing one or more conductive metal layers on at least one exterior surface, the one or more conductive metal layers forming a plurality of electrical contacts on the at least one exterior surface of the molded package; forming one or more trenches in the cured encapsulation compound, each trench extending from a respective portion of a respective electrical contact on the at least one exterior surface to a respective conductive feature or component on the printed circuit board; and forming a conductive layer on or in each of the trenches and electrically connecting the respective electrical contact on the exterior surface to the respective conductive feature or component on the PCB.

Forming one or more trenches can include applying a laser to remove some of the encapsulation compound from a surface of the PCB in at least one area adjacent to at least one smart dual switching device and on top of the at least one smart dual switching device. The laser can have a wavelength selected such that the laser removes the encapsulant compound at a rate that is at least an order of magnitude greater than a rate at which material is removed from the at least one smart dual switching device. The laser can pass over the at least one smart dual switching device in the process of forming the one or more trenches.

The first package can include: one or more conductive metal layers on at least one exterior surface of the first package that form a plurality of electrical contacts on the at least one exterior surface of the first package; one or more trenches formed in the cured encapsulation compound, each trench extending from a respective portion of a respective electrical contact on the at least one exterior surface to a respective conductive feature or component on the printed circuit board; and a conductive layer formed on or in each of the trenches and electrically connecting the respective electrical contact on the exterior surface to the respective conductive feature or component on the PCB.

The plurality of secondary winding elements can include a first set, a second set and a third set of secondary winding elements. A first primary winding can overlap the secondary winding elements in the first set; a second primary winding can overlap the secondary winding elements in the second set; and a third primary winding can overlap the secondary winding elements in the third set.

The method can include: driving the three primary windings in staggered phases including a first phase, a second phase which trails the first phase by 120 degrees, and a third phase which trails the second phase by 120 degrees; during the first phase, using a first set of primary switches to drive the first primary winding and flowing an output current alternately through the first set secondary winding elements; during the second phase, using a second set of primary switches to drive the second primary winding and flowing an output current alternately through the second set of secondary winding elements; and during the third phase, using a third set of primary switches to drive the third primary winding and flowing an output current alternately through the third set of secondary winding elements.

The method can further include: providing a semiconductor load including at least one GPU, CPU, or ASIC, the semiconductor load having a load footprint, and a plurality of power input terminals located within the load footprint. The switching power converter can further include a converter footprint, wherein the output terminals of the switching power converter can be arranged within the converter footprint, and the switching power converter can be configured to occupy, in whole or in part, the load footprint.

The method can further include: providing a first package including the switching power converter and a second package including a second switching power converter, the second switching power converter also having a multi-layer printed circuit board, a magnetically permeable core structure, a plurality of primary windings, a plurality of secondary winding elements, and a plurality of converter cell elements. Each primary output terminal of the first package can be connected to a respective input terminal of the second package, such that the primary windings of the first package are connected in series with the primary windings of the second package. The output terminals of the first package can be connected in parallel with the output terminals of the second package.

In another general aspect, a method of powering a semiconductor load is provided. The method includes: providing a first package including a printed circuit board and an output circuit mounted to the printed circuit board, the output circuit including a plurality of electronic switches and a plurality of magnetically coupled windings, wherein the printed circuit board and the output circuit are encapsulated in a magnetically permeable medium that form a magnetic core structure configured to enable magnetic coupling between the magnetically coupled windings; and operating the electronic switches to drive the magnetically coupled windings in a series of converter operating cycles to generate power that is provided to the semiconductor load, wherein the electronic switches do not receive control signals from a source external to the first package.

Implementations can include one or more of the following features. The printed circuit board can include a plurality of conductive layers and a plurality of insulation layers, each conductive layer being separated from one or more adjacent conductive layers by one or more respective insulation layers. The printed circuit board can define a plurality of core leg apertures at a plurality of leg locations. The magnetically permeable core structure can include a plurality of core legs that pass through the core leg apertures, the magnetically permeable core structure can define magnetic paths that pass through the conductive layers in at least two of the leg locations.

The plurality of magnetically coupled windings can include: a plurality of primary windings formed in the conductive layers, each primary winding extending between respective leg locations; and a plurality of secondary windings formed in the conductive layers, each secondary winding passing between respective leg locations.

The output circuit can include a plurality of converter cell elements, each converter cell element including one of the electronic switches, one of the secondary windings, and an output terminal. The second winding of each converter cell element can be arranged between respective leg locations and overlaps a respective primary winding, the secondary winding can have a first end connected to a terminal of the respective electronic switch and a second end connected to the respective output terminal.

The output circuit can include: a plurality of smart dual switching ("SDS") devices, each SMS device including SDS circuitry constructed and arranged as a self-contained electronic switching device. The SDS circuitry can include: a first electronic switch having a first control terminal, a first switched terminal, and a first common terminal; a second electronic switch having a second control terminal, a second switched terminal, and a second common terminal; a first SDS control circuit having an input connected to the first switched terminal, an input connected to the second switched terminal, and an output connected to the first control terminal; and a second SDS control circuit having an input connected to the first switched terminal, an input connected to the second switched terminal, and an output connected to the second control terminal. The electronic switch of each of the plurality of converter cell elements can include a respective electronic switch in a respective SDS device. The method can include using the first SDS control circuit to turn the first electronic switch ON and OFF under first predetermined conditions, and using the second SDS control circuit to turn the second electronic switch ON and OFF under second predetermined conditions.

In another general aspect, an apparatus includes: a switching power converter including a transformer including a magnetically permeable core structure, the power converter including a multi-layer printed circuit board having a plurality of conductive layers and a plurality of insulation layers, and each conductive layer being separated from one or more adjacent conductive layers by one or more respective insulation layers; the transformer including at least one primary winding and a plurality of secondary windings formed in one or more of the conductive layers in the printed circuit board, the secondary windings being magnetically coupled to the at least one primary winding through the magnetically permeable core structure; a plurality of self-controlled semiconductor switching devices electrically connected to selectively connect a respective secondary winding to an output terminal, each self-controlled semiconductor switching device including internal circuitry configured to control turning ON and OFF of one or more switches within the device based upon signals at terminals of the respective one or more switches; a first package, including the magnetically permeable core structure, encapsulating the printed circuit board and the plurality of self-controlled semiconductor switching devices mounted to the printed circuit board, the first package including a cured magnetically-permeable encapsulation compound having a relative magnetic permeability of at least 10; the PCB being free of control signals; and a driver circuit, external to the first package including one or more power switches and a switch controller configured and arranged to operate the power switches to drive the at least one primary winding in a series of converter operating cycles during which power is converted from an input to the driver via the primary and secondary windings for delivery to the output terminal.

Implementations can include one or more of the following features. The internal circuitry can be configured to control turning ON and OFF of the one or more switches within the device does not receive control signals from a source external to the first package.

In some examples, the printed circuit board lacks conductive traces for transmitting control signals to the one or more switches within the self-controlled semiconductor switching device from a source that is external to the first package. The apparatus can further include driver circuitry including primary switches configured to drive the at least one primary winding, and the driver circuitry can be enclosed in a second package that is separate from the first package.

The apparatus can further include a resonant circuit including the transformer, having a characteristic resonant period and wherein the driver circuit is configured to operate the switches in a series of converter operating cycles that include power transfer intervals having a duration approximately equal to one half of the characteristic resonant period of the resonant circuit separated by energy recycling intervals during which parasitic capacitances in the converter are charged and discharged reducing a voltage across a respective switch prior to turning the respective switch ON.

The apparatus can further include a resonant power train including the transformer.

The magnetic core structure can include a plurality of core legs. The package can include a plurality of magnetically-permeable core pieces disposed on at least one of a top surface or a bottom surface of the printed circuit board. The magnetically-permeable core pieces can be configured to protrude a predetermined distance from the at least one surface of the PCB and can be located to increase the relative permeability of a magnetic path between adjacent core legs.

The first package can include one or more conductive metal layers on at least one exterior surface, the one or more conductive metal layers forming a plurality of electrical contacts on the at least one exterior surface of the first package. The cured compound can define a plurality of terminal holes that extend from the at least one exterior surface to plurality of the conductive layers in the printed circuit board, the terminal holes exposing respective portions of the conductive layers. The first package can include a conductive terminal in each of the terminal holes, and an electrical connection between the conductive terminal and a respective electrical contact on the exterior surface of the package.

The first package can include a first cured magnetically-permeable layer and a second cured magnetically-permeable layer, and the printed circuit board can be positioned between the first cured magnetically-permeable layer and the second cured magnetically-permeable layer.

The first package can include one or more conductive metal layers on at least one exterior surface, the one or more conductive metal layers can form a plurality of electrical contacts on the at least one exterior surface of the first package. The cured encapsulation compound can define a plurality of terminal holes that extend from the at least one exterior surface to the conductive layers in the printed circuit board, and the terminal holes can expose respective portions of the conductive layers. The first package can include a conductive terminal in each of the terminal holes, and an electrical connection between the conductive terminal and a respective electrical contact on the exterior surface of the first package.

In another general aspect, a method includes: assembling a printed circuit board panel including a multi-layer printed circuit board and a plurality of electronic components mounted to the printed circuit board. The printed circuit board panel includes a plurality of electronic modules, each electronic module including a section of the printed circuit board and some of the electronic components. The method includes: enclosing the printed circuit board panel, including the printed circuit board and the electronic components in a mold cavity of a mold; filling the mold cavity with a magnetically-permeable encapsulation compound having a relative magnetic permeability of at least 10; curing the magnetically-permeable encapsulation compound to form an encapsulated printed circuit board panel that includes cured magnetically-permeable encapsulation compound on a first side of the printed circuit board panel and a second side of the printed circuit board panel; and removing the encapsulated printed circuit board panel from the mold.

Implementations can include one or more of the following features. The method can include after removing the encapsulated printed circuit board panel from the mold, cutting the encapsulated printed circuit board panel along cut lines to singulate each of the plurality of switching power converter modules from the encapsulated printed circuit board panel.

The method can include after removing the encapsulated printed circuit board panel from the mold, lapping the encapsulated printed circuit board panel to reduce a thickness of the encapsulated printed circuit board panel to a predefined thickness.

The method can include prior to enclosing the printed circuit board panel in the mold cavity, mounting a plurality of magnetically-permeable core pieces on at least one of a top surface or a bottom surface of the printed circuit board.

The cured magnetically-permeable encapsulation compound can include a plurality of core legs. The method can include using the magnetically-permeable core pieces protruding a predetermined distance from the at least one surface of the PCB to increase the relative permeability of a magnetic path between adjacent core legs.

The mold can include an upper mold and a lower mold, and the magnetically-permeable core pieces can rest against at least one of an inner surface of the upper mold or an inner surface of the lower mold.

The method can include forming electrical terminations at predetermined locations on one or more surfaces of the cured magnetically-permeable encapsulation compound. The electrical terminations can include power input terminations and power output terminations. The electrical terminations can be electrically connected to some of the electronic components of the switching power converter module through trench terminals.

The method can include after lapping the encapsulated printed circuit board panel, forming electrical terminations at predetermined locations on one or more surfaces of the cured magnetically-permeable encapsulation compound. The electrical terminations can include power input terminations and power output terminations. The electrical terminations can be electrically connected to some of the electronic components of the switching power converter module through trench terminals.

The method can include after forming electrical terminations, cutting the encapsulated printed circuit board panel along cut lines to singulate each of the plurality of switching power converter modules from the encapsulated printed circuit board panel.

The electronic components can include self-controlled switch modules, each self-controlled switch module can include two electronic switches and logic circuit, the electronic switches can include terminals, the logic circuit can be configured to control ON and OFF of the electronic switches, and the logic circuit can be configured such that operations of the logic circuit are controlled by signals at the terminals of the electronic switches.

The electronic components can include secondary switches that drive respective secondary windings. In some examples, the printed circuit board lacks conductive traces for transmitting control signals to the secondary switches in a switching power converter module from a source that is external to the switching power converter module.

The printed circuit board can have a plurality of conductive layers, a plurality of primary windings and a plurality of secondary windings can be formed in one or more of the conductive layers, and the printed circuit board can define a plurality of core leg apertures at a plurality of leg locations. The electronic modules can include electronic switching power converter modules, each switching power converter module can include a section of the printed circuit board, at least one of the primary windings, two or more of the secondary windings, and two or more of the electronic components. Enclosing the printed circuit board panel can include enclosing the printed circuit board panel, including the printed circuit board, the primary windings, the secondary windings, and the electronic components in the mold cavity of the mold. Filling the mold cavity with the magnetically-permeable encapsulation compound can include filling the core leg apertures with the magnetically-permeable encapsulation compound. Curing the magnetically-permeable encapsulation compound can include forming an encapsulated printed circuit board panel that includes cured magnetically-permeable encapsulation compound on the first side of the printed circuit board panel and the second side of the printed circuit board panel, the cured magnetically-permeable encapsulation compound in the core leg apertures forming core legs, the cured magnetically-permeable encapsulation compound forming a magnetically-permeable core structure that enables the secondary windings to be magnetically coupled to the at least one primary winding during operation of the switching power converter module.

In another general aspect, an apparatus includes a switching power converter. The switching power converter includes a multi-layer printed circuit board ("PCB") including a plurality of conductive layers and a plurality of insulation layers, each conductive layer being separated from one or more adjacent conductive layers by one or more respective insulation layers; a magnetically permeable core structure including a number, Nt, of magnetic paths, each passing through the conductive layers in at least two leg locations, the core structure being constructed and arranged to form a plurality of channels each passing through a respective number, Np, of the magnetic paths. The switching power converter includes a plurality of main windings formed in the conductive layers, each main winding being constructed and arranged to extend through the respective number, Np, of the magnetic paths between the respective leg locations along a respective channel, each main winding having a first termination at a first end and a second termination at a second end of the main winding. The switching power converter includes a plurality of winding elements, each passing through a respective number, Ns, of the magnetic paths between the respective leg locations, the winding elements being formed in the conductive layers. The switching power converter includes a plurality of converter cell elements, each including a switch and a respective winding element, the converter cell elements being physically arranged in a step and repeat pattern, in a plurality of groups, the winding elements in each group of cell elements being arranged between the respective leg locations along a respective channel to overlap a respective main winding.

The respective winding element associated with each cell element has a first end connected to a terminal of the switch in the cell element and a second end connected to an output terminal.

Implementations can include one or more of the following features. Each winding element can include a length measured between a first termination and a second termination, the first termination can be connected to the switch of the corresponding cell element, the switch can be on one side of the respective subset of the magnetic paths, the second termination can be connected to an output terminal located on an opposite side of the respective subset of the magnetic paths, and the length between the first and second terminations associated with cell elements not located at an end of the converter can encircle less than half of the respective core leg in the second conductive layer.

Each winding element can include a length, Ls, measured between a first termination and a second termination, the first termination can be connected to the switch of the corresponding converter cell element, the switch can be on a first side of the respective number Ns of magnetic paths, the second termination can be connected to an output terminal located on an opposite side of the respective magnetic paths. The length, Ls, divided by the average width, Ws, of the winding element between the first and second terminations, and further divided by Ns, can be less than a number of squares, S, per turn, wherein the number S is less than 6.

The switching power converter can further include: one or more smart dual switching ("SDS") devices, each including SDS circuitry in an SDS package constructed and arranged as a self-contained electronic switching device, the SDS package having a common terminal, a first switched terminal, and a second switched terminal. The SDS circuitry can include: a first electronic switch having a first control terminal, a first switched terminal, and a first common terminal; a second electronic switch having a second control terminal, a second switched terminal, and a second common terminal. The SDS circuitry can include a first SDS control circuit having an input connected to the first switched terminal, an input connected to the second switched terminal, and an output connected to the first control terminal. The first SDS control circuit is constructed and arranged to turn the first electronic switch: (i) OFF while the second electronic switch is ON; and (ii) ON for as long as the second electronic switch is OFF and a voltage across the first switched terminal and the common terminal satisfies predetermined magnitude and polarity thresholds. The SDS circuitry can include a second SDS control circuit having an input connected to the first switched terminal, an input connected to the second switched terminal, and an output connected to the second control terminal. The second SDS control circuit is constructed and arranged to turn the second switch: (i) OFF while the first switch is ON, and (ii) ON for as long as the first switch is OFF and a voltage across the second switched terminal and the common terminal satisfies predetermined magnitude and polarity thresholds. The switch of each of the plurality of cell elements can include a respective electronic switch in a respective SDS device.

The switching power converter can further include: one or more smart dual switching ("SDS") devices, each including SDS circuitry in an SDS package constructed and arranged as a self-contained electronic switching device, the SDS package having a common terminal, a first switched terminal, and a second switched terminal. The SDS circuitry can include: a first electronic switch having a first control terminal, a first switched terminal, and a first common terminal; a second electronic switch having a second control terminal, a second switched terminal, and a second common terminal. The SDS circuitry can include a first SDS control circuit having an input connected to the first switched terminal, an input connected to the second switched terminal, and an output connected to the first control terminal. The first SDS control circuit can be adapted to turn the first electronic switch OFF in any of three conditions: (i) while the second electronic switch is ON; or (ii) if the polarity of the voltage across the first electronic switch is of a first pre-determined polarity, when the magnitude of the voltage across the first electronic switch is at a first pre-determined threshold; or (iii) if the polarity of the voltage across the first electronic switch is of the opposite polarity, after the first switch has been ON for a first pre-determined period of time. The SDS circuitry can include a second SDS control circuit having an input connected to the first switched terminal, an input connected to the second switched terminal, and an output connected to the second control terminal. The second SDS control circuit can be adapted to turn the second electronic switch OFF in any of three conditions: (i) while the first electronic switch is ON; or (ii) if the polarity of the voltage across the second electronic switch is of a first pre-determined polarity, when the magnitude of the voltage across the second electronic switch is at a second pre-determined threshold; or (iii) if the polarity of the voltage across the second electronic switch is of the opposite polarity, after the second switch has been ON for a second pre-determined period of time. The switch of each of the plurality of cell elements can include a respective electronic switch in a respective SDS device.

The magnetically permeable core structure can be formed by a cured magnetically permeable compound that encapsulates the power converter including the PCB and components mounted to the PCB, the cured magnetically permeable compound extending through holes in the PCB to form the legs. In some examples, the PCB lacks conductive traces for transmitting control signals to the switches.

The magnetically permeable core can further include a first, a second, a third, and a fourth channel formed between sets of at least five core legs. A first main winding forms a loop extending through the first and the third channels. A second main winding forms a loop extending through the second and the fourth channels.

The magnetically permeable core can further include a first, a second, a third, a fourth, a fifth, and a sixth channel formed between sets of at least seven core legs. A first main winding can form a loop extending through the first and the fourth channels; a second main winding can form a loop extending through the second and the fifth channel; and a third main winding can form a loop extending through the third and the sixth channels.

The apparatus can further include: a plurality of switch pairs, each pair connected to drive a respective one of the main windings; and a switch controller configured and arranged to drive the switch pairs and respective main windings.

The switch controller can sense operating conditions in the converter.

The switch pairs can include VFETs.

The VFETs can be integrated with the controller onto a single semiconductor die.

In another general aspect, an apparatus includes a switching power converter. The switching power converter includes: a multi-layer printed circuit board ("PCB"), a magnetically permeable core structure, at least one main winding formed in one or more of the conductive layers, a plurality of winding elements formed in the conductive layers, and a plurality of converter cell elements, The multi-layer PCB includes a plurality of conductive layers and a plurality of insulation layers, each conductive layer being separated from one or more adjacent conductive layers by one or more respective insulation layers. The multi-layer printed circuit board defines a plurality of core leg apertures, the magnetically permeable core structure includes magnetically-permeable encapsulation compound that encapsulates at least a portion of the multi-layer printed circuit board and fills in the core leg apertures. The magnetically permeable core structure includes magnetic paths that pass through the conductive layers in at least two leg locations. Each of the plurality of converter cell elements includes a switch and a respective winding element, the converter cell elements is physically arranged in a step and repeat pattern, in a plurality of groups, and the winding elements in each group of cell elements is arranged to overlap a respective main winding. The respective winding element associated with each cell element has a first end connected to a terminal of the switch in the cell element and a second end connected to an output terminal.

Implementations can include one or more of the following features. The plurality of core leg apertures can include five rows of core leg apertures. The at least one main winding can include at least a first main winding and a second main winding, the first main winding can have a first segment that passes through a first region between the first and second rows of core leg apertures, and the first main winding can have a second segment that passes through a third region between the third and fourth rows of the core leg apertures.

The second main winding can have a first segment that passes through a second region between the second and third rows of core leg apertures, the second main winding can have a second segment that passes through a fourth region between the fourth and fifth rows of the core leg apertures.

The plurality of windings can include a first set of secondary windings, a second set of secondary windings, a third set of secondary windings, and a fourth set of secondary windings. The first main winding can overlap at least a portion of each of the first and second sets of secondary windings. The second main winding can overlap at least a portion of each of the third and fourth sets of secondary windings.

The switching power converter can be configured to operate in a first phase and a second phase. During the first phase, a first set of primary switches can be configured to drive the first main winding and cause output current to flow from the first and second sets of secondary windings. During the second phase, a second set of primary switches can be configured to drive the second main winding and cause output current to flow from the third and fourth sets of secondary windings.

The plurality of core leg apertures can include seven rows of core leg apertures. The at least one main winding can include at least a first main winding, a second main winding, and a third main winding. The first main winding can have a first segment that passes through a first region between the first and second rows of core leg apertures, the first main winding can have a second segment that passes through a fourth region between the fourth and fifth rows of the core leg apertures. The second main winding can have a first segment that passes through a second region between the second and third rows of core leg apertures, the second main winding can have a second segment that passes through a fifth region between the fifth and sixth rows of the core leg apertures. The third main winding can have a first segment that passes through a third first region between the third and fourth rows of core leg apertures, the third main winding can have a second segment that passes through a sixth region between the sixth and seventh rows of the core leg apertures.

The plurality of windings can include a first set of secondary windings, a second set of secondary windings, a third set of secondary windings, a fourth set of secondary windings, a fifth set of secondary windings, and a sixth set of secondary windings. The first main winding can overlap at least a portion of each of the first and second sets of secondary windings. The second main winding can overlap at least a portion of each of the third and fourth sets of secondary windings. The third main winding can overlap at least a portion of each of the fifth and sixth sets of secondary windings.

The switching power converter can be configured to operate in a first phase, a second phase, and a third phase. During the first phase, a first set of primary switches can be configured to drive the first main winding and cause output current to flow from the first and second sets of secondary windings. During the second phase, a second set of primary switches can be configured to drive the second main winding and cause output current to flow from the second and third sets of secondary windings. During the third phase, a third set of primary switches can be configured to drive the third main winding and cause output current to flow from the fifth and sixth sets of secondary windings.

In another general aspect, an apparatus includes a switching power converter. The switching power converter includes a multi-layer printed circuit board ("PCB") including a plurality of conductive layers and a plurality of insulation layers, each conductive layer being separated from one or more adjacent conductive layers by one or more respective insulation layers. At least one main winding and at least one winding element are formed in the conductive layers. The multi-layer printed circuit board defines a plurality of core leg apertures. The switching power converter includes a magnetically permeable core structure including magnetically-permeable encapsulation compound that encapsulates at least a portion of the multi-layer printed circuit board and fills in the core leg apertures. The magnetically permeable core structure includes magnetic paths that pass through the conductive layers in at least two leg locations. The switching power converter includes at least one converter cell element, each including a switch and a respective winding element, the winding elements in each cell element being arranged to overlap a corresponding main winding. The respective winding element associated with each cell element has a first end connected to a terminal of the switch in the cell element and a second end connected to an output terminal.

In another general aspect, an apparatus includes: an N-phase switching power converter including a multi-layer printed circuit board ("PCB") including a plurality of conductive layers and a plurality of insulation layers, each conductive layer being separated from one or more adjacent conductive layers by one or more respective insulation layers, wherein $N\geq 2$. At least one main winding and at least one set of secondary winding elements are formed in the conductive layers. The N-phase switching power converter includes a plurality of converter cell elements, each including a switch and a respective secondary winding element, the secondary winding element in each cell element being arranged to overlap a corresponding main winding. The respective secondary winding element associated with each cell element has a first end connected to a terminal of the switch in the cell element and a second end connected to an output terminal.

Implementations can include one or more of the following features. The multi-layer printed circuit board can define a plurality of core leg apertures. The apparatus can include a magnetically permeable core structure including magnetically-permeable encapsulation compound that encapsulates at least a portion of the multi-layer printed circuit board and defines magnetic paths each passing through the conductive layers in at least two leg locations.

In another general aspect, an apparatus includes: an N-phase switching power converter including a multi-layer printed circuit board ("PCB") including a plurality of conductive layers and a plurality of insulation layers, each conductive layer being separated from one or more adjacent conductive layers by one or more respective insulation layers, wherein $N \geq 2$. At least two main windings and at least four sets of secondary winding elements are formed in the conductive layers. The switching power converter has a specific output resistance not more than 50 $mOhm \times mm^2$.

Implementations can include one or more of the following features. The switching power converter can have a specific output resistance not more than 30 $mOhm \times mm^2$.

The switching power converter can have a specific output resistance not more than 20 $mOhm \times mm^2$.

In another general aspect, a method includes: forming a multi-layer printed circuit board ("PCB") including a plurality of conductive layers and a plurality of insulation layers, each conductive layer being separated from one or more adjacent conductive layers by one or more respective insulation layers, wherein the multi-layer printed circuit board defines a plurality of core leg apertures. The method includes forming at least one main winding in the conductive layers, each main winding having a first termination at a first end and a second termination at a second end of the main winding; and forming a plurality of winding elements in the conductive layers. The method includes mounting switches on the multi-layer printed circuit board; and encapsulating, using a magnetically-permeable encapsulation compound, at least a portion of the multi-layer printed circuit board, and forming a magnetically permeable core structure including magnetic paths, each passing through the conductive layers in at least two leg locations. The method includes forming a plurality of converter cell elements, each including a switch and a respective winding element, the converter cell elements being physically arranged in a step and repeat pattern, in a plurality of groups, the winding elements in each group of cell elements being arranged to overlap a respective main winding, wherein the respective winding element associated with each cell element has a first end connected to a terminal of the switch in the cell element and a second end connected to an output terminal.

Implementations can include one or more of the following features. Mounting the switches on the multi-layer printed circuit board can include mounting the switches on a first surface of the multi-layer printed circuit board. Encapsulating at least a portion of the multi-layer printed circuit board can include encapsulating the entire first surface that is not already covered by components mounted on the multi-layer printed circuit board.

Forming the multi-layer printed circuit board can include forming a multi-layer printed circuit board that defines at least five rows of core leg apertures. Forming at least one main winding can include forming at least a first main winding and a second main winding in the conductive layers. The first main winding can have a first segment that passes through a first region between the first and second rows of core leg apertures, and the first main winding can have a second segment that passes through a third region between the third and fourth rows of the core leg apertures.

Forming the multi-layer printed circuit board can include forming a multi-layer printed circuit board that defines at least seven rows of core leg apertures. Forming at least one main winding can include forming at least a first main winding, a second main winding, and a third main winding in the conductive layers. The first main winding can have a first segment that passes through a first region between the first and second rows of core leg apertures, and the first main winding can have a second segment that passes through a fourth region between the fourth and fifth rows of the core leg apertures.

In another general aspect, an apparatus includes a multi-layer printed circuit board ("PCB") including a plurality of conductive layers and a plurality of insulation layers, each conductive layer being separated from one or more adjacent conductive layers by one or more respective insulation layers, in which the printed circuit board has a top surface and a bottom surface. The multi-layer printed circuit board defines a plurality of core leg apertures. The apparatus includes at least one main winding formed in one or more of the conductive layers; a plurality of winding elements formed in the conductive layers, in which portions of the winding elements are arranged to overlap respective portions of the at least one main winding. The apparatus includes at least one magnetically-permeable standoff disposed on at least one of the top surface or the bottom surface of the printed circuit board; a magnetically-permeable core structure including a cured magnetically-permeable encapsulation compound that encapsulates at least a portion of the multi-layer printed circuit board and fills in core leg apertures. The magnetically-permeable core structure can include magnetic paths that pass through the conductive layers in at least two leg locations. The at least one magnetically-permeable standoff can be configured to enhance stability of the printed circuit board when the printed circuit board is disposed in a mold cavity during an encapsulation process in which a magnetically-permeable encapsulation compound is injected into the mold cavity to cause the printed circuit board to be encapsulated by the magnetically-permeable encapsulation compound.

Implementations can include one or more of the following features. The at least one magnetically-permeable standoff can include at least one ferrite standoff.

The at least one magnetically-permeable standoff can include a first magnetically-permeable standoff disposed on the top surface of the printed circuit board, and a second magnetically-permeable standoff disposed on the bottom surface of the printed circuit board.

The first magnetically-permeable standoff can have an elongated shape that extends along a first direction, the second magnetically-permeable standoff can have an elongated shape that extends along a second direction, the first direction can be at an angle $\theta$ relative to the second direction, and $-10° < \theta < 10°$.

The first magnetically-permeable standoff can have an elongated shape that extends along a first direction, the second magnetically-permeable standoff can have an elongated shape that extends along a second direction, the first direction can be at an angle $\theta$ relative to the second direction, and $60° < \theta < 120°$.

The at least one magnetically-permeable standoff can be disposed on the top surface of the printed circuit board, and the at least one magnetically-permeable standoff can have a top surface that is not covered by the cured magnetically-permeable encapsulation compound.

The apparatus can include at least one switch disposed on the top surface of the printed circuit board, and at least one winding element can have a first end connected to a terminal of the switch. The at least one magnetically-permeable standoff can include a first magnetically-permeable standoff disposed on the top surface of the printed circuit board, and the first magnetically-permeable standoff can have a height that is greater than the height of the at least one switch.

The cured magnetically-permeable encapsulation compound can include cured ferrite mold compound.

The apparatus can include a switching power converter that includes the multi-layer printed circuit board, the at least one magnetically-permeable core pieces, and the magnetically-permeable core structure. The switching power converter can include a plurality of converter cell elements, each including a switch and a respective winding element. The converter cell elements can be physically arranged in a step and repeat pattern, in a plurality of groups, and the winding elements in each group of cell elements can be arranged to overlap a respective main winding. The respective winding element associated with each cell element can have a first end connected to a terminal of the switch in the cell element and a second end connected to an output terminal.

In some examples, no capacitor is mounted on the printed circuit board.

In some examples, no switch is mounted on the printed circuit board.

Each of the at least one magnetically-permeable core piece can have dimensions configured to provide stability during the encapsulation process, and also allow the magnetically-permeable encapsulation compound to flow around the magnetically-permeable core piece and form core legs of the magnetic structure.

The at least one magnetically-permeable core piece can have an elongated shape and can be positioned relative to the printed circuit board at a particular orientation to cause the magnetically-permeable core structure to have a specified overall magnetic permeability.

In another general aspect, an apparatus includes: a multi-layer printed circuit board ("PCB") including a plurality of conductive layers and a plurality of insulation layers, each conductive layer being separated from one or more adjacent conductive layers by one or more respective insulation layers, in which the printed circuit board has a top surface and a bottom surface. The multi-layer printed circuit board defines a plurality of core leg apertures. The apparatus includes at least one main winding formed in one or more of the conductive layers; and a plurality of winding elements formed in the conductive layers, in which portions of the winding elements are arranged to overlap respective portions of the at least one main winding. The apparatus includes at least one electronic component disposed on at least one of the top surface or the bottom surface of the printed circuit board; and a magnetically-permeable core structure including a cured magnetically-permeable encapsulation compound that encapsulates at least a portion of the multi-layer printed circuit board and fills in core leg apertures. The magnetically-permeable core structure includes magnetic paths that pass through the conductive layers in at least two leg locations. The at least one electronic component is configured to enhance stability of the printed circuit board when the printed circuit board is disposed in a mold cavity during an encapsulation process in which a magnetically-permeable encapsulation compound is injected into the mold cavity to cause the printed circuit board to be encapsulated by the magnetically-permeable encapsulation compound.

Implementations can include one or more of the following features. The at least one electronic component can include at least one of a switch or a capacitor.

The at least one electronic component can include at least a first component mounted on a top surface of the printed circuit board and a second component mounted on a bottom surface of the printed circuit board. The first component can have a footprint on the printed circuit board that overlaps a footprint of the second component on the printed circuit board.

In another general aspect, a method includes: providing a multi-layer printed circuit board ("PCB") including a plurality of conductive layers and a plurality of insulation layers, each conductive layer being separated from one or more adjacent conductive layers by one or more respective insulation layers, in which the printed circuit board has a top surface and a bottom surface. The multi-layer printed circuit board defines a plurality of core leg apertures. At least one main winding is formed in one or more of the conductive layers. A plurality of winding elements are formed in the conductive layers, in which portions of the winding elements are arranged to overlap respective portions of the at least one main winding. The method includes providing at least one magnetically-permeable core piece disposed on at least one of the top surface or the bottom surface of the printed circuit board; and enclosing the printed circuit board and the at least one magnetically permeable core piece in a mold cavity. The method includes filling the mold cavity with a magnetically-permeable mold compound, encapsulating at least a portion of the multi-layer printed circuit board and filling in the core leg apertures to form a magnetically-permeable core structure. The method includes using the at least one magnetically permeable core piece to enhance stability of the printed circuit board disposed in the mold cavity when filling the mold cavity with the magnetically-permeable mold compound. The at least one magnetically permeable core piece is configured to reduce bending of the printed circuit board when filling the mold cavity with the magnetically-permeable mold compound, as compared to not using the at least one magnetically permeable core piece. The method includes curing the magnetically-permeable encapsulation compound.

Implementations can include one or more of the following features. The at least one magnetically permeable core piece can have an elongated shape and can be positioned on the printed circuit board at a particular orientation to cause the magnetically-permeable core structure to have a specified overall magnetic permeability.

The at least one magnetically-permeable core piece can include a first magnetically-permeable core piece having a first height that spans a first distance between the top surface of the printed circuit board and an inner upper wall of the cavity of the mold.

The at least one magnetically-permeable standoff can include a second magnetically-permeable standoff having a second height that spans a second distance between the bottom surface of the printed circuit board and an inner lower wall of the cavity of the mold.

In another general aspect, a method includes: providing a multi-layer printed circuit board ("PCB") including a plurality of conductive layers and a plurality of insulation layers, each conductive layer being separated from one or more adjacent conductive layers by one or more respective insulation layers, in which the printed circuit board has a top surface and a bottom surface. The multi-layer printed circuit board defines a plurality of core leg apertures. At least one main winding is formed in one or more of the conductive layers. A plurality of winding elements are formed in the conductive layers, in which portions of the winding elements are arranged to overlap respective portions of the at least one main winding. At least one electronic component is disposed on at least one of the top surface or the bottom surface of the printed circuit board. The method includes enclosing the printed circuit board and the at least one electronic component in a mold cavity; and filling the mold cavity with a magnetically-permeable mold compound, encapsulating at least a portion of the multi-layer printed circuit board and at least a portion of the at least one electronic component, and filling in the core leg apertures to form a magnetically-permeable core structure. The method includes using the at least one electronic component to provide stability to the printed circuit board disposed in the mold cavity when filling the mold cavity with the magnetically-permeable mold compound, wherein the at least one electronic component is configured to reduce bending of the printed circuit board when filling the mold cavity with the magnetically-permeable mold compound, as compared to not using the at least one electronic component; and curing the magnetically-permeable encapsulation compound.

Implementations can include one or more of the following features. The at least one electronic component can include at least one of a switch or a capacitor.

The at least one electronic component can include a first electronic component having a first height that spans a first distance between the top surface of the printed circuit board and an inner upper wall of the cavity of the mold.

The at least one electronic component can include a second electronic component having a second height that spans a second distance between the bottom surface of the printed circuit board and an inner lower wall of the cavity of the mold.

In another general aspect, a method of making a plurality of electronic devices is provided. The method includes: providing a printed circuit board (PCB) panel including a multi-layer printed circuit board ("PCB") including a plurality of conductive layers and a plurality of insulation layers, each conductive layer being separated from one or more adjacent conductive layers by one or more respective insulation layers. The printed circuit board has a top surface and a bottom surface. The multi-layer printed circuit board panel includes a plurality of printed circuit board modules, and each printed circuit board module defines a plurality of core leg apertures. Each printed circuit board module includes at least one main winding formed in one or more of the conductive layers. Each printed circuit board module includes a plurality of winding elements formed in the conductive layers, in which portions of the winding elements are arranged to overlap respective portions of the at least one main winding. The method includes providing at least one magnetically-permeable standoff disposed on at least one of the top surface or the bottom surface of the printed circuit board panel; and enclosing the printed circuit board panel and the at least one magnetically permeable standoff in a mold cavity. The method includes filling the mold cavity with a magnetically-permeable mold compound, encapsulating at least a portion of the multi-layer printed circuit board panel and filling in the core leg apertures to form a magnetically-permeable core structure for each of the printed circuit board modules. The method includes using the at least one magnetically permeable standoff to provide stability to the printed circuit board panel disposed in the mold cavity when filling the mold cavity with the magnetically-permeable mold compound. The at least one magnetically permeable standoff is configured to reduce bending of the printed circuit board panel when filling the mold cavity with the magnetically-permeable mold compound, as compared to not using the at least one magnetically permeable standoff. The method includes curing the magnetically-permeable encapsulation compound to form an encapsulated printed circuit board panel; and cutting the encapsulated printed circuit board panel to produce a plurality of encapsulated printed circuit board modules.

Implementations can include one or more of the following features. Each module can include: a smaller multi-layer printed circuit board ("PCB") including a plurality of conductive layers and a plurality of insulation layers, each conductive layer being separated from one or more adjacent conductive layers by one or more respective insulation layers, in which the smaller multi-layer printed circuit board has a top surface and a bottom surface. The smaller multi-layer printed circuit board can define a plurality of core leg apertures. Each module can include at least one main winding formed in one or more of the conductive layers; and a plurality of winding elements formed in the conductive layers. Portions of the winding elements can be arranged to overlap respective portions of the at least one main winding. Each module can include a magnetically-permeable core structure including a cured magnetically-permeable encapsulation compound that encapsulates at least a portion of the smaller multi-layer printed circuit board and fills in core leg apertures. The magnetically-permeable core structure can include magnetic paths that pass through the conductive layers in at least two leg locations.

Providing at least one magnetically-permeable standoff can include providing at least one magnetically-permeable standoff disposed on each of the plurality of printed circuit board regions.

Providing at least one magnetically-permeable standoff can include providing N1 magnetically-permeable standoffs, N1 is a positive integer. The plurality of printed circuit board regions can include N2 printed circuit board regions, N2 is a positive integer, and N1<N2.

In another general aspect, a method of making a plurality of electronic devices is provided. The method includes: providing a printed circuit board (PCB) panel including a multi-layer printed circuit board ("PCB") including a plurality of conductive layers and a plurality of insulation layers, each conductive layer being separated from one or more adjacent conductive layers by one or more respective insulation layers. The printed circuit board has a top surface and a bottom surface. The multi-layer printed circuit board panel includes a plurality of printed circuit board modules, and each printed circuit board module defines a plurality of core leg apertures. Each printed circuit board module includes at least one main winding formed in one or more of the conductive layers. Each printed circuit board module includes a plurality of winding elements formed in the conductive layers. Portions of the winding elements are arranged to overlap respective portions of the at least one main winding. The method includes, for each printed circuit board module, providing at least one electronic component disposed on at least one of the top surface or the bottom surface of the printed circuit board module; and enclosing the printed circuit board panel and the electronic components in a mold cavity. The method includes filling the mold cavity with a magnetically-permeable mold compound, encapsulating at least a portion of the multi-layer printed circuit board panel and filling in the core leg apertures to form a magnetically-permeable core structure for each of the printed circuit board modules. The method includes using the electronic components to provide stability to the printed circuit board panel disposed in the mold cavity when filling the mold cavity with the magnetically-permeable mold compound. The electronic components are configured to reduce bending of the printed circuit board panel when filling the mold cavity with the magnetically-permeable mold compound, as compared to not using the electronic components. The method includes curing the magnetically-permeable encapsulation compound to form an encapsulated printed circuit board panel; and cutting the encapsulated printed circuit board panel to produce a plurality of the printed circuit board modules.

Implementations can include one or more of the following features. Each printed circuit board module can include a singulated multi-layer printed circuit board ("PCB") including a plurality of conductive layers and a plurality of insulation layers, each conductive layer being separated from one or more adjacent conductive layers by one or more respective insulation layers. The printed circuit board has a top surface and a bottom surface. The singulated multi-layer printed circuit board defines a plurality of core leg apertures. Each printed circuit board module can include: at least one main winding formed in one or more of the conductive layers; and a plurality of winding elements formed in the conductive layers. Portions of the winding elements are arranged to overlap respective portions of the at least one main winding. Each printed circuit board module can include a magnetically-permeable core structure including a cured magnetically-permeable encapsulation compound that encapsulates at least a portion of the singulated multi-layer printed circuit board and fills in core leg apertures. The magnetically-permeable core structure can include magnetic paths that pass through the conductive layers in at least two leg locations.

The details of one or more embodiments of the invention are set forth in the accompanying drawings and description below. Other features, objects, and advantages of the invention will be apparent from the description and drawings, and from the claims.

BRIEF DESCRIPTION OF DRAWINGS

Like reference numbers and symbols in the various drawings indicate like elements.

DETAILED DESCRIPTION

Application Environment

A Factorized Power Architecture well suited for supplying power to low voltage high current loads is described in Vinciarelli, Factorized Power with Point of Load Sine Amplitude Converters, U.S. Pat. No. 6,975,098, issued Dec. 13, 2005 (the "Micro FPA Patent") and U.S. Pat. No. 6,984,965, issued Jan. 10, 2006 (the "FPA Patent") (both assigned to Vicor Corp. of Andover, MA., and the entire disclosure of each patent is incorporated herein by reference). Power converters which function as DC-to-DC transformers called Voltage Transformation Modules ("VTM") and Sine Amplitude Converters ("SAC") which have a transfer function approximating $V_O=K_{VTM}*Vin-I_O*R_{VTM}$ (i.e., fixed-ratio converters) are described in Vinciarelli, Factorized Power with Point of Load Sine Amplitude Converters, U.S. Pat. No. 6,930,893, issued Aug. 16, 2005 (the "SAC Patent") and in Vinciarelli, Point of Load Sine Amplitude Converters and Methods, U.S. Pat. No. 7,145,786, issued Dec. 5, 2006 (the "POL SAC Patent") (collectively the "SAC Patents") (both of which are assigned to Vicor Corp. of Andover, MA., and the entire disclosure of each is incorporated herein by reference). The SAC Patents describe the SAC topology using a two-cell SAC structure in connection with FIGS. 33, 34, and 40-42, which may be connected in parallel to provide greater output power.

Subsequent developments of in-package and on-package multi-cell power conversion topologies developed to meet the challenges of delivering high currents in typically small spaces for powering semiconductor loads are described in Vinciarelli, Driver and Output Circuit for Powering Semiconductor Loads, U.S. Pat. No. 10,014,798 issued Jul. 3, 2018, (the "Remote Driver Patent"); in Vinciarelli et al., Method and Apparatus for Delivering Power to Semiconductors, U.S. Pat. No. 10,158,357 issued Dec. 18, 2018 (the "MCM Patent"); and in U.S. Pat. No. 10,277,105 issued Apr. 30, 2019 (the "Multi-Rail Patent") (collectively the "PoP Patents") all of which are assigned to Vicor Corp. of Andover, MA., and the entire disclosure of each is incorporated herein by reference. Additional packaging developments for power converters are described in Vinciarelli et al., Panel Molded Electronic Assemblies with Multi-Surface Contacts, U.S. Pat. No. 10,264,664 issued Apr. 16, 2019 (the "Leadless Patent") and in Vinciarelli, Panel Molded Electronic Assemblies with Integral Terminals, U.S. Pat. No. 10,785,871 issued Sep. 22, 2020, (the "Trench Patent") (both of which are assigned to Vicor Corp. of Andover, MA., and incorporated herein in their entirety by reference).

Figure 1:
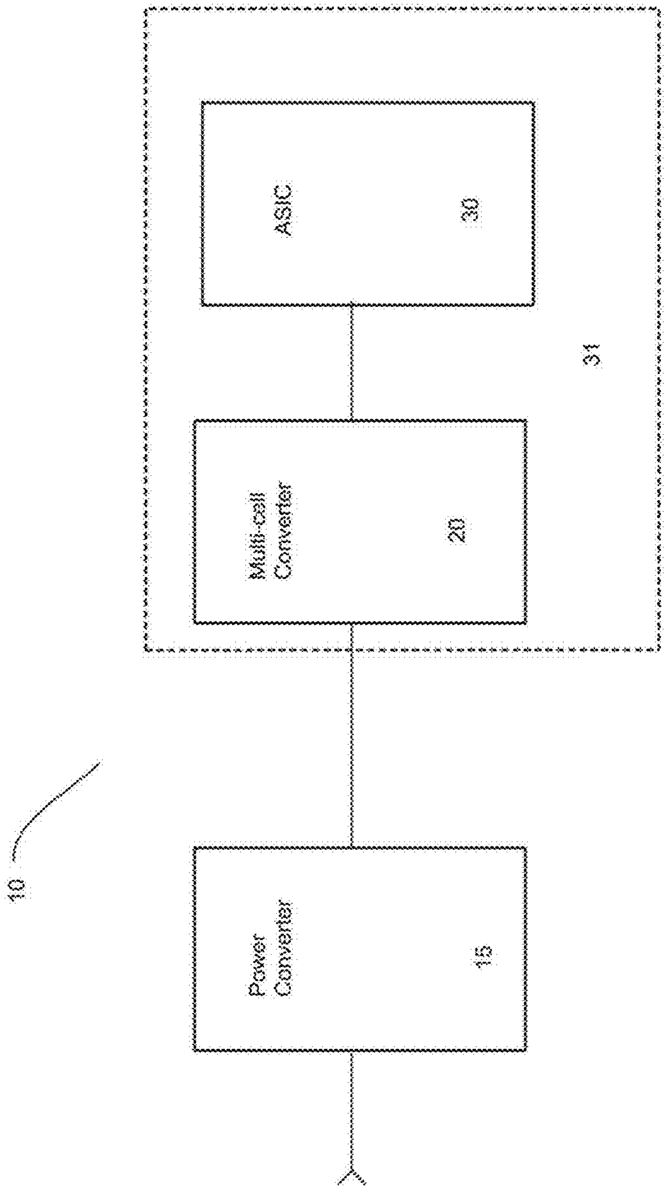
FIG. 1 shows a block diagram of a system for powering a semiconductor load such as a CPU, GPU, ASIC, or other high current demanding load.

A schematic block diagram of a preferred system 10 for powering a semiconductor load, such as a high-power ASIC, is shown in FIG. 1 (which is a reproduction of FIG. 1 from the GB patent cited below) including a first (preferably switching) power converter 15 connected to convert power received from a source, e.g. a system power bus, (not shown) for delivery (preferably at or near 48 Volts DC) to a second stage converter 20 which converts power for delivery at the low voltage required by the semiconductor, e.g. typically ranging from less than 2 VDC to less than 1 VDC to the semiconductor load, e.g. ASIC 30. As shown the second stage converter 20 is preferably a multi-cell, preferably fixed-ratio, switching converter mounted in close proximity to the point of load ("PoL"), for example on or in the same package or assembly, e.g. assembly 31, as the ASIC 30.

A multi-cell power converter for deployment at the point of load which leverages the foregoing advances and includes additional packaging and interconnection developments is described in Vinciarelli, Delivering Power to Semiconductor Loads, U.S. Pat. No. 10,903,734 issued Jan. 26, 2021, (the "GB patent") (assigned to Vicor Corp. of Andover, MA., the entire disclosure of which is incorporated herein by reference). The power converters as described in the above disclosures generally use a plurality of self-contained output cells in which the secondary windings comprise an essentially complete "turn" surrounding a respective core leg and generally correlate to the secondary winding configuration shown in Vinciarelli, Printed Circuit Transformer, U.S. Pat. No. 7,187,263 issued Mar. 6, 2007 (the "Racetrack" patent) (assigned to Vicor Corp. of Andover, MA, and incorporated by reference in its entirety here). That multi-cell structure (FIGS. 2 and 3 of the GB Patent) included a plurality of self-contained "independent cells" each one of which included components and windings necessary to independently operate as a separate stand-alone output. Examples of the self-contained output cells, typically arranged in a pattern of two self-contained cells coupled to a common magnetic core, such as U-cores, are shown and described in the GB patent (see FIGS. 2 and 3).

Preferably, the multi-cell converter 20 (FIG. 1) includes outputs configured for full-wave conversion, i.e., processing power received from the respective primary winding during both positive and negative excursions of the alternating current waveform. Thus, as described below each distributed output cell structure includes two halves, one for each phase (polarity) of the primary winding. Each half includes secondary winding elements and rectifiers arranged to conduct during a respective polarity phase of the AC waveform on the primary winding. These two halves (polarity phases) of the full-wave rectifying output structure should not be confused with the multiple primary windings (each a primary phase and each undergoing two polarity phases) of a multi-phase converter described in greater detail below. For clarity, the two phases of the output circuitry will be called output phases or polarity phases and the multiple primary windings will be called primary phases.

A converter structure based upon the SAC topology having a distributed-output circuit is described in Vinciarelli, Multi-cell Power Converter, U.S. Pat. No. 11,271,490, issued Mar. 8, 2022 (the "D-O Patent") and in Vinciarelli, et al., Multi-Cell Power Converter, U.S. Pat. No. 11,870,340, issued on Jan. 9, 2024, (the "SDS Patent") (both of which are assigned to Vicor Corp. of Andover, MA; and incorporated herein by reference in their entirety). As referenced herein, the distributed-output converter 100 shown in FIGS. 4-7 of the D-O Patent will be called the first distributed-output ("DO1") converter and the distributed-output converter 500 of FIGS. 26, 27, 28 and 29 of the SDS Patent will be called the second distributed-output ("DO2") converter.

Multi-Phase Distributed Output Converter

Figure 7A:
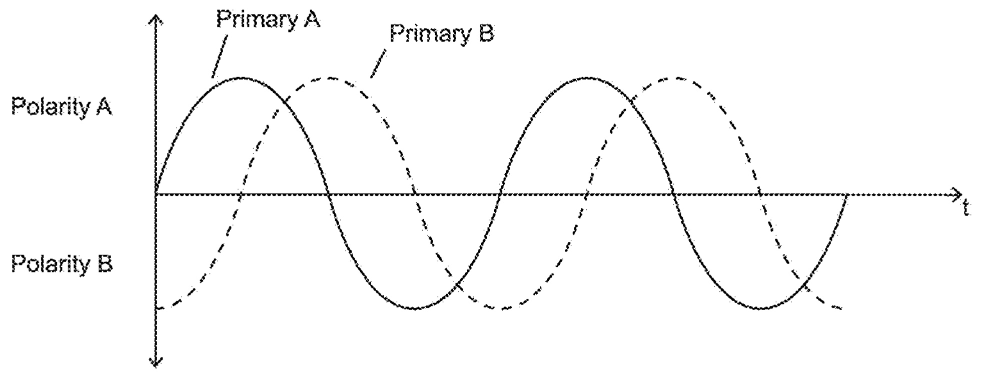
FIGS. 7A and 7B show primary AC waveforms for two-phase and three-phase multi-phase distributed-output converters.
Figure 7B:
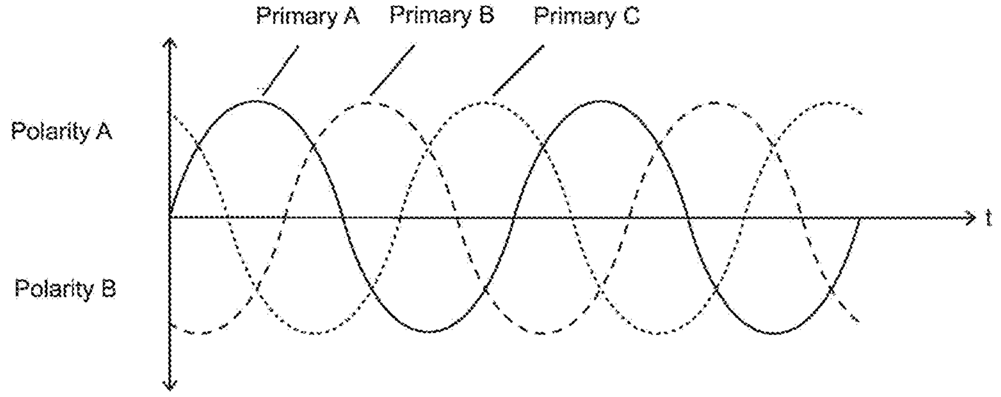

The present disclosure describes a new multi-phase distributed-output converter having a plurality of primary windings (primary phases) and a distributed-output structure, preferably arranged in a step and repeat pattern, and preferably employing a magnetic modular packaged transformer structure to improve current density and system efficiency for point of load applications. The multi-phase converter topology includes multiple primary windings, each driven by a respective waveform that is out of angular phase with the other primary winding waveforms. Referring to FIGS. 7A and 7B which show primary AC waveforms, the preferred angular displacement between the primary waveforms is ninety (90) degrees in the two-phase converter and one hundred twenty (120) degrees in the three-phase converter. An advantage of such a configuration is output ripple reduction, e.g. in the output current, sufficient to potentially eliminate output capacitors (e.g., capacitors 123 in FIG. 4 of the SDS Patent) from the converter itself, reducing the size of the converter, in some cases significantly, relative to previous converters that require the use of output capacitors.

Each separately-driven primary winding (primary phase) in the multi-phase converter is magnetically coupled to at least two output circuit halves of a full-wave rectifying distributed output cell structure, each half processing power for a respective polarity of the AC waveform. The two polarities of the AC waveforms are arbitrarily labeled as Polarity A and Polarity B in FIGS. 7A and 7B. To summarize, each distributed output circuit in the multi-phase converter preferably includes two halves, one half for Polarity A and another half for Polarity B. In the preferred embodiments described below, the Polarity A output circuits for each of the primary phases are combined together in a single interleaved multiply connected Polarity A output circuit. Similarly, the Polarity B output circuits for each of the primary phases are combined in a single Polarity B output circuit i.e., output circuit halves from different primary phases of like polarity may be combined into a single interleaved multiply connected output circuit half as shown and described below in connection with FIGS. 2A-2C, and 3-6. Other arrangements are possible, e.g. a multi-phase distributed output converter may have separate output circuits for each polarity and each primary winding resulting in four (4) output circuit halves for a two-phase converter and six (6) output circuit halves for the three-phase converter.

In the following description, each half (polarity) of the distributed output structure may be called an output phase or a polarity phase. The following examples also use the term phase to refer to each primary winding (primary phase) and its associated distributed output structures. For example, the two-phase and three-phase multi-cell converters descriptions below may refer to each primary winding as primary phase A and primary phase B (in the two-phase converter example) and primary phases A, B and C (in the three-phase converter example); the output structures of the multi-phase converters as polarity phases (Polarity A or Polarity B), therefore, the context determines the meaning of the word "phase" in the following description and claims.

Figure 2A:
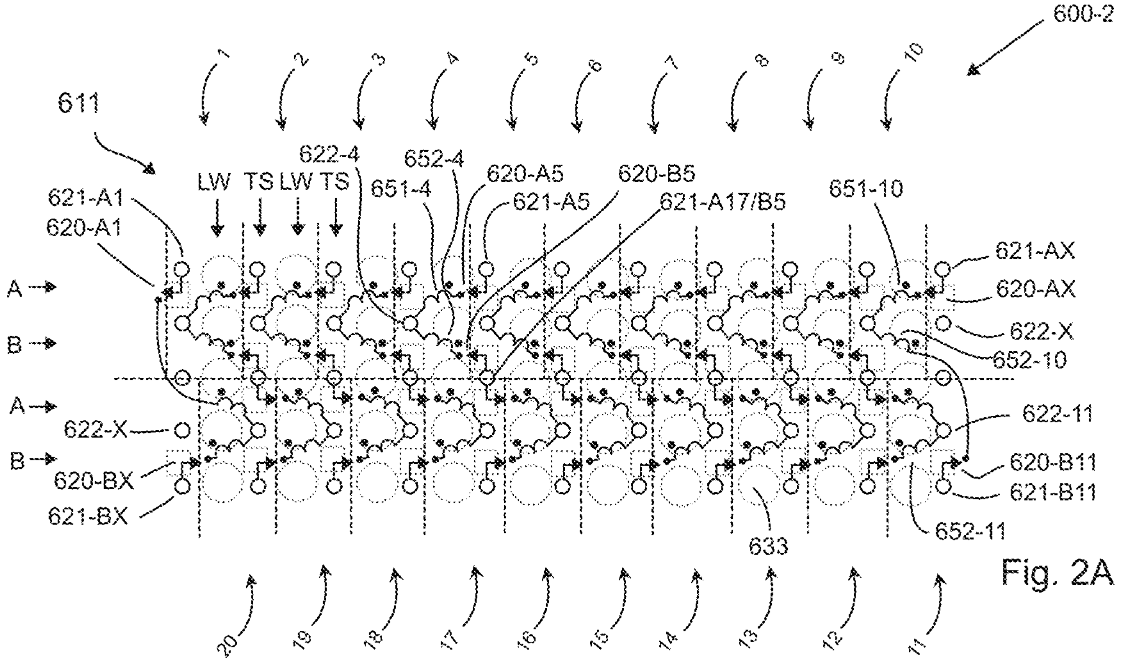
FIG. 2A shows a schematic diagram of a distributed-output circuit in a two-phase distributed-output power converter for the first polarity.
Figure 2B:
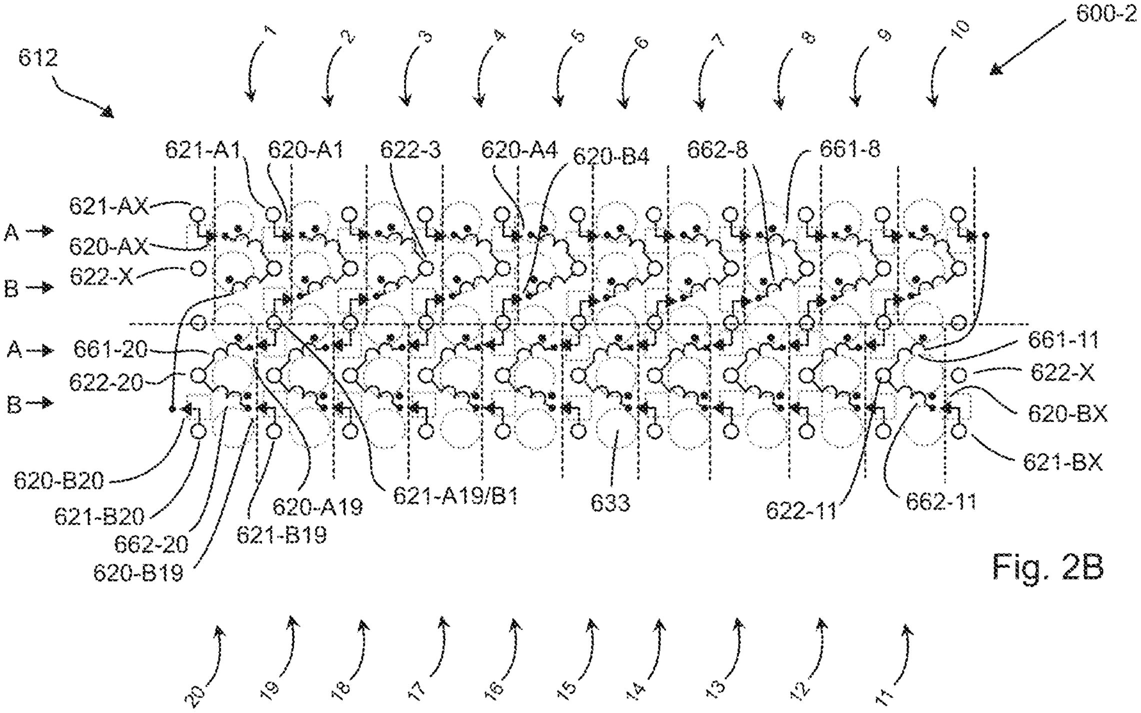
FIG. 2B shows a schematic diagram of a distributed output circuit in a two-phase distributed-output power converter for the second opposite polarity.
Figure 2C:
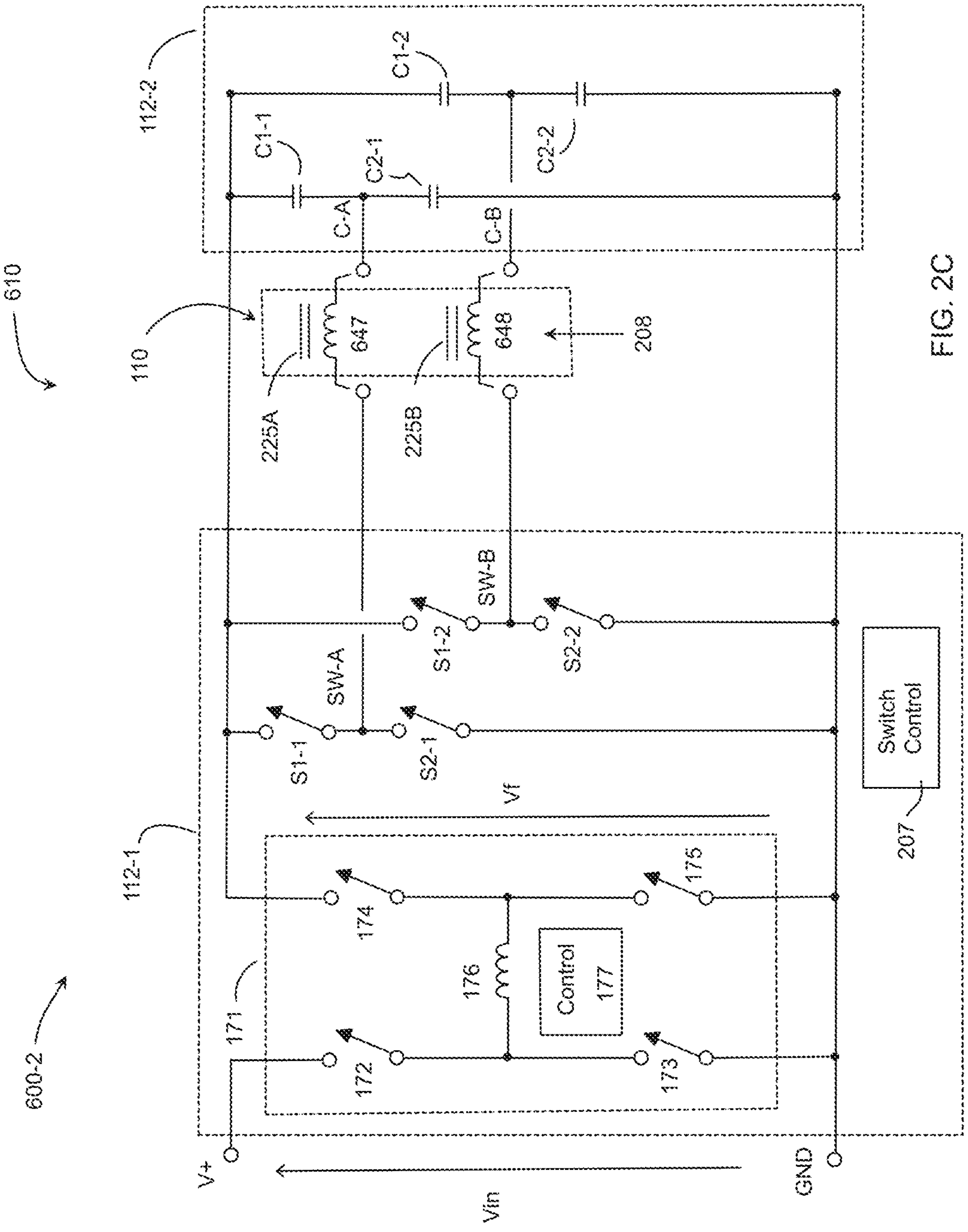
FIG. 2C shows a schematic diagram of a primary circuit for a two-phase distributed-output power converter, including the primary windings and a two-phase integrated driver.

Referring to FIGS. 2A, 2B and 2C, a schematic circuit diagram of a two-phase distributed-output power converter, 600-2, is shown having a primary circuit 610 in FIG. 2C, a first distributed output circuit, 611, for polarity-A in FIG. 2A, and a second distributed output circuit, 612, for polarity-B in FIG. 2B. In the circuit illustrated in FIGS. 2A and 2B, the converter, 600-2, is arranged with alternating columns. One type of column includes terminals and switches and is labeled "TS"; and the other type includes core legs and windings and is labeled "LW". Each of the TS columns (except the outer columns) includes a negative terminal in the first (top) row, a dual switch in the second row, a positive terminal in the third row, another dual switch in the fourth row, another negative terminal in the fifth (center) row, another dual switch in the sixth row, another positive terminal in the seventh row, another dual switch in the eighth row, and another negative terminal in the ninth (bottom) row. Located between adjacent TS columns are the LW columns, which each include four winding elements and five core legs. The winding elements extend between and are electrically connected to respective components in the adjacent TS columns. As shown in FIGS. 2A and 2B, the distributed output circuitry is arranged in a step-and-repeat pattern of alternating TS and LW column pairs which is terminated by a final TS column. Also, the first and final TS columns may in some cases omit one or more of the dual switches as discussed, along with additional details of the component arrangement, below in connection with the example of FIGS. 3-6. The "dual switch" refers to the smart-dual-switching (SDS) device described in the SDS Patent and below.

The transformer 208 includes a magnetic core structure 225 (e.g., 225A, 225B) that couples the primary windings 647, 648 (FIG. 2C) to each of the secondary winding elements, e.g. winding elements 651 and 652 in the polarity A, and winding elements 661 and 662 in the polarity B, distributed output circuits, 611 and 612, shown in FIGS. 2A and 2B, respectively. The magnetic core structure may be implemented using the process and structure described in the SDS Patent and the D-O Patent or preferably using the magnetic molded process discussed below. In the preferred interleaved embodiments described herein, the multiple primary windings and their respective secondary winding elements are all magnetically coupled together by a unitary magnetic core structure, described in more detail below.

The two distributed output circuits, 611 and 612, together provide full-wave (Polarity A and Polarity B) rectification for both primary windings in the two-phase converter, 600-2. The primary circuit 610, may as shown include a regulator 171 (which may correspond to power converter 15 in FIG. 1) including control circuitry 177 to control the voltage applied by the driver circuitry to the primary windings. The driver circuitry 112 may include two half-bridge driver circuits as shown connected to receive power from the output of regulator 171. Each half-bridge driver circuit includes two switches, a high-side switch S1 and a low-side switch S2 are connected to drive one end of its respective primary winding of transformer 208. For example, high-side switch S1-1 and low-side switch S2-1 drive primary winding A, 647; and high-side switch S1-2 and low side-switch S2-2 drive primary winding B, 648. Two resonant capacitors, high side capacitor C1 and low-side capacitor C2, may as shown be connected to the other end of the respective primary winding. For example, resonant capacitors C1-1 and C2-1 are shown connected to the other end of primary winding A, and resonant capacitors C1-2 and C2-2 are shown connected to the other end of primary winding B. The resonant capacitors C1, C2 together with a resonant inductance, which may preferably include, or consist entirely of, the transformer leakage inductance, form the resonant circuit of the SAC topology (described in more detail in the SAC Patents). Switch control circuitry, 207, e.g. as described in the SAC Patents and POP Patents (not shown in the figures) and in Vinciarelli, Digital Control of Resonant Power Converters, U.S. Pat. No. 9,166,481 issued Oct. 20, 2015, assigned to Vicor Corp. and incorporated here in its entirety by reference (the "Digital Control" patent); may be provided for the primary switches.

The driver circuitry including control circuitry, 207, for operating the primary switches may be packaged together in a unitary self-contained package including the resonant capacitors and regulator 171 for deployment at a location physically separated from the primary windings and distributed output circuitry 110. Examples of remotely driven point of load (POL) circuitry using the SAC topology are described in the POP Patents. Alternatively, the resonant capacitors may be packaged separately, e.g. on a customer board, allowing greater flexibility in system design. Furthermore, the driver circuitry may be packaged together with the primary windings and distributed output circuitry in a single modular package, either including the regulator 171 or not, depending on the application requirements. For example, the driver circuitry could be situated at one end of the converter layout shown in FIG. 3. The control circuitry 177 can include, e.g., one or more logic gates, and one or more operational amplifiers, that are configured to control the ON and OFF of the switches 172, 173, 174, and 175 as described in this document.

FIGS. 3-6 show an embodiment of the two-phase converter in which the primary windings and the distributed output circuitry are packaged together, preferably in a self-contained assembly adapted to be deployed as a unit at the point of load ("PoL"), and preferably separated by a distance from the driver circuitry, which may also be packaged in a self-contained assembly adapted to be installed as a unit.

The multi-cell converter includes multiple cells with multiple switches, multiple negative (or common) output terminals, and multiple positive output terminals. In FIGS. 2A and 2B, each dual switch is physically represented by a square box and/or electrically by an arrow and a dot (when a switch is ON it electrically connects one end of a corresponding winding to a respective negative output terminal 621, and when OFF disconnects the corresponding winding from the respective negative output terminal 621).

Referring to FIGS. 2A, 2B, and 3-6, the switches 620 in each cell element in the distributed output circuits, 611 (Polarity A) (FIG. 2A), 612 (Polarity B) (FIG. 2B), selectively connect one end of a respective secondary winding element 651 (for Primary Phase A) and 652 (for Primary Phase B) to a respective negative output terminal 621. For example, in output circuit 611 (Polarity A) switch 620-A5 connects the start of secondary winding element 651-4 (for Primary Phase A) to negative terminal 621-A5. Similarly, switch 620-B5 connects the start of secondary winding 652-4 (for Primary Phase B) to negative terminal 621-A17/B5. Note that use of a reference designations without a suffix, e.g. 620, refers to the component generally without specifying its location, e.g. a switch, and with a suffix, e.g. 620-A5, refers to the switch in the specified location, e.g. in the fifth cell element of Phase A. Some components that are shared between cells have a suffix indicating the sharing, e.g. negative terminal 621-A17/B5 is shared by Phase B cell element 5 and Phase A cell element A17. Similarly in output circuit 612 (Polarity B) switch 620-A19 connects the start of secondary winding element 661-20 (for Primary Phase A) to negative terminal 621-A19/B1 and switch 620-B19 connects the start of secondary winding 662-20 (for Primary Phase B) to negative terminal 621-B19. The other end of the secondary winding elements are connected to a respective positive terminal 622. For example, in output circuit 611 (Polarity A) the opposite ends of secondary winding elements 651-4 (Primary Phase A) and 652-4 (Primary Phase B) are both connected to positive terminal 622-4. Similarly, in output circuit 612 (Polarity B) the opposite ends of secondary winding elements 661-20 (Primary Phase A) and 662-20 (Primary Phase B) are both connected to positive terminal 622-20.

The multi-phase distributed-output circuit includes a plurality of inter-dependent output-cell elements, which may be physically arranged in a step-and-repeat pattern, forming a distributed cell structure in which the winding elements and cell elements are electrically interconnected in one or more major circular strings and optionally one or more sub-strings which may be nested within the major circular string(s). In other words, the cell elements may be multiply-connected as described in more detail below. The term cell element in this document refers in the context of the distributed output structure to the smallest grouping of components in the step and repeat pattern of a single polarity phase. The cell elements may be multiply-connected and may be operationally interdependent on the other elements in the string.

Figure 3:
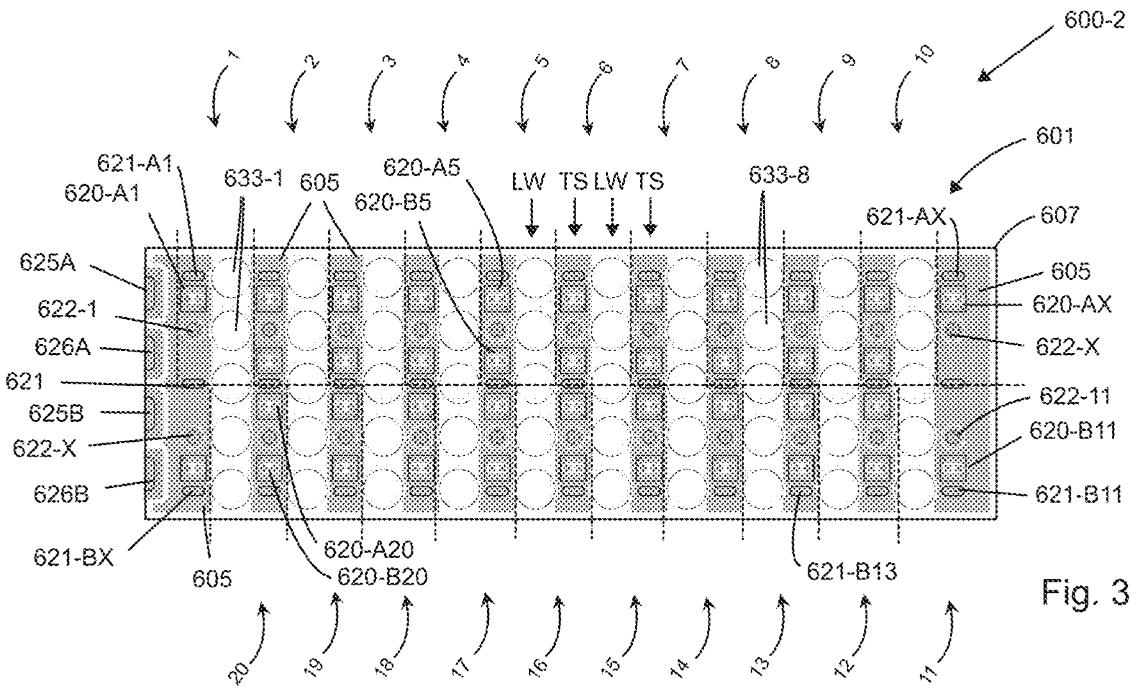
FIG. 3 shows a plan view of the two-phase distributed-output converter.

In FIGS. 2A, 2B, and 3-6, cell boundary lines are shown by broken lines and each cell is labeled with a number from 1 through 20 starting in the upper left corner, across to the upper right corner, down to the lower right corner, and then across to the lower left corner. The LW and TS labels at the top left of output circuit 611 (FIG. 2A) help illustrate the pattern of alternating columns of core legs and windings (LW) and terminals and switches (TS) between cells 1 and 3. Similar notations are included in physical component layout of FIG. 3 in cells 5-7. As shown in FIGS. 3 and 2A, the step and repeat pattern of alternating TS and LW columns begins with a TS column and is also terminated with an extra TS column. The terminals and switches in the extra TS column are labeled with an X suffix rather than a cell number in FIGS. 2A and 2B.

Figure 5:
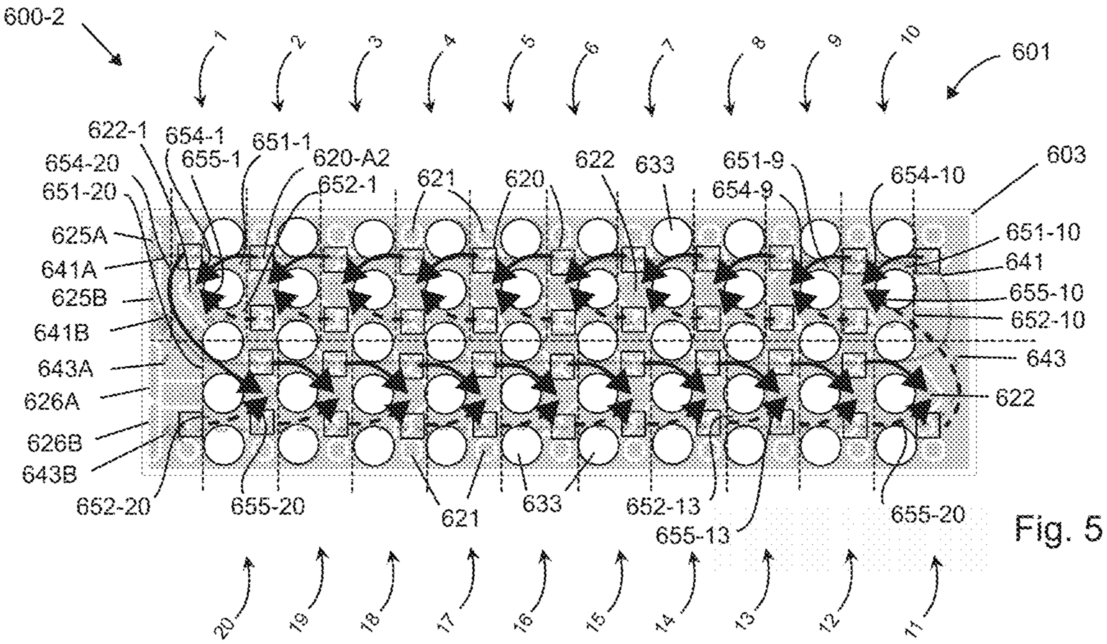
FIG. 5 shows a plan view of a conductive layer with secondary-winding elements of the distributed-output circuit for the first polarity in the two-phase distributed-output converter.
Figure 6:
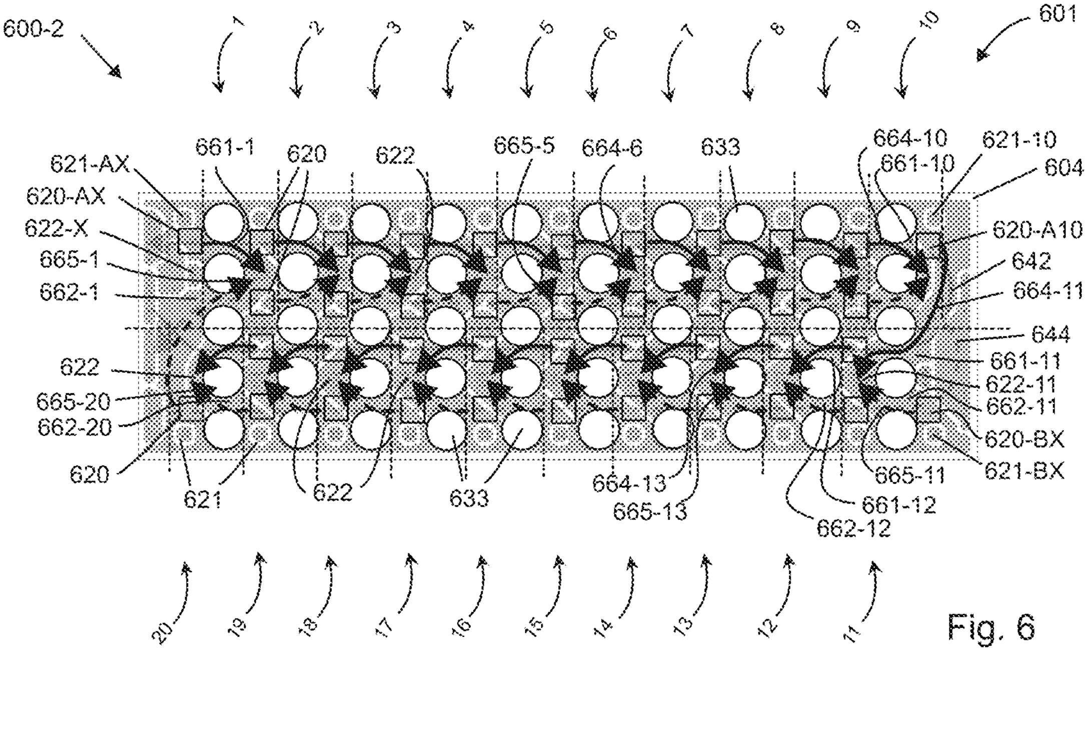
FIG. 6 shows a plan view of a conductive layer with secondary-winding elements of the distributed-output circuit for the second opposite polarity in the two-phase distributed-output converter.

As mentioned earlier, the Polarity A output circuits for each of the primary phases (Primary A and Primary B) are preferably combined as shown in FIG. 2A and FIG. 5 to form a single Polarity A output circuit in the preferred embodiment. Similarly, the Polarity B output circuits for each of the primary phases (Primary A and Primary B) are combined together in a single Polarity B output circuit as shown in FIGS. 2B and 6. Starting from the top in FIGS. 2A and 2B, the first row of components is labeled A, the second row is labeled B, the third row is labeled A and the fourth row is labeled B to correspond with the primary phase with which each is associated. Thus, the windings 651 and switches 620 in the first and third rows of output circuit 611 (FIG. 2A) are associated with primary A, and the windings 652 and switches 620 in the second and fourth rows are associated with primary B. Similarly, the windings 661 and switches 620 in the first and third rows of output circuit 612 (FIG. 2B) are associated with primary A, and the windings 662 and switches 620 in the second and fourth rows are associated with primary B.

Referring to FIGS. 3-6, the step and repeat pattern includes ten (10) columns of five core legs each. In the preferred embodiment, all of the core legs are part of a unitary magnetically permeable core structure that includes two plate-like features covering the two major surfaces (top and bottom) of the PCB and all of the core legs 633 extending between the two plate-like features. Thus, a multitude of cell elements are coupled to a common magnetically permeable core.

Although not shown in FIGS. 2A and 2B for legibility, the distributed output terminals, i.e. common terminals, 621, and positive terminals 622, in each of the cells may be connected to their respective common output terminal, which may preferably extend along the length of the package, e.g. by conductive plating on the exterior of the converter package. Examples of such exterior plated interconnections for the output terminals of a multi-cell converter are shown in FIG. 3 of the SDS Patent and described in the Trench Patent (See FIGS. 18A, 18B) and the GB Patent (see metal strips 316, 317, and 318 connecting the terminations in their respective row in FIGS. 5A, 5B). Referring to FIG. 3, all of the negative terminals 621 in the first row of terminals may be connected together; all of the positive terminals 622 in the second row of terminals may be connected together; all of the negative terminals 621 in the third (center) row of terminals may be connected together; all of the positive terminals 622 in the fourth row of terminals may be connected together; and all of the negative terminals 621 in the fifth (bottom) row of terminals may be connected together. Similarly, as shown at the left-most side of the converter in FIG. 3, an additional column of electrical terminations, e.g. electrical terminations 625A, 626A, 625B, and 626B, may be provided for making connections to the primary windings. For example, terminations 625A and 625B may be used for power input connections, e.g. to primary winding A (641 in FIG. 4) and terminations 626A and 626B may be similarly used to provide connections to primary winding B (643 in FIG. 4).

Additionally, output capacitance (not shown in FIGS. 2A and 2B) may be connected to the distributed output to provide filtering, e.g. as described in the GB Patent (FIGS. 5-7). However, an advantage of the multi-phase converters described herein is a significant reduction, or elimination in some applications, of filter capacitance.

The cell elements in each of the two distributed output structures, 611 Polarity-A and 612 Polarity-B, are connected in a circular arrangement. For example, in 611 Polarity A (FIG. 2A), the current flows between cell elements in descending numerical order, from cell element 16 to cell element 15 in the sequence 16-15-14-13-12-11-10-9-8-7-6-5-4-3-2-1 and then back to 16 to complete the circle; in phase B (FIG. 2B), the current flows between cell elements in the opposite direction, i.e. in ascending numerical order, from cell element 1 to cell element 2 in the sequence 1-2-3-4-5-6-7-8-9-10-11-12-13-14-15-16 and back to cell element 1 to complete the circle. To illustrate the point further, in output circuit 611 (polarity A in FIG. 2A), winding element 651-1 (Primary A) and winding 652-1 (Primary B) respectively carry current from switch 620-A2 and switch 620-B2 in the TS column on the right to a shared positive terminal 622-1 in the TS column on the left. In output circuit 612 (polarity-B in FIG. 2B) the cell elements are similarly connected but in the reverse direction: winding element 661-2 (Primary A) and winding 662-2 (Primary B) respectively carry current from switch 620-A1 and switch 620-B1 in the TS column on the left to a shared positive terminal 622-2 in the TS column on the right.

In addition to the major circular connection of cell elements described above, the cell elements in the distributed-output structure may be multiply connected to also form sub-circle connections, e.g. circular connections nested within the major circular connection. For example, in addition to being an element in the major circular connection (which includes all of the cell elements as described above) each cell element in FIG. 2A is also a member of several sub-circles (nested within the major circular connection), including its immediate neighbors. The step-and repeat pattern of interdependent cell elements in the distributed structure may be configured to increase or decrease the extent of the inter-cell element multiply connectedness. For example, the one-step (FIGS. 5 and 6 herein) and the two-step (FIGS. 8, 9 of the D-O Patent), use a pattern that shares the positive output terminals (e.g., 122 of the D-O Patent) between top and bottom rows of cell elements. In other words, the positive output terminals in the bottom row overlap those in the top row creating the sub-circular connections described above. If the positive output terminals did not overlap between rows, that would eliminate the sub-circular connections reducing the multiple connectedness.

Referring again to the component layout of FIG. 3, an example of a two-phase distributed output converter 600-2 having a plurality of ten (10) columns, LW, of core legs 633 arranged between eleven columns of conductive terminals 621, 622 and dual switches 620 to form forty interdependent output cell elements, twenty for each polarity and phase, 1, 2, 3, . . . 18, 19, 20 on a multilayer PCB 601. Note that only an exemplary one or more of the components and magnetic core structures are labeled in FIGS. 3-6 to maintain legibility; however, it should be understood that like components carry like reference designations subject to the cell element suffixes described below.

The multi-layer PCB 601 may include a plurality of conductive layers in which the transformer winding elements and electrical interconnections may be formed. For example, a PCB layer stack-up may include a set of one or more conductive layers in which one or more turns of the primary windings may be formed, a first set of one or more layers in which the winding elements of the first polarity secondary windings may be formed, and a second set of one or more layers in which the winding elements of the second polarity secondary windings may be formed. In this example, the winding elements of the primary winding may be connected in series to divide the input voltage, and the winding elements of each phase of the secondary windings may be connected in parallel to multiply the output current and reduce output resistance. Additional conductive layers may be provided for mounting components, e.g. dual electronic switches (620 FIG. 3) and optional capacitors (not shown) to the PCB 601. Preferably, the components are located on the top (shown) and bottom (not shown) PCB surfaces for improved electrical and thermal performance, e.g. as described in Vinciarelli et al., Encapsulated Modular Power Converter with Symmetrical Heat Distribution, U.S. Pat. No. 9,516,761 issued Dec. 6, 2016, assigned to Vicor Corp. of Andover, MA, and incorporated by reference in its entirety here (the "Symmetrical Patent").

In FIG. 3, dashed lines illustrate imaginary boundaries between each cell element in the distributed output structure, each cell element shown including a dual switch 620, negative output terminal 621, a small vertical loop in the magnetic core structure, represented as an adjacent pair of core legs 633, most of which may be shared by neighboring cells, and a positive output terminal 622 which may also be shared with a neighboring cell, e.g. as shown in the preferred interleaved embodiment, the neighboring cell may be associated with different primary winding. A "small" loop is defined herein by vertically adjacent core legs.

Conductive features, e.g. 605 (FIG. 3), may be provided to connect a multiplicity of negative terminals within each cell, e.g. to reduce electrical resistance. A secondary benefit of the conductive features 605 is to reduce leakage inductance by forming conductive loops, e.g. between adjacent columns of core legs. Referring to FIG. 5 for illustration, each winding element in the top row is coupled to the small loop or path in the magnetically permeable core that includes the vertically adjacent core legs, one in the first (top) row and one in the second row; similarly, each winding element in the second row is coupled to the small loop in its adjacent core legs, one in the second row and one in the third (middle) row, and so on. The legs in the interior rows, e.g. rows 2-3 in the two-phase example of FIGS. 2-6 are therefore shared. As discussed below, the unitary structure reduces flux crowding and may therefore avoid the need for a larger cross section in the shared (interior) core legs as compared to the legs in the top and bottom rows.

In each of the upper right and lower left corners in FIG. 3, some components including a dual switch 620, a negative output terminal 621, a positive output terminal 622, and half of a negative terminal 621 reside outside of, or on the border of, the numbered cell element boundaries. The term "-x designated" may be used herein to refer to components that are located outside of the numbered cell boundaries, to differentiate from the components included within the numbered cells. In the two-phase example, the "-x" suffix in a reference designation does not indicate non-use in the phase being illustrated. In the output circuit 611 in FIG. 2A for example, switches 621-AX and 620-BX are outside the cell boundaries but are used to connect winding elements 651-10 and 652-20 to negative terminals 621-AX and 621-BX, respectively. Each dual switch 620 shown as a square box in FIG. 3, is shared between the two polarity output circuits, 611 and 612. For example, the dual switch 620-A1 shown residing in Cell 1 of FIG. 3 includes switch 620-A1 in cell 1 of the output circuit 611 (FIG. 2A) and 620-AX to the left of cell 1 of the output circuit 612 (FIG. 2B). Similarly, dual switches 620-A5 and 620-B5 shown residing in cell 5 in FIG. 3 respectively include switches 620-A5 in circuit 611 (FIG. 2A) and 620-A4 in circuit 612 (FIG. 2B) and switches 620-B5 in circuit 611 (FIG. 2A) and 620-B4 in circuit 612 (FIG. 2B). Note that cell boundaries, and thus the numbers of some components, shift between the two polarity output circuits because of the change in direction of current flow. For example, the switch 620-A2 in circuit 611 becomes switch 620-A1 in circuit 612. The cell boundaries shown in FIG. 3 correspond to those used for polarity A, e.g. output circuit 611 (FIGS. 2A and 5).

The multi-phase converter may include power output terminations, e.g. positive terminations 622, and common (or negative) terminations 621, distributed on the generally planar top surface of the encapsulated converter for vertical power delivery. (Vertical power delivery is described in greater detail in the GB Patent and SDS Patent.) As shown in FIG. 3, twenty two (22) positive terminations 622 and thirty three (33) common terminations 621 provide a total of fifty-five power connections distributed in an array of eleven TS columns and five rows. As shown in FIG. 3, the magnetically permeable core legs 633 are disposed in columns LW between the TS columns, aligned with the power terminations.

Figure 4:
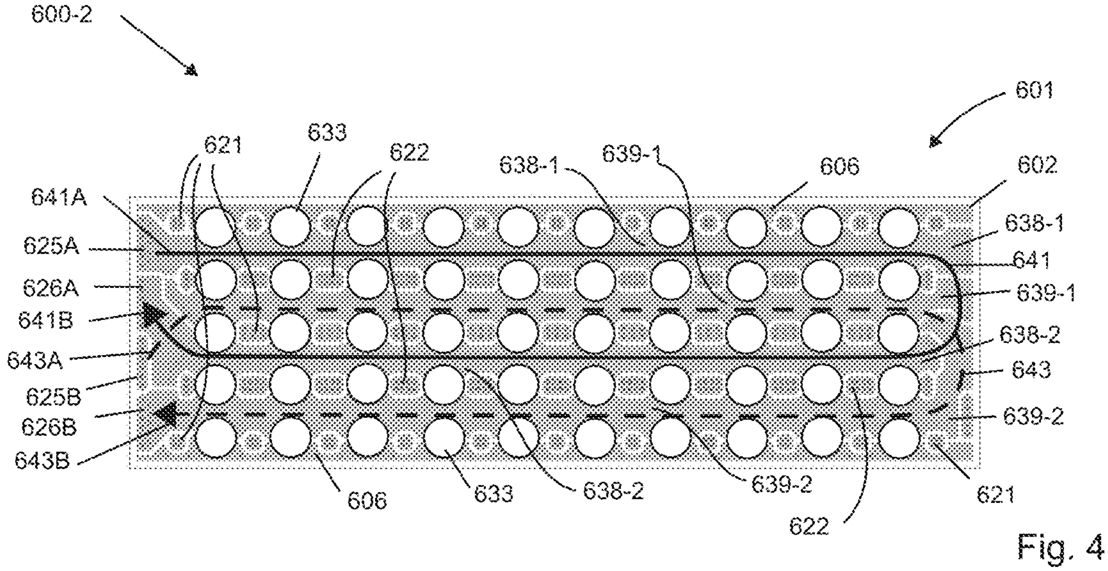
FIG. 4 shows a plan view of a conductive layer with multiple primary windings of the two-phase distributed-output converter.

Referring to FIG. 4, two single-turn primary windings, primary A, 641, and primary B, 643, are shown formed in conductive layer 602 of the PCB 601. As shown in FIG. 4, each single-turn primary winding may include two conductive segments, e.g. primary winding A (647 in FIG. 2C) includes conductive segments 638-1 and 638-2, and primary winding B (648 in FIG. 2C) includes conductive segments 639-1 and 639-2. The segments of each winding are connected together to form a loop in other layers (not shown) of the PCB in the example of FIG. 4. For illustration purposes, assume the single turn primary windings, 647 and 648, highlighted by arrows 641 and 643 as shown in FIG. 4 are each connected to their respective input termination 625A and 625B and 626A and 626B, respectively. Note that the connections are not intended to be accurately depicted in FIG. 4. In practice several primary turns, e.g. like the primary turn shown in FIG. 4, may be connected in series to form a multi-turn primary winding. For example, a 48V input converter may use primary windings having four turns formed in respective conductive layers, e.g. 1 turn in each layer such as shown in FIG. 4 or two or more turns formed in a single layer (not shown) depending on the application.

The arrows, 641 and 643, in FIG. 4 illustrate the current flow in the primary windings, 647 (Primary A) and 648 (Primary B), during a first polarity phase of operation, e.g. polarity A represented by the voltage at terminal 625A (625B) being greater than the voltage at terminal 626A (626B). As a result, the primary current is shown flowing in the same direction in FIGS. 4 and 5 (and in the opposite direction for FIG. 6). For example, the current in primary winding A (647 in FIG. 2) is shown in FIG. 5 flowing left to right from terminal 625A (the beginning 641A of arrow 641) through primary segment 638-1 and then back from right to left through segment 638-2 to terminal 626A (the arrowhead 641B end of arrow 641). Similarly, the current in primary winding B (648) is shown in FIG. 5 flowing left to right from terminal 625B (the beginning 643A of arrow 643) through primary segment 639-1 and then back from right to left through segment 639-2 to terminal 626B (the arrowhead 643B end of arrow 643).

FIG. 4 shows the conductive turn (represented by arrow 641) extending in a first direction through a first "tunnel" of magnetically permeable paths, e.g. the upper loops formed between the core legs 633 in the first and second rows of the upper cells, e.g. 1-10, and returns in the opposite direction through a third tunnel of magnetically permeable paths formed between the core legs 633 in the third and fourth rows of the lower cells, e.g. 11-20. For example, the segment 638-1 of the primary winding 647 (FIG. 2) extends through the first tunnel, and segment 638-2 extends through the third tunnel. Similarly, the conductive turn (represented by arrow 643) extends in a first direction through the second tunnel of magnetically permeable paths, e.g. the loops formed between the core legs 633 in the second and third rows of the upper cells, e.g. 1-10, and returns in the opposite direction through a fourth tunnel of magnetically permeable paths formed between the core legs 633 in the fourth and fifth rows of the lower cells, e.g. 11-20. For example, the segment 639-1 of primary winding 643 extends through the second tunnel, and segment 639-2 extends through the fourth tunnel. As illustrated, the two primary windings, 647 and 648, are interleaved with each other which helps improve flux distribution in the magnetically permeable core structure.

Output circuitry for processing power induced in the secondary winding elements 651 and 652 by the respective primary windings, 647 and 648, during polarity A operation is illustrated in the electrical schematic and physical component layout of FIGS. 2A and 5. Similarly output circuitry for processing power induced in the secondary winding elements 661 and 662 by the respective primary windings, 647 and 648, during polarity B operation is illustrated in the electrical schematic and physical component layout of FIGS. 2B and 6.

Referring to FIGS. 5 and 2A, a physical implementation of the combined distributed output circuitry 611 for polarity A of the primary windings, A (647) and B (648), schematically shown in FIG. 2A, will be described in greater detail with reference to the PCB conductive layer 603. A first set of secondary winding elements 651 (for primary A) and 652 (for Primary B) for the interdependent cell elements of the first polarity of the output circuit, e.g. Polarity A, of the distributed output structure is shown in FIG. 5 being formed in PCB conductive layer 603. In FIG. 5, the secondary currents in each cell (represented by arrows 654 (associated with primary A) and 655 (associated with primary B)), for polarity A are shown flowing from the respective beginning of the winding element at a respective switch (represented by a square box) to the end of the respective winding element, which is a terminal junction of two vertically adjacent winding elements and a respective positive terminal 622 (where two arrowheads meet). As shown in FIG. 5 and FIG. 2A, the vertically adjacent winding elements are associated with different primary phases, e.g. winding elements 651 are associated with primary A and winding elements 652 are associated with primary B.

The numbering convention used throughout the figures appends the cell number to the feature reference designation, e.g. as shown in FIG. 5, secondary winding element 651-1 belongs to cell element 1, secondary winding element 652-4 belongs to cell element 4, etc. Also, each numbered cell includes two parts, one associated with primary A and the other associated with primary B. The winding elements for each primary and for each polarity bear unique numbers: winding element 651 for Primary A, Polarity A; winding element 652 for Primary B, Polarity A; winding element 661 for Primary A, Polarity B; and winding element 662 for Primary B, Polarity B; but also bear the cell number suffix. Other components, such as the switches 620 and terminals, 621, 622 use the same reference designation regardless of primary or polarity, but use a suffix to appropriately designate the relevant associations, e.g. common terminal 621-B20 in output circuit 612 is in the B polarity portion of cell 20, negative terminal 621-A17/B5 is shared between the A polarity portion of cell 17 and the B polarity portion of cell 5. Note that only an exemplary one or more of the reference designations are shown in FIGS. 2-7 to maintain clarity.

As shown in FIGS. 5 and 2A for polarity A, the secondary currents in each winding element flow in the same direction as in the adjacent winding or cell elements. For example, the secondary currents represented by arrows, 654 (in secondary winding elements 651 associated with Primary A) and 655 (in secondary winding elements 652 associated with Primary B) in FIG. 5 flow from right to left in each of the top cells 1-10 and from left to right in each of the bottom cells 11-20. Although the currents in the bottom cell elements appear to flow in opposite directions, they have the same polarity as the currents flowing from the top cell elements as described in more detail below. As shown, all secondary winding elements, 651 and 652, in conductive layer 603 are operational during the same polarity phase, e.g. polarity A as defined above. Furthermore, in the distributed output structure, each secondary winding element, 651 and 652, begins at the electronic switch 620 in the neighboring cell and ends at the junction at the positive output terminal 622 in its cell, e.g. secondary winding element 651-1 starts at switch 620-A2 in cell 2 and ends at the junction of the positive output terminal 622-1 (shared by the elements from primary A and primary B in cell 1). Note that the beginning of the secondary winding element 651-1 is located outside of the boundaries of its cell, e.g. cell element 1, and inside the boundaries of a neighboring cell element, e.g. cell element 2 (FIGS. 2A and 5).

Referring to FIGS. 6 and 2B, a physical implementation of the combined distributed output circuitry 612 for polarity B of the primary windings, A (647) and B (648), schematically shown in FIG. 2B, will be described in greater detail with reference to the PCB conductive layer 604. The distributed output circuit 612 shown in FIGS. 2B and 6 is the complement of the distributed output circuit 611 shown in FIGS. 2A and 5 i.e., the opposite polarity. A second set of secondary winding elements 661 (for primary A) and 662 (for Primary B) for the interdependent cell elements of the second polarity of the output circuit, e.g. Polarity B, of the distributed output structure is shown in FIG. 6 being formed in PCB conductive layer 604. As shown in FIG. 6 for polarity B, the secondary currents in each winding element (represented by arrows 664 (associated with primary A) and 665 (associated with primary B)), are shown flowing from the respective beginning of the winding element at a respective switch (represented by a square box) 620 to the end of the respective winding element, which is a terminal junction of two vertically adjacent winding elements and a respective positive terminal 622 (i.e. where two arrowheads meet). As shown in FIG. 6 and FIG. 2B, the vertically adjacent winding elements are associated with different primary phases, e.g. winding elements 661 are associated with primary A and winding elements 662 are associated with primary B.

Like the phase-A polarity example of FIG. 5, the phase-B polarity secondary currents flow in the same direction in adjacent cell elements from left to right in each of the top winding elements (cells 1-10) and from right to left in each of the bottom winding elements (cells 11-20), which have the same polarity as the phase-B currents in the top cell elements as described in more detail below. All of the secondary winding elements in conductive layer 604 (FIG. 6) operate on the second polarity phase, e.g. phase B, of its respective primary winding, which is complementary to the first phase, phase A, defined above. Furthermore, each secondary winding element 661, 662, in the phase B distributed output structure starts at the electronic switch 620 within the neighboring cell and terminates at the junction of the positive output terminal 622 within its cell element, e.g. secondary winding element 661-11 begins at switch 620-A10 and terminates at the junction with positive output terminal 622-11 (which is shared by winding elements 661-11 (for primary A) and 662-11 (for primary B). Like in the phase-A conductive layer, the switch 620 in each cell connects the start of its respective secondary winding element to its negative output terminal 621, e.g. switch 620-A10 connects the start of secondary winding element 661-11 to negative terminal 621-10, and switch 620-BX connects the start of secondary winding element 662-11 to negative terminal 621-BX.

As shown in FIGS. 5 and 6 each secondary winding element, e.g. elements 651, 652, 661, and 662, passes through the magnetically permeable loop residing within its respective cell element, e.g. winding element 651-1 of cell 1 (primary A, polarity A) passes through the magnetically permeable loop formed between core legs 633-1 in the first (top) row and second row in cell 1 in FIG. 5, and winding element 661-1 of cell 1 (primary A, polarity B) passes through the magnetically permeable loop between the same pair of core legs, i.e., the core legs 633 in the first (top) row and second row in cell 2 in FIG. 6. Accordingly, winding element 652-1 of cell 1 (primary B, polarity A) passes through the magnetically permeable loop formed between core legs 633-1 in the second row and third row (also shared with cell 20) in cell 1 in FIG. 5, and winding element 662-1 of cell 1 (primary B, polarity B) passes through the magnetically permeable loop formed between the same pair of core legs, i.e., the core legs 633-1 in the second and third rows in cell 1 in FIG. 6. The core and winding structure shown in FIGS. 3-6 therefore provides a 20:1 voltage transformation ratio for each primary turn to each secondary winding element, and by way of example if used with four primary turns connected in series for each primary winding would yield an 80:1 voltage transformation ratio.

In the multi-phase distributed output structure, current flows from cell element to cell element as described above forming elemental carousels, in opposing directions depending on phase. As a result of the directional change in current flow between phase-A polarity and phase-B polarity in the distributed output structures, cell element boundaries for the physical layouts, e.g. as shown in FIGS. 5 and 6, drawn consistent with the electrical convention described above, shift between phases. Thus, the physical element boundaries for phase-A in FIG. 5 (which are also shown in FIGS. 2A, 3, and 4), are shifted with respect to the physical boundaries shown in FIGS. 2B and 6 for phase-B to account for the change in current direction between cell elements in opposite phases. Accordingly, the physical representation of the dual switches 620-A1 and terminals 621-A1 and 622-1 which are within cell element 1 for phase A (FIG. 5) fall outside of cell element 1 in phase B (FIG. 6) (and are therefore labeled 620-Ax, 621-Ax, and 622-*x*) for phase B. Similar changes between phases are evident for all of the boundary condition cells, i.e. cells 1, 10, 11, and 20.

Applicant has found that interleaving the primary windings and output structures produces better magnetic flux distribution in the magnetically permeable core structure. The primary windings are shown interleaved in FIG. 4, i.e. having an overlapping pattern. Rather than arranging each primary winding and its associated core structure and output circuitry individually as stand-alone entities, they are interwoven in an overlapping pattern in the multi-phase converter. For example, primary segment 639-1 of primary B is located between two segments, 638-1 and 638-2, of primary A, and primary segment 638-2 of primary A is located between segments 639-1 and 639-2 of primary B in FIG. 4. As a result of this arrangement, each primary winding in the two-phase example of FIG. 4 is shown enclosing two core legs in each column.

A first winding and a second winding are "interleaved" when a portion of the first winding overlaps a portion of the second winding, or when a first area encircled by the first winding overlaps a second area encircled by the second winding, to form an overlapping pattern as viewed from a top (or bottom) side of the converter. In the example of FIG. 4, the right portion of the primary winding A 641 overlaps the right portion of the primary winding B 643 as viewed from the top side. Furthermore, a first region encircled by the primary A overlaps a second region encircled by the primary B, as viewed from the top side. In the example of FIG. 4, the segments 638-1 and 638-2 of primary winding A 641, and the primary segments 639-1 and 639-2 of primary winding B 643 are formed on the same conductive layer of the printed circuit board. It is also possible for the segments 638-1, 638-2, 639-1, and 639-2 to be located at different conductive layers of the printed circuit board. In one example, the segments 638-1 and 638-2 are in a first conductive layer, and the segments 639-1 and 639-2 are in a second conductive layer. In one example, the segment 638-1 and the segment 638-2 are in different conductive layers. In one example, the segment 639-1 and the segment 639-2 are in different conductive layers.

The distributed output structure, following the primary arrangement, is also interleaved as shown in FIGS. 2A and 2B. Referring to the polarity A output circuit 611 in FIG. 2A, the portion of cell elements 1-10 in the first (top) row labeled A are for primary A, the portion of cell elements 1-10 in the second row labeled B are for primary B, the portion of cell elements 11-20 in the third row labeled A are for primary A, and the portion of cell elements 11-20 in the fourth (bottom) row labeled B are for primary B. The polarity B output circuit 612 in FIG. 2B exhibits similar interleaving: the portion of cell elements 1-10 in the first (top) row labeled A are for primary A, the portion of cell elements 1-10 in the second row labeled B are for primary B, the portion of cell elements 11-20 in the third row labeled A are for primary A, and the portion of cell elements 11-20 in the fourth (bottom) row labeled B are for primary B.

Three-Phase Example

Figure 8:
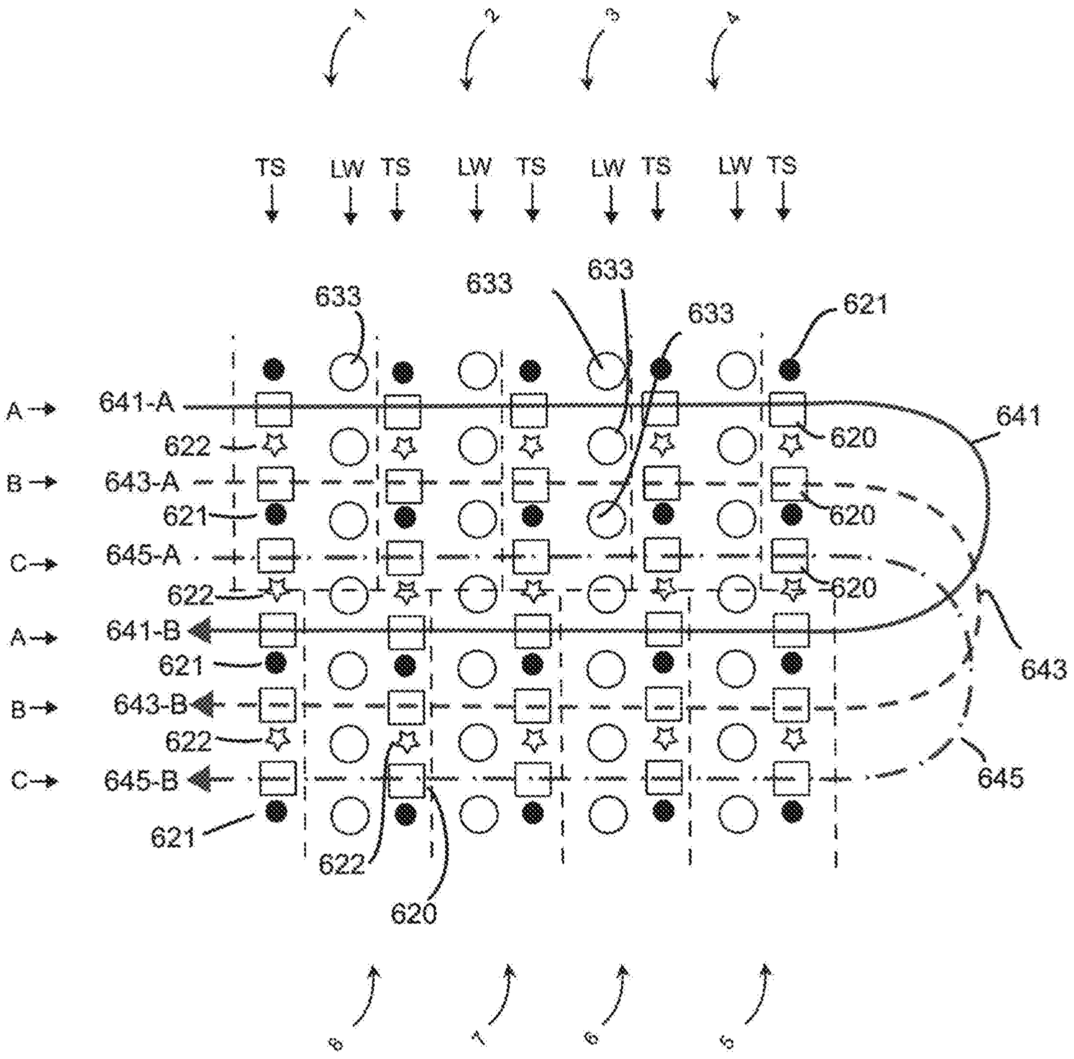
FIG. 8 shows a top view schematic layout of an example of interleaved primary windings of a multi-phase distributed-output converter having three phases and seven core legs.

A three-phase version of the distributed-output converter structure is schematically shown in FIG. 8 having alternating LW (leg & winding) columns and TS (terminal and switch) columns in a step-and-repeat pattern. The LW columns include magnetically permeable core legs 633 represented as circles (four columns of seven core legs are shown in FIG. 8 for a total of 28 core legs). The TS columns include dual switches 620 represented by squares, positive terminals 622 represented by stars, and negative or common terminals 621 represented by solid dots. Five of the TS columns are shown in FIG. 8, each containing six switches 620, three positive terminals 622, and four common terminals 621 for a total of 30 switches, 15 positive terminals, and 20 common terminals. As discussed above, preferred embodiments include electrically conductive plating that connects like terminals in each row together. The positive terminals 622 and negative terminals 621 may be considered output terminals, across which the load may be connected. The primary windings are also schematically represented in FIG. 8 by arrows, 641, 643 and 645, which illustrate the primary current in each of the primary windings during a polarity phase, A, of each winding. As shown the primary current flows from the A termination (641A, 643A, 645A) to the respective B termination (641B, 643B, 645B) in each winding.

Figure 9A:
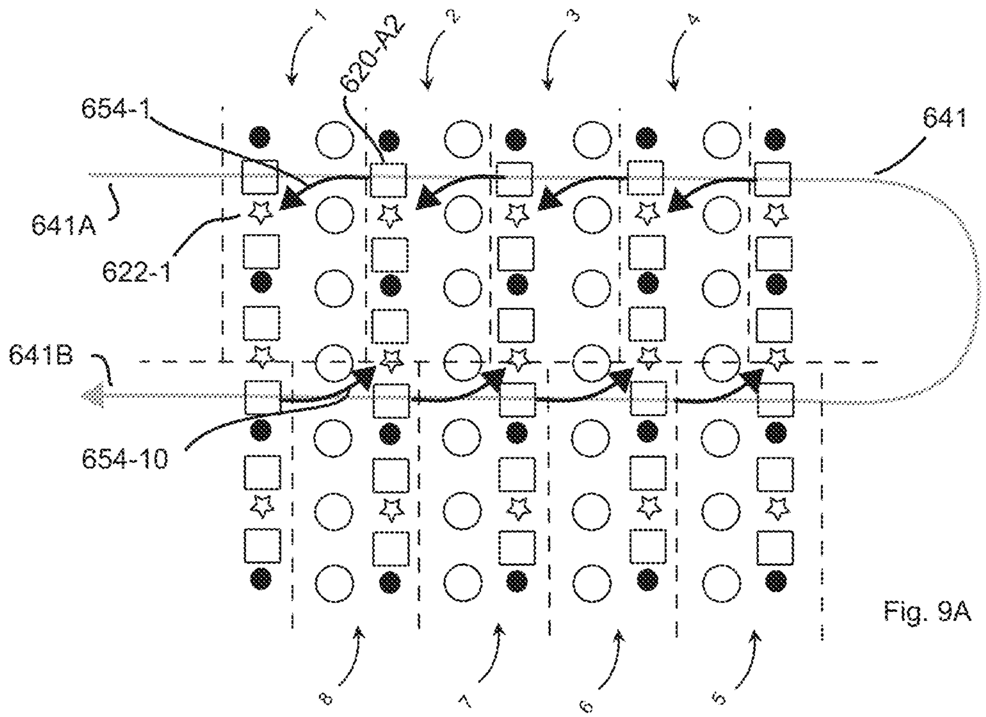
FIGS. 9A and 9B show top view schematic layouts of secondary windings for a first phase of a three-phase distributed output converter.
Figure 9B:
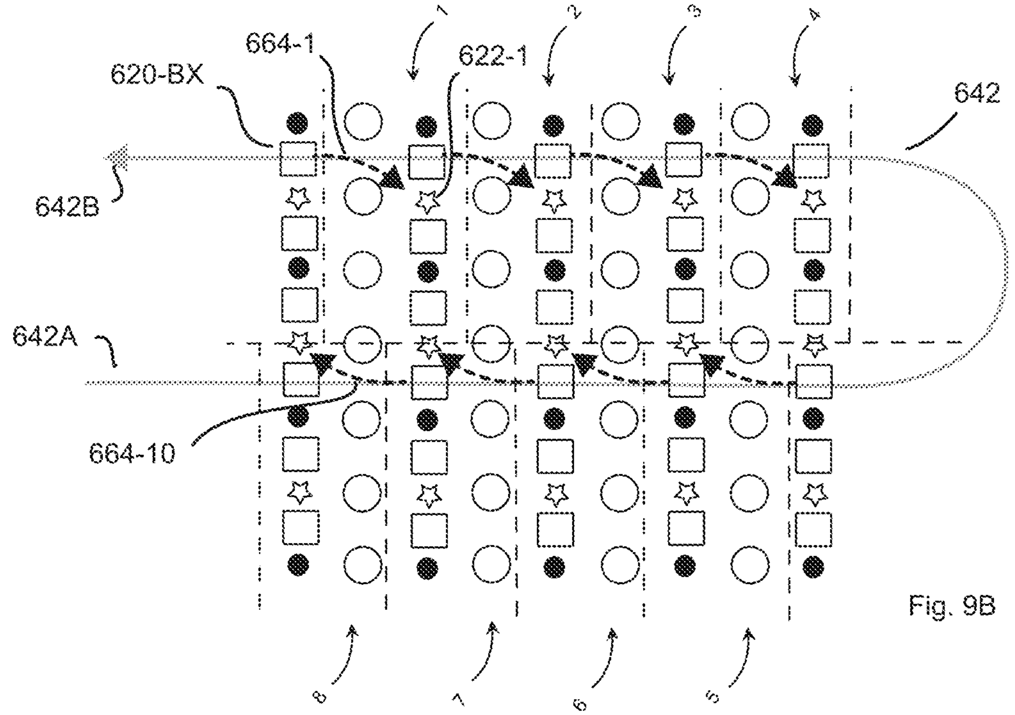
Figure 10A:
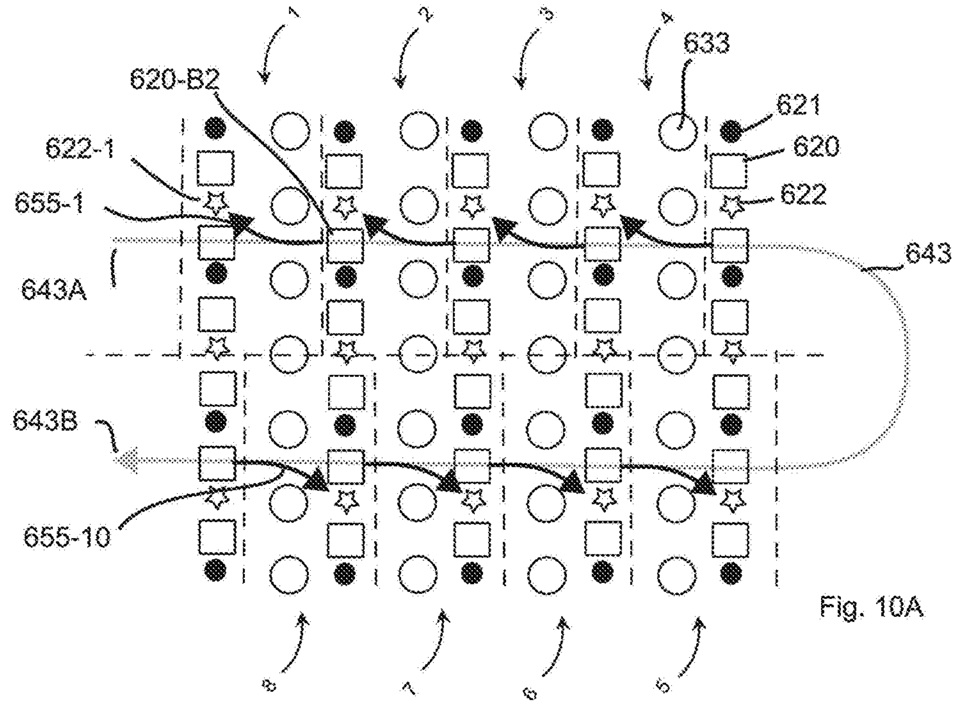
FIGS. 10A and 10B show top view schematic layouts of secondary windings for a second phase of a three-phase distributed output converter.
Figure 10B:
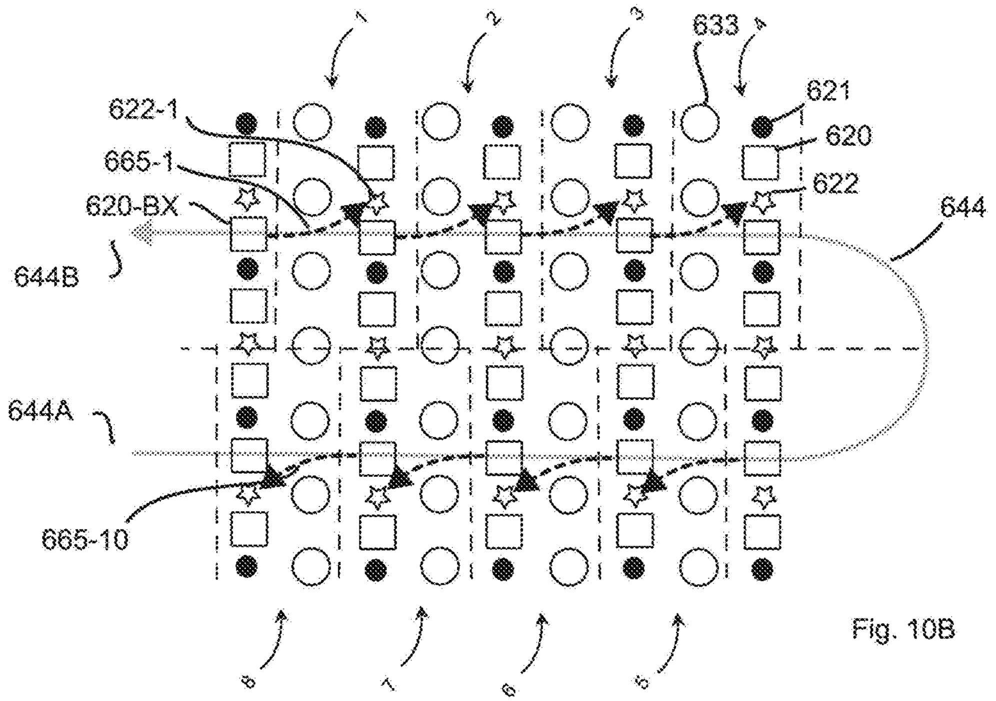
Figure 11A:
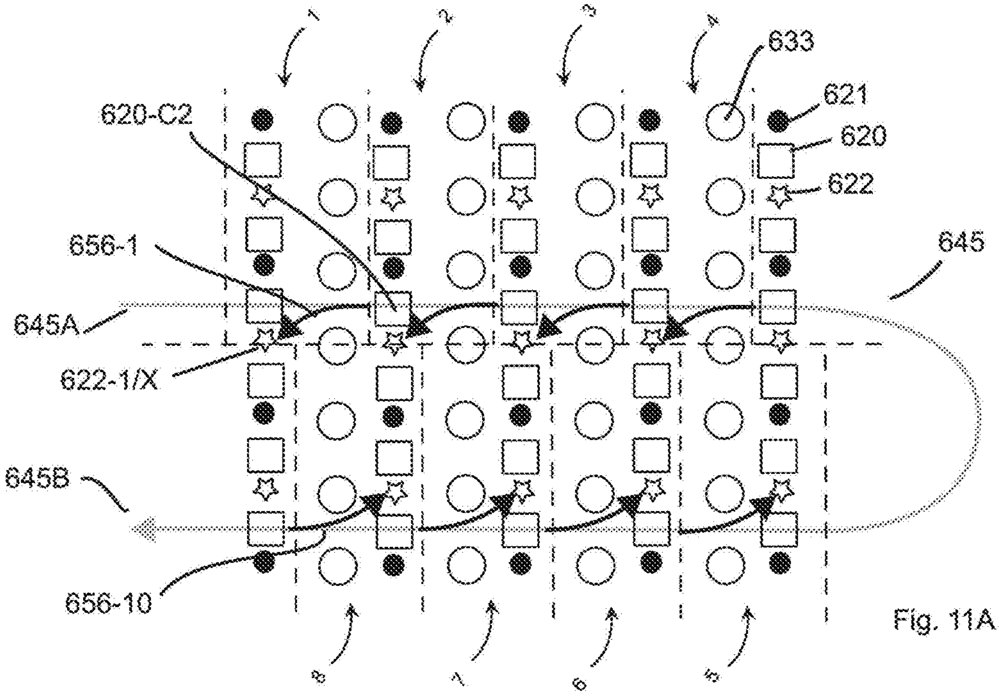
FIGS. 11A and 11B show top view schematic layouts of secondary windings for a third phase of a three-phase distributed output converter.
Figure 11B:
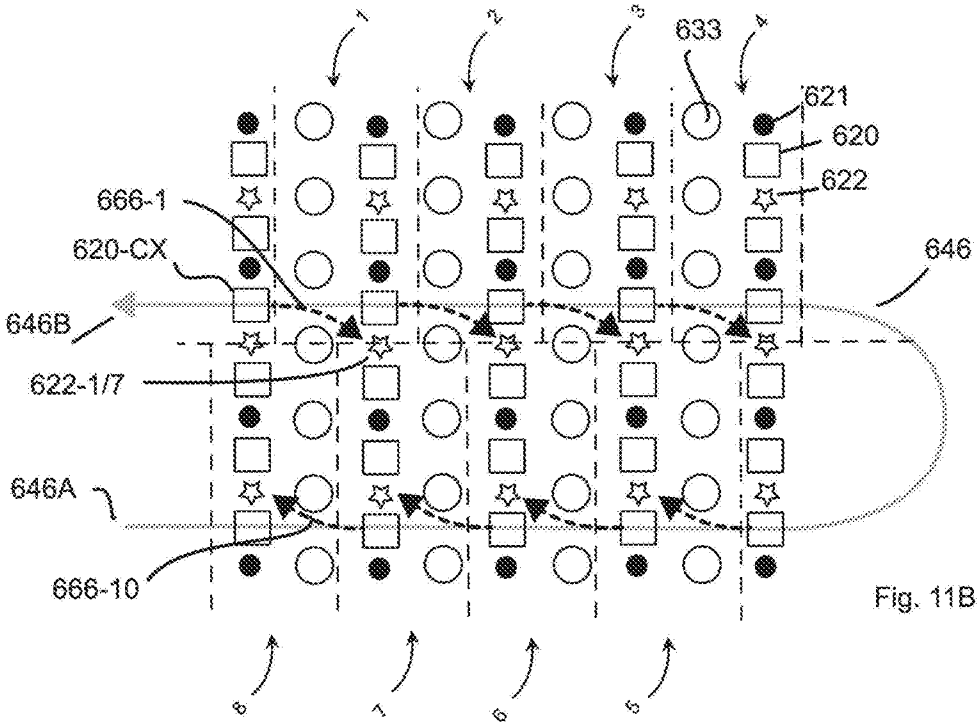

Like in the two-phase embodiment described above, the primary current in each of the three primary windings in the three-phase example reverses direction, i.e. polarity as shown in FIG. 7B every half cycle, and thus has a polarity A phase (illustrated in FIGS. 8, 9A, 10A, and 11A) and Polarity B phase (illustrated in FIGS. 9B, 10B, and 11B). Also like the two-phase example, the primary windings are preferably interleaved, i.e., arranged in an overlapping pattern, as shown in FIG. 8, to better distribute magnetic flux in the permeable core structure. The primary winding of each the three phases encloses three core legs in each column as shown in FIG. 8. In the three-phase embodiment, the current in each primary winding, e.g. 641, may be either 120 or 240 degrees out of phase with the current in each of the other two primary windings, e.g. 643, 645, as also illustrated in FIG. 7B.

In FIG. 8, dashed lines illustrate imaginary boundaries between each cell element in the distributed output structure for polarity A. In the three-phase converter as shown eight cells, numbered 1 to 4 along the top and 5 to 8 along the bottom, each include cell elements for primary A, primary B, and primary C as indicated to the left of the figure. Each cell element is shown including a dual switch 620, a negative output terminal 621, a small vertical loop in the magnetic core structure represented as an adjacent pair of core legs 633 (most of which may be shared by neighboring cells), and a positive output terminal 622, which may also be shared with a neighboring cell, e.g. as shown in the preferred interleaved embodiment, the vertically neighboring cell(s) may be associated with different primary winding(s). For example, the output cell elements for primary B are located between output cell elements for primary A above and output cell elements for primary C below.

The secondary windings (and the currents flowing in the secondary windings) of the three-phase structure are schematically represented by arrows, e.g. 654, 664, 655, 665, 656, and 666, in FIGS. 9A, 9B, 10A, 10B, 11A, and 11B. For example, FIG. 9A shows the secondary winding currents 654 for primary phase A, polarity A; FIG. 9B shows the secondary winding currents 664 for primary phase A, polarity B; FIG. 10A shows the secondary winding currents 655 for primary phase B, polarity A; FIG. 10B shows the secondary winding currents 665 for primary phase B, polarity B; FIG. 11A shows the secondary winding currents 656 for primary phase C, polarity A; and FIG. 11B shows the secondary winding currents 666 for primary phase C, polarity B. Although shown in separate drawings in FIGS. 9-11 to avoid confusion, all of polarity A secondary winding elements 654, 655, 656, may be combined in a single PCB layer and all of polarity B secondary winding elements 664, 665, 666 may be combined in another single PCB layer as described for the two-phase example above.

Referring to FIG. 9A, the currents 654, e.g. 654-1, induced in a first set of secondary winding elements during polarity phase A of the primary current 641 flowing in primary winding A are shown flowing from a respective switch 620, e.g. 620-A2, to a respective positive terminal 622, e.g. 622-1. FIG. 9B shows the currents 664, e.g. 664-1, induced in a second set of secondary winding elements during polarity phase B of the primary current 642 flowing in primary winding A carrying current in the opposite direction (broken lines) from a respective switch 620, e.g., 620-BX to a respective positive terminal 622, e.g. 622-1.

Referring to FIG. 10A, the currents 655, e.g. 655-1, induced in a third set of secondary winding elements during polarity phase A of the primary current 643 flowing in primary winding B are shown flowing from a respective switch 620, e.g. 620-B2, to a respective positive terminal 622, e.g. 622-1. FIG. 10B shows the currents 665, e.g. 665-1, induced in a fourth set of secondary winding elements during polarity phase B of the primary current 644 flowing in primary winding B carrying current in the opposite direction (broken lines) from a respective switch 620, e.g., 620-BX to a respective positive terminal 622, e.g. 622-1.

Referring to FIG. 11A, the currents 656, e.g. 656-1, induced in a fifth set of secondary winding elements during polarity phase A of the primary current 645 flowing in primary winding C are shown flowing from a respective switch 620, e.g. 620-C2, to a respective positive terminal 622, e.g. 622-1/X. FIG. 11B shows the currents 666, e.g. 666-1, induced in a sixth set of secondary winding elements during polarity phase B of the primary current 646 flowing in primary winding C carrying current in the opposite direction (broken lines) from a respective switch 620, e.g., 620-CX to a respective positive terminal 622, e.g. 622-1/7.

The cell structures for the interleaved multi-phase converters in the above description of the two and three phase examples preferably employ smart-dual-switching (SDS) devices, e.g. SDS-R or SDS-S, for the output switches 620. Advantages of using the self-controlled SDS-R or SDS-S devices in a distributed output structure, which are more fully described in the SDS Patent, includes elimination of external synchronous rectifier control signals. However, in the multi-phase structure, the benefits extend further to provide advantages in packaging, control, and scalability as described in greater detail below.

In this document, a "smart switching device" or an "SSW device" generically refers to smart switching circuitry constructed and arranged as a self-controlled, self-contained electronic switching device that does not require external synchronous rectifier control signals. The smart dual switching devices described in the SDS Patent are preferred examples of SSW devices packaged together in complimentary pairs.

In the example shown in FIGS. 2A and 2B, each of the smart dual switching ("SDS") devices includes SDS circuitry constructed and arranged as a self-contained electronic switching device, as described in more detail in the SDS Patent. For example, the SDS circuitry may include a first electronic switch having a first control terminal, a first switched terminal, and a first common terminal; a second electronic switch having a second control terminal, a second switched terminal, and a second common terminal; a first SDS control circuit, and a second SDS control circuit. The first SDS control circuit has an input connected to the first switched terminal, an input connected to the second switched terminal, and an output connected to the first control terminal. The first SDS control circuit is constructed and arranged to turn the first electronic switch: (i) OFF while the second electronic switch is ON; and (ii) ON for as long as the second electronic switch is OFF and a voltage across the first switched terminal and the common terminal satisfies predetermined magnitude and polarity thresholds. The second SDS control circuit has an input connected to the first switched terminal, an input connected to the second switched terminal, and an output connected to the second control terminal. The second SDS control circuit is constructed and arranged to turn the second electronic switch: (i) OFF while the first switch is ON, and (ii) ON for as long as the first switch is OFF and a voltage across the second switched terminal and the common terminal satisfies predetermined magnitude and polarity thresholds. The switch of each of the plurality of converter cell elements includes a respective electronic switch in a respective SDS device.

As described in more detail in the SDS Patent, the printed circuit board is free of control signals for controlling the electronic switches in the self-contained electronic switching devices. The control signals for controlling the electronic switches are contained within the self-contained electronic switching devices.

Primary Driver

Integrated drivers for the SAC topology are described in more detail in U.S. Pat. No. 10,158,357, issued on Dec. 18, 2018, U.S. Pat. No. 10,998,903, issued on May 4, 2021, U.S. Pat. No. 11,101,795, issued on Aug. 24, 2021, and U.S. patent application Ser. No. 17/390,285, filed on Jul. 30, 2021, issued as U.S. Pat. No. 11,876,502 on Jan. 16, 2024 (the "MCM Patent Family"), all of which are assigned to Vicor Corp. of Andover, MA, and herein incorporated by reference (See, e.g. FIGS. 5-9, 19). The two- and three-phase examples described herein differ in several respects from those in the MCM Patent Family. For example, control signals (See, e.g. 426, 429 in FIG. 9 of the MCM Patent Family) between the driver and the POL are preferably eliminated using SDS-R or SDS-S devices in the output circuitry; half-bridge drivers are used instead of the full-bridge drivers shown in the MCM Patent Family; and multiple half-bridge drivers, one for each of the multiple phases, are provided instead of a single phase. Additionally, drivers in the multi-phase examples are operated out of phase with each other, 90 degrees for the two-phase (FIG. 7A) and 120 degrees for the three-phase (FIG. 7B) embodiments. Optionally, one or more of the phases may be turned ON or OFF as desired to address different load conditions. These and other driver features are described in more detail below. The multi-phase primary driver circuitry will be described in more detail with reference to FIG. 2C for the two-phase converter and FIG. 12 for the three-phase converter. The secondary windings and the load are not shown in FIGS. 2C and 12; however, illustrative details of the secondary circuits including the secondary winding elements as described above are shown in FIGS. 2A, 2B, 5 and 6 for the two-phase embodiment and in FIGS. 9A, 9B, 10A, 10B, 11A, 11B, and 22 for the three-phase embodiment.

Figure 12:
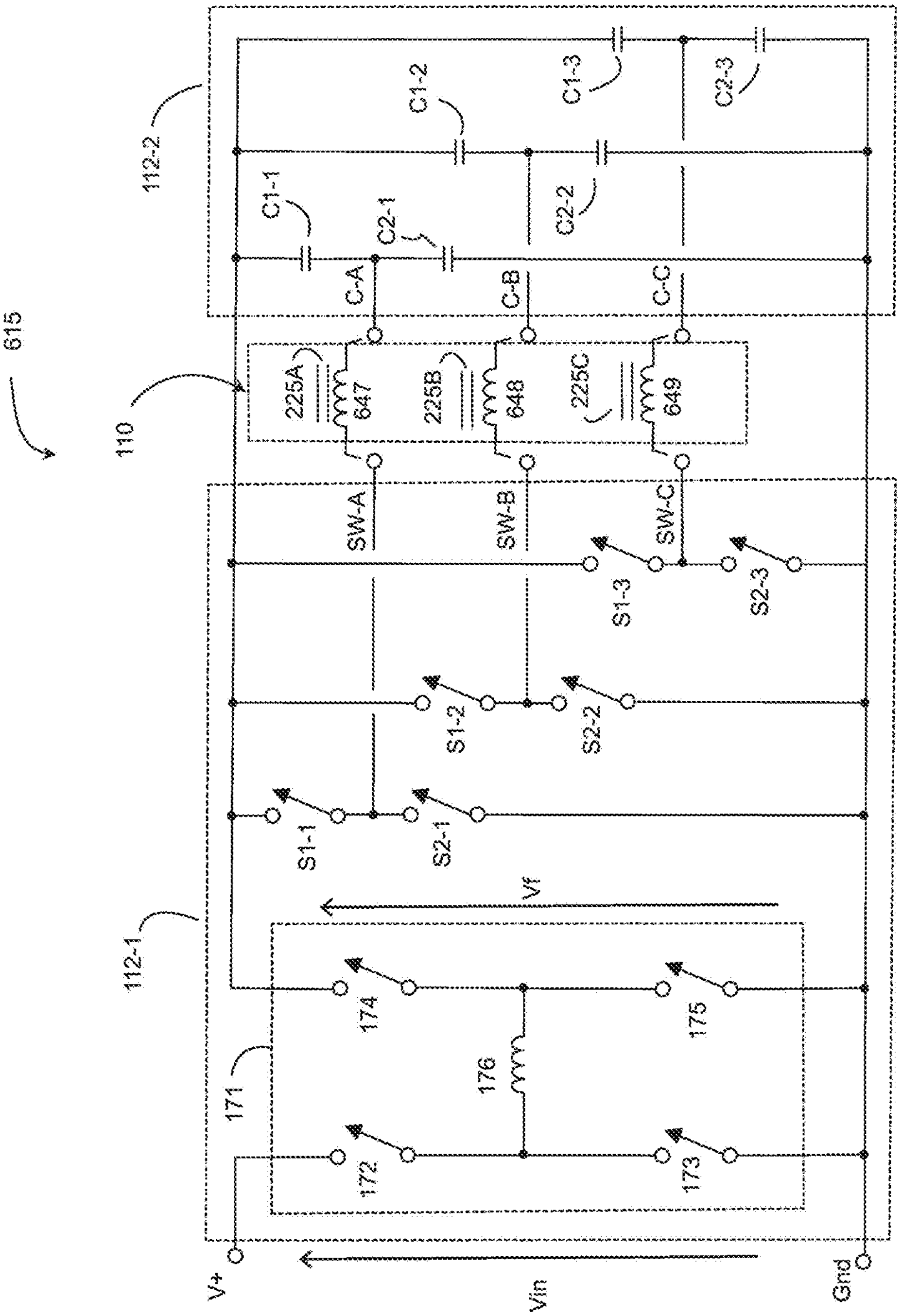
FIG. 12 shows a schematic diagram of a primary circuit for a three-phase distributed-output power converter, including the primary windings and a three-phase integrated driver.

As respectively shown in FIGS. 2C and 12, the two-phase primary driver 610 and three-phase primary driver 615 are similar. Each preferably includes as shown a regulator 171 to provide power to, and control the voltage used by, the half-bridge drivers which drive the primary windings, 647 and 648 (two-phase) and 647, 648 and 649 (three-phase). The regulator 171 is shown having a preferred ZVS buck-boost topology, which includes four switches 172, 173, 174, and 175 and a resonant inductor 176, however, any suitable regulator topology, such as a buck or boost topology, may be used. The regulator 171 receives an input voltage, Vin, via the input terminals and provides an output voltage, Vf, to the half-bridge drivers.

Each of the drivers 610 and 615 include a plurality of half-bridge drivers, one for each primary winding, which include two switches, a high-side switch S1 and a low-side switch S2, and two resonant capacitors, a high-side capacitor C1 and a low-side capacitor C2. High-side switch S1-1 and low-side switch S2-1 in the first half-bridge driver are connected to drive the first resonant circuit (primary phase A) including primary winding 647 and capacitors C1-1 and C2-1; and high-side switch S1-2 and low side-switch S2-2 in the second half-bridge driver are connected to drive the second resonant circuit (primary phase B) including primary winding 648 and resonant capacitors C1-2 and C2-2; in drivers 610 (two-phase) and 615 (three-phase). A third half-bridge driver including high side switch S1-3 and low side switch S2-3 is shown in FIG. 12 for the third resonant circuit (primary phase C) in the three-phase driver 615. In the two-phase version, the current in primary winding 647 may be either 90 or 270 degrees out of phase, i.e. in quadrature, with the current in primary winding 648 (as illustrated in FIG. 7A). In the three-phase version, the current in primary winding 647 is 120 degrees out of phase with each of the other windings, e.g. the current in primary winding 647 leads the current in primary winding 648 by 120 degrees and lags the primary winding current in 649 by 120 degrees. Switch control circuitry 207 can include, e.g., one or more logic gates, and one or more operational amplifiers, that are configured to control the ON and OFF of the switches S1-1, S2-1, S1-2, S2-2 in the manner described in this document.

Preferably, the primary switches S1 and S2 are implemented using vertical field effect transistors (VFETs) in complementary pairs to drive each primary winding. Preferred VFETs, e.g., super junction trench FETs and other vertical FETs, e.g., are described in U.S. patent application Ser. No. 18/212,639, filed on Jun. 21, 2023, the entire content of which is incorporated by reference. The half-bridge drivers are connected across the output of the regulator 171. The control circuitry, including switch controllers for operating the primary switches, may preferably be integrated with the primary switches on a single chip. Gate drive circuits of the type described in U.S. patent application Ser. No. 17/881,144, filed on Aug. 4, 2022 (the "ZVS NID" disclosure) (the entire content of which is incorporated by reference), may be deployed, preferably with integrated VFETs, in the driver circuitry, 610, 615, e.g. to scale the multi-phase drivers for greater power level applications.

As shown, the driver electronics 610, 615, may be integrated into a single package 112 including circuitry in 112-1 and 112-2 or separated into two packages, 112-1 and 112-2. Other packaging options may be used, e.g. the regulator 171 may be separate, or the capacitors (112-2) may be deployed as discrete components on a customer circuit board. The primary windings are part of the distributed output circuitry 110 (also referred to as the POL converter 110), which as shown in FIGS. 2C and 12, is packaged separately from the driver package 112.

Adaptive Phase Shedding ("APS")

In the preferred embodiments, the controller may be configured to selectively enable/disable one or more primary phases based upon the converter load to reduce no-load and light load power dissipation. The controller may monitor the load current using a scaled representation of the input voltage, Vin, e.g. K x Vin, and a representation of the output voltage, Vout, e.g. as described in Vinciarelli, Adaptive Control of Resonant Converters, U.S. Pat. No. 11,018,594 issued May 25, 2021, assigned to Vicor corporation of Andover, MA, the entirety of which is incorporated herein by reference (the "I-Mon Patent"). The controller may compare the scaled input voltage and output voltage, preferably subject to an offset voltage ("Voff") representative of the voltage drop across the effective converter output resistance, Rout, at the operating point(s) at which one or more phase(s) are to be enabled or disabled. In other words, fractional load current set points, e.g. one half of the full load current in a two phase system or one third and two thirds of full load current in a three-phase system, may be used to calculate the offset voltages for use by the controller to selectively enable or disable the respective phases. Since Rout is dependent on the number of operational phases, Voff, may be adjusted depending on the system configuration and its operational state, e.g. the number of active phases. One approach is to lump all adaptive control parameters, including comparator hysteresis, into the offset voltage, Voff, which may be configured for each application with external circuitry.

The controller preferably turns the primary switches for the selected phase OFF immediately following the end of one of the half cycles to disable the selected phase. For the disabled phase, the controller preferably holds the respective primary switches in their OFF states while disabled and then to re-enable the selected phase, the controller preferably re-enables the primary switches for the selected phase immediately prior to the beginning of one of its half cycles. The secondary switches using SDS-R control protocol (i.e. operating as rectifiers) continue to operate as needed (on demand) as the phase is enabled or disabled preserving zero voltage switching (ZVS) and zero current switching (ZCS). Preferably, the controller waits until the load current has fallen below a predetermined set-point, and remains below the set-point for a predetermined time, or for a predetermined number of operating cycles, before disabling one or more phases, avoiding high frequency loss of ZVS energy. Conversely, the controller preferably re-enables the respective phases within one half cycle of the output voltage falling below a minimum level, thus reducing output resistance and enhancing transient response to a load step-up.

Figure 13:
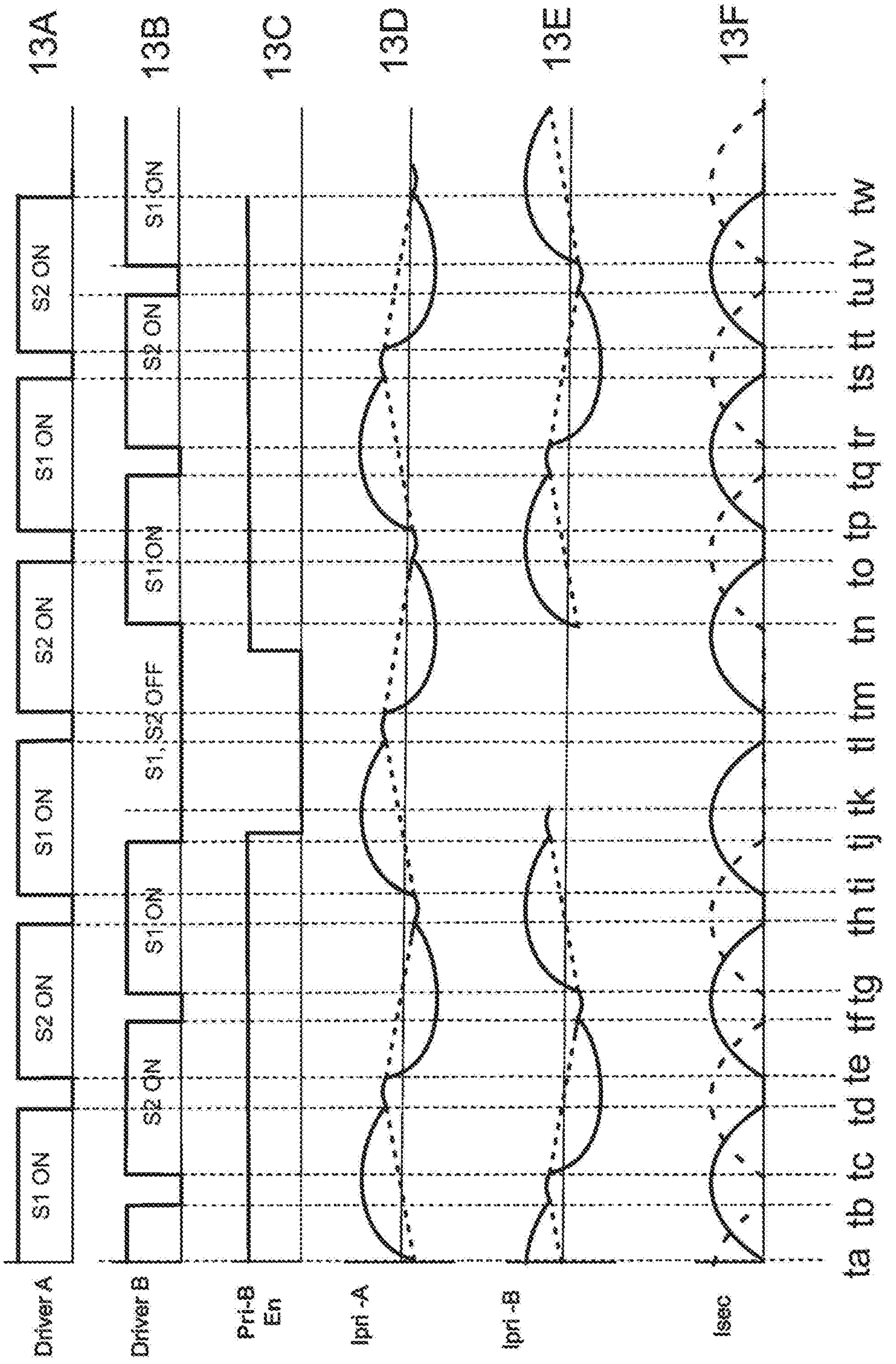
FIG. 13 shows timing waveforms for a two-phase distributed-output power converter during adaptive phase shedding.

FIG. 13 shows timing waveforms illustrating operation of the two-phase driver 615: waveforms 13A and 13B respectively show the switch states in the first and second half-bridge drivers for primary winding A (647, FIG. 2C) and primary winding B (648, FIG. 2C); 13C shows an enable/disable signal illustrating APS operation for primary B; 13D and 13E respectively show the current flowing in primary windings A (647) and B (648); waveform 13F shows the current produced by the output circuits. As shown in waveforms 13A and 13B, the controller preferably operates the switches in driver A (S1-1, S2-1) out of phase with switches in driver B (S1-2, S2-2) by ninety (90) degrees. Primary A is shown lagging primary B by 90 degrees. As shown in waveforms 13D and 13E, the converter operating cycles in each primary circuit when enabled are essentially the same except for the phase shift. For example, a converter operating cycle in primary A is shown beginning at time ta and ending at time ti and repeating from time ti to time tp, etc. A converter operating cycle in primary B is shown beginning at time tn and ending at time tv and repeating.

More specifically, at time ta, a switch controller (not shown) turns switch S1-1 (high-side switch S1 of driver A) ON (waveform 13A) starting a power transfer interval ("PTI") for polarity phase A ("PTI-A") in primary winding A (647, FIG. 2C). As shown in waveform 13D, the current in primary winding A undergoes a positive resonant half cycle (PolarityA) during PTI-A, i.e., beginning at time ta and ending at time td. (The dashed lines in waveforms 13D and 13E illustrate the magnetizing current flowing in each respective primary winding.) As shown, the magnetizing current increases linearly in a positive direction during PTI-A. PTI-A in primary A concludes at time td and the switch controller turns switch S1-1 OFF (waveform 13A), starting an energy recycling interval ("ERI") in primary A. During the ERI (time td to time the) both switches in driver A (S1-1 and S1-2, FIG. 2C) are OFF, allowing the magnetizing current flowing in primary A (winding 647, FIG. 2C) to charge and discharge the capacitances at switching node, SW-A (FIG. 2C) in preparation for zero voltage switching ("ZVS") during the next PTI. As shown in waveform 13A at time the, the controller turns switch S2-1 (low-side switch S2 of driver A) ON starting PTI-B starting a PTI for polarity phase B ("PTI-B") in primary A winding 647 (waveform 13D) which will continue until time th. As shown in waveform 13D, the magnetizing current increases linearly in a negative direction during PTI-B. At time th, the controller turns switch S2-1 OFF (waveform 13A), starting another ERI in primary A. During the ERI (time th to time ti) both switches in driver A (S1-1 and S1-2 FIG. 2C) are OFF, allowing the magnetizing current flowing in primary A (winding 647, FIG. 2C) to charge and discharge the capacitances at switching node, SW-A (FIG. 2C) in preparation for ZVS the next PTI. At time ti, the controller turns switch S1-1 ON again beginning another converter operating cycle and repeating the above sequence.

The converter operating cycles for primary B follow the same sequence but out of phase with primary A. As shown in waveform 13E, the positive resonant half cycle of current flowing in primary B (winding 648, FIG. 2C), i.e. PTI-A in primary B, ends at time tb, at which time the controller turns switch S1-2 (high-side switch S1 of driver B) OFF (waveform 13B) starting an ERI in primary B (time tb to time tc). During the ERI both switches in driver B (S2-1 and S2-2, FIG. 2C) are held OFF, allowing the magnetizing current flowing in primary B (winding 648, FIG. 2C) to charge and discharge the capacitances at switching node, SW-B (FIG. 2C) in preparation for the next PTI. As shown in waveform 13B at time tc, the controller turns switch S2-2 (low-side switch S2 of driver B) ON starting a PTI-B in primary B winding 648 (waveform 13E) which will continue until time tf when switch S2-2 is turned OFF (waveform 13B) once again by the controller.

Referring to waveform 13F, the current produced by the output circuitry (FIGS. 2A and 2B) will be the combination of the solid (primary A) and dashed (primary B) lines shown. In other words, the multiphase distributed output circuit combines the currents induced by both primaries during both polarity phases reducing the amplitude of ripple significantly in the two-phase embodiment and virtually eliminating it in the three-phase embodiment, and also increasing the frequency of the ripple, which facilitates reduction or elimination of filter components, such as output capacitors, further increasing the power and current density.

The APS protocol is illustrated in waveforms 13C, 13E, and 13F. Primary phase B is shown enabled and operating from time ta through time tj, disabled and dormant from time tj through tn, and re-enabled and operating from time tn. As shown, Primary B is enabled to operate when the Pri-B Enable signal (13C) is high and disabled when low. In FIG. 13C, the enable signal goes low after time tj (for example indicating a low-load condition), in response to which the primary switches in driver B (S1-2 and S2-2) are held OFF. The enable signal goes high once again before time tn (for example indicating an increase in load). But the controller preferably waits until the next resonant half cycle is scheduled to begin at time tn to operate the primary switches in driver B (S1-2 and S2-2) once again. As shown at time tn (waveform 13B), switch S1-2 is turned ON starting another PTI in primary B. Note that the converter may re-start the operating cycles in the disabled phase (or phases in the case of a three-phase system) within one half-cycle, i.e., with either PTI-A or PTI-B, to reduce latency of processing power in primary B from the enable signal.

Pre-Charge

As described in the SAC patents, the node between the resonant capacitors (nodes C-A, C-B in FIG. 2C; nodes C-A, C-B, C-C in FIG. 12) settles at ½ of the input voltage during normal operation. In the APS protocol described above, the primary switches for the disabled phase may be turned OFF at the end of the resonant half-cycle which leaves the resonant capacitor node at Vin/2. However, the APS controller may use the following pre-charge technique to allow faster response to increased load current demands. In the pre-charge approach, the resonant capacitors of the deactivated phase(s) may be charged to one of the input rails, Vin or Gnd, by leaving the respective primary switch ON past the completion of the resonant ½ cycle when the phase is to be deactivated or shed. For example, leaving the high-side switch ON (S1-2, FIG. 2C) will pull the resonant capacitor node (C-B, FIG. 2C) up to VIN or leaving the low side switch ON (S2-2 FIG. 2C) will pull the resonant capacitor node (C-B, FIG. 2C) to Gnd. In either case, the resonant capacitors are driven to one of the rails, setting up favorable conditions for a fast response to increased load demands. The resonant current during the first cycle of the re-activated phase will be higher than typical because the opposite node is at one of the rails. Thus, the pre-charge protocol provides faster than typical current ramp, which in a normal converter would typically be 2-3 converter operating cycles, allowing the converter to meet the higher load current demand prompting reactivation of the respective phase.

Although the above timing waveforms were described in connection with the two-phase embodiment, the three-phase embodiment operates in the same manner but with different phase relationships, e.g. 120 degrees between phases. In the three phase embodiments it is preferable to use the APS and/or Pre-Charge protocols for two of the phases, e.g. primary B and primary C. The preferred embodiments leave at least one phase operational to improve response to load changes.

Shedding, or turning off, one or more phases, reduces light load power dissipation, e.g. the $I^2R$ winding losses due to magnetizing current and core losses are reduced or eliminated in the deactivated phase or phases. Re-enabling the deactivated phase in a two-phase converter reduces the output resistance of the converter by a factor of two within one half cycle enabling the converter to respond to a step increase in load within 100 nS in a 5 MHz converter. The energy stored in capacitance at the higher voltage input of the converter supplies the increase with a reduced output resistance greatly improving the response.

Magnetic Molded Package

As described above, the transformer core structure 225 of the preferred multi-phase converter embodiments may have five legs per cell (in the two-primary phase (2 phase) implementations) and seven legs per cell (in the three-primary phase (3 phase) implementations). The magnetic structures of the multi-phase converters described herein may be realized using the techniques described in the MCM Patent, in Vinciarelli, Method and Apparatus for Delivering Power to Semiconductors, U.S. Pat. No. 10,128,764, issued Nov. 13, 2018, U.S. Pat. No. 10,454,380, issued Oct. 22, 2019, U.S. Pat. No. 10,938,311, issued Mar. 2, 2021, U.S. Pat. No. 10,651,744, issued May 12, 2020, and U.S. Pat. No. 11,264,911, issued Mar. 1, 2022 (the "Powder Core" patents); and in Vinciarelli, Planar Inductive Apparatus and Method, U.S. patent application Ser. No. 16/878,280, filed on May 19, 2020 (the "Powder Core" application) and U.S. patent application Ser. No. 16/878,263, filed on May 19, 2020 (the "Pasted Leg" application); all of which are assigned to Vicor Corp. of Andover, MA and herein incorporated by reference. However, the more complex core structures present additional challenges which may be better met with a magnetically molded package as described below.

An improved magnetically molded package ("MMP") and process may be advantageously used to simplify fabrication of the more complex multiphase converters while achieving further improvements in size and density. In the magnetic molded package, a magnetically-permeable encapsulation compound covers the entire multilayer printed circuit board, which could be problematic for high-frequency control signals. For example, the control lines would have increased inductance and cross-coupling with the power train through the magnetically-permeable encapsulation compound. Thus, high-frequency control signals should generally be eliminated from the converter in a magnetic molded package.

Using SDS-S or SDS-R switching devices as described above in the distributed output structure in place of controlled rectifiers and removing the primary side control and driving circuitry to a separate package, substantially eliminates control signals from the POL portion of the multi-phase converter, eliminating the high frequency control signals and thus enabling use of magnetically permeable material as an encapsulant. An integral magnetically permeable core structure formed as a result of the encapsulation process may improve converter power density and simplify the manufacturing process, e.g. by eliminating individual core components.

In the preferred embodiment, the magnetically-permeable encapsulation compound covers the entire multilayer printed circuit board including components and fills the leg holes formed in the PCB (coupling the primary and secondary windings) creating core legs. In other words, the components and PCB surfaces are encapsulated creating unified core plates in a unified magnetically permeable core structure. The MMP enables use of finer features and closer spacing of the core legs and SDS rectifying components by avoiding the tolerance and spacing requirements of discrete magnetic components, including e.g., core gapping tolerances and PCB and pick and place assembly clearances, substantially improving MCM current density. The absence of pre-formed core pieces allows for scaling of the cell size according to the volt-second requirements of the current multiplier, e.g. lower K factors (K=1/80 vs. K=1/40), allowing for higher cell pitch and higher current density.

The magnetically molded package and the smart switching devices together facilitate smaller cell sizes while improving key figures of merit including Specific Output Resistance and MCM current density. In addition to the multi-phase and adaptive phase shedding converters described herein, the MMP and SDS combination may provide improvements for previous converters such as the DO1 and DO2 converters described in the D-O Patent and the SDS Patent, respectively.

MMP Process

A preferred process for making the magnetic molded package will be described with reference to FIGS. 14-20. The preferred MMP process 700 may be based upon the panel molding process and methods of forming the surface mount leads and trench connections described in the Leadless Patent and in the Trench Patent. (The following description assumes a basic familiarity with the panel molding process and conductive termination processes described in the Leadless and Trench Patents.)

The examples shown in FIGS. 14-19 are based upon the two-phase distributed output converter 600-2 of FIGS. 2-6 described above. Like the two-phase example of FIGS. 2-6, each individual converter module 600-2 in the example of FIGS. 14-19 has fifty (50) leg holes 632 in the PCB 601 arranged in five rows and ten columns. The MMP process is broadly depicted in FIGS. 14 and 15, which respectively show a populated PCB panel 674 and board 601 before and after encapsulation.

Figure 14A:
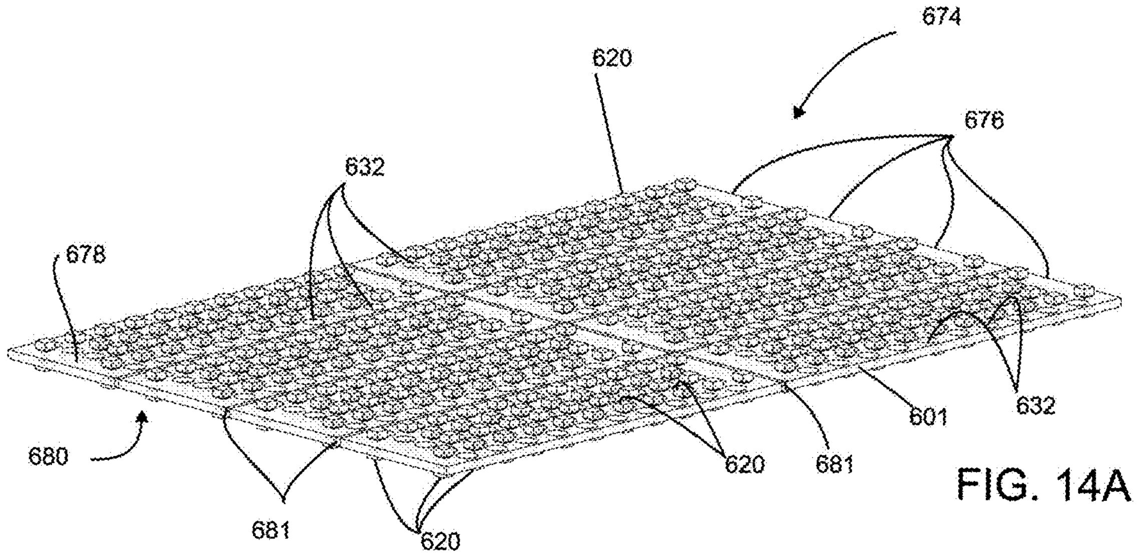
FIGS. 14A and 14B show a populated PCB panel before and after encapsulation.

FIG. 14A shows an example of a populated PCB panel 674 before encapsulation. The populated PCB panel 674 preferably comprises a multiplicity, e.g., eight, un-singulated converter modules 676 as shown. (Reference may be had to FIG. 15, which shows one singulated module 676 in a larger scale, in the following description with the understanding that the preferred process encapsulates panels having a plurality of modules 676.) This is merely an example, the PCB panel 674 may include a different number of un-singulated converter modules 676.

As shown in FIGS. 14 and 15, the populated panel 674 includes a multi-layer PCB 601 in which leg holes 632 are formed at the respective core leg locations and on which the internal components are mounted. In the example shown, only the smart dual switches 620 (preferably the above-described SDS-R (FIG. 20 of the SDS Patent) or SDS-S (FIG. 22 of the SDS Patent) are mounted to the PCB 601. Capacitors have been eliminated completely from the panel in the example shown. However, it should be noted that other embodiments may include additional components, e.g. capacitors and/or magnetically-permeable, e.g., ferrite, core pieces, e.g., bars, (described below) mounted to the PCB

601. Prior to encapsulation, each un-singulated converter module 676 of the plurality in the panel preferably includes all of the required internal components. As described below, additional components, e.g. magnetically-permeable, e.g., ferrite, core pieces, e.g., bars, may be added to the PCB to improve the properties of the magnetic core structure and to function as standoffs to facilitate or improve the MMP process 700. The terms magnetically-permeable or ferrite core pieces, standoffs, bars, etc. are used herein interchangeably since these structures may form part of and function as the magnetic core structure and may form part of the magnetically molded package and function as standoffs during the molding process.

As described above, the PCB 601 in the panel/each converter module may include a multilayer stack-up having a set of, preferably internal, conductive layers in which one or more turns of the two or more primary windings are formed on one or more central conductive layers, a set of first polarity secondary winding elements for each of the primary phases are formed on one or more layers, and a set of second polarity secondary winding elements for each of the primary phases are formed on one or more layers. The leg apertures 632 preferably extend completely through the PCB 601 at locations corresponding to the positions of the magnetic core legs. Preferably, the leg holes 632 and corresponding conductive turns (e.g. winding elements 651, 652, 661, 662 in FIGS. 5, 6) are formed as described in Vinciarelli, Self-Aligned Planar Magnetic Structure and Method, U.S. Pat. No. 10,468,181, issued Nov. 5, 2019, assigned to Vicor Corp. (the "Self-Aligned" Patent) and incorporated herein by reference.

The printed circuit board 601 may additionally include external conductive layers, such as on the top and bottom faces, i.e. top and bottom conductive layers, to which components, such as the dual electronic switches (620, FIGS. 2, 3, 5, 6) may be mounted. Because the two-phase converter produces an output with a sufficiently small ripple, output capacitors may be eliminated as shown. To improve legibility, FIGS. 14 and 15 show the PCB and leg holes 632 without details of the conductive layers.

MMP Panel Molding Process

Figure 14B:
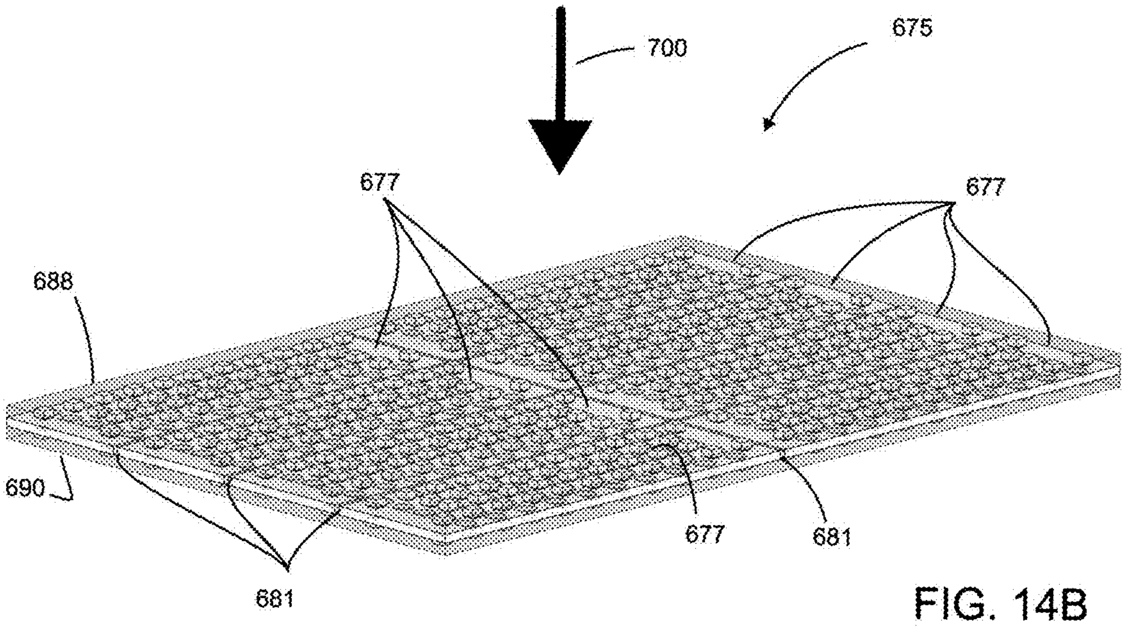
Figure 19B:
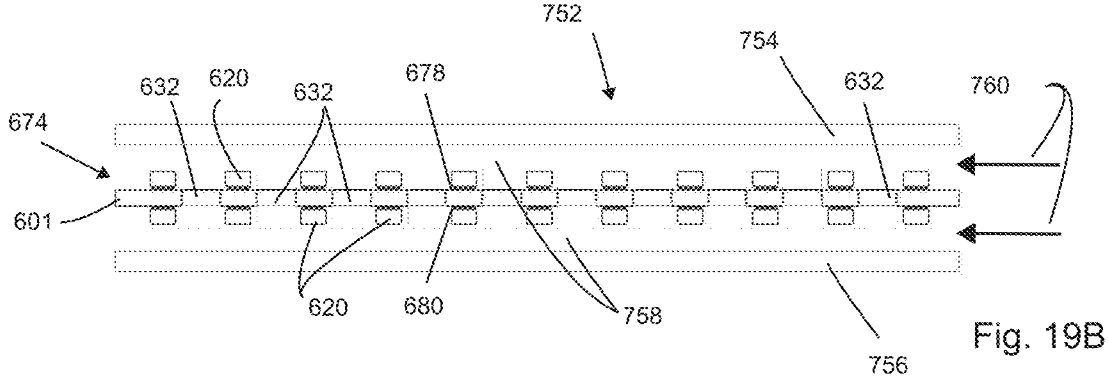
FIGS. 19B and 19C show cross-sections of the populated PCB of FIG. 19A (with ferrite standoffs in FIG. 19C and without in 19B) enclosed in a mold during the MMP Panel Mold Process.
Figure 19C:
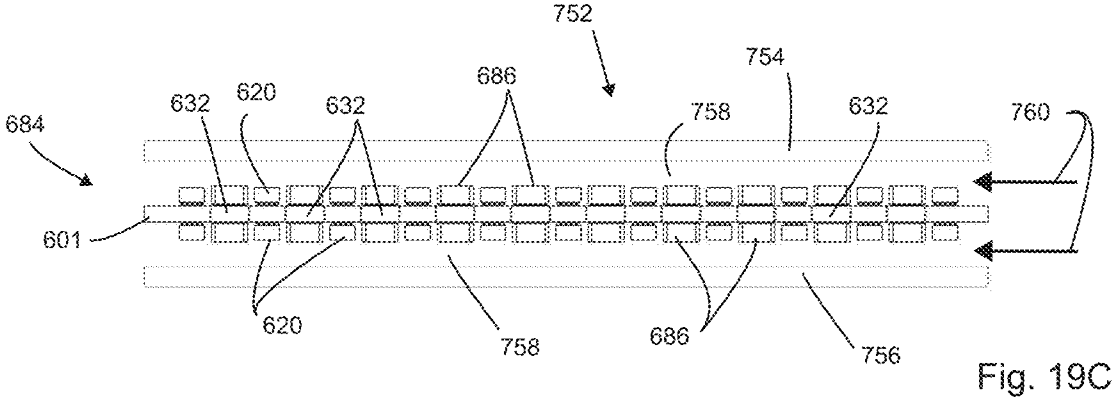
Figure 20:
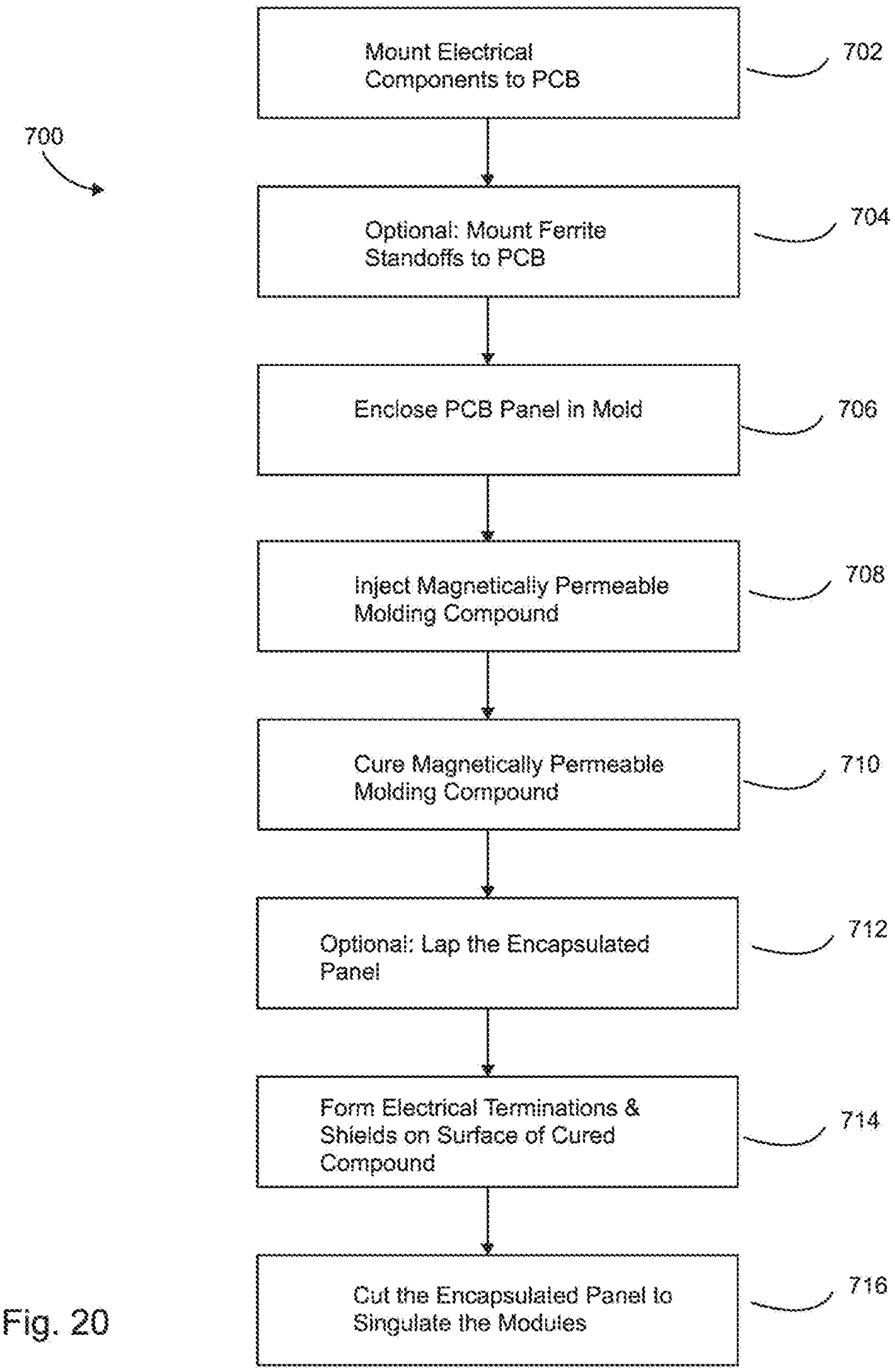
FIG. 20 shows a method for manufacturing a magnetically molded package.

The following description provides more detail about the panel molding process that may be used to fabricate the MMPs, referred to as the "MMP Panel Mold Process." FIG. 20 shows an outline of a process flow 700 for manufacturing the MMP modules as panels, which allows a multiplicity of individual modules (e.g. MMP modules 677 in FIG. 15B) to be made in parallel. Reference may also be had to FIGS. 14A and 14B which show the populated panel 674 before and after encapsulation, FIGS. 15A and 15B which show an individual module 676 before and after encapsulation, FIGS. 16A and 16B which show a modified panel including ferrite bars, before and after encapsulation, FIGS. 17A and 17B which show cross-sections of the modules with ferrite standoffs, FIGS. 18A and 18B which show a finished MMP two-phase distributed-output converter 670 example, and FIG. 19B-19C which shows cross-sections of the panel 674 and panel 684 in the mold cavity.

Beginning with step 702 (FIG. 20) which may include assembling the electrical components to a PCB 601, forming a populated PCB panel 674. The populated PCB 674 preferably includes all of the internal electrical components for each of the plurality of individual converters 676 mounted to the PCB 601 before encapsulation. Typical PCB assembly processes may include applying solder paste to the appropriate PCB pads, mounting the components, e.g. 620, to the PCB 601, and then performing solder reflow. This process may be repeated for both sides of the PCB.

Figure 19A:
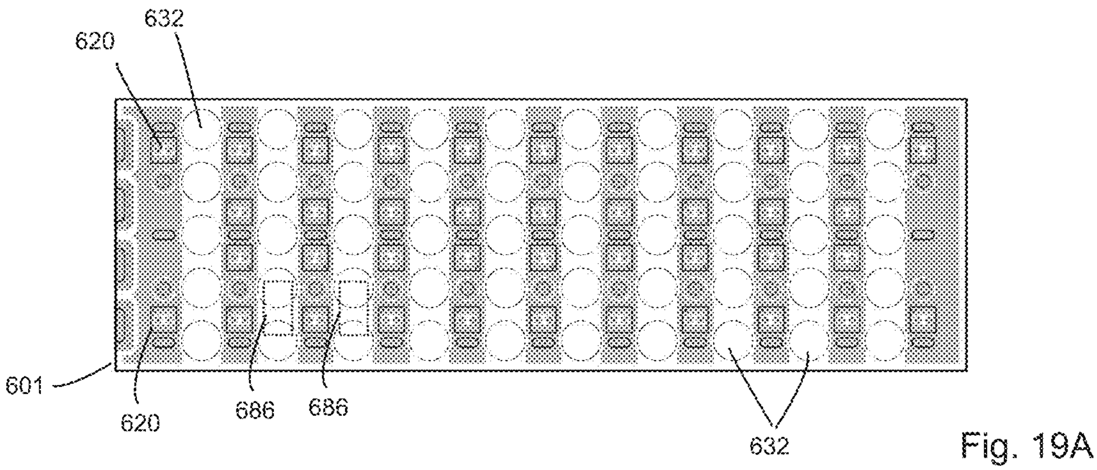
FIG. 19A shows a top view of a populated PCB.

Skipping step 704, which is optional, concerns ferrite standoffs, and is discussed below, in step 706 (FIG. 20), the populated PCB panel 674 may be inserted into a mold cavity which encloses the panel 674. FIGS. 19B and 19C show an example of a mold 752 having an upper mold 754 and a lower mold 756 that define a mold cavity 758 therebetween. As shown in FIG. 19B, the mold 752 may be configured to provide a predetermined clearance between the electronic components, e.g., switches 620, mounted to the top surface 678 and bottom surface 680 of the PCB 601 and the upper and lower inner walls of the upper mold 754 and lower mold 756, respectively, when the PCB panel 674 is positioned in the mold cavity 758. The predetermined clearance may be configured for the highest profile components to be in contact with the inner surfaces of the mold, e.g. components 620 on the top surface 678 of the PCB 601 in contact with the upper mold 754 or components 620 on the bottom surface 680 of the PCB 601 in contact with the lower mold 756 or both. Alternatively a pre-determined space may be provided between the highest profile components and the inner surfaces of the mold on one or both sides of the panel 674.

In step 708 (FIG. 20), the curable magnetically-permeable molding compound 760 may be injected into the mold cavity 758 to encapsulate the PCB panel 674 (including the internal components) and fill the leg holes 632 in the PCB 601 to form the core legs and core plates. Following injection, the entire mold cavity 758 will be filled with the curable magnetically-permeable encapsulation compound 760. For example, the magnetically-permeable encapsulation compound can include ferrite mold compound. In general, the magnetically-permeable encapsulation compound has a relative magnetic permeability of at least 10.

In step 710 (FIG. 20) the magnetically permeable molding compound 760 may be cured to produce a solid panel after which the encapsulated panel 675 may be removed from the mold. As shown in step 712 (FIG. 20), the panel optionally may be lapped, e.g. to reduce the thickness of the encapsulated panel 675 and individual modules.

Figure 18A:
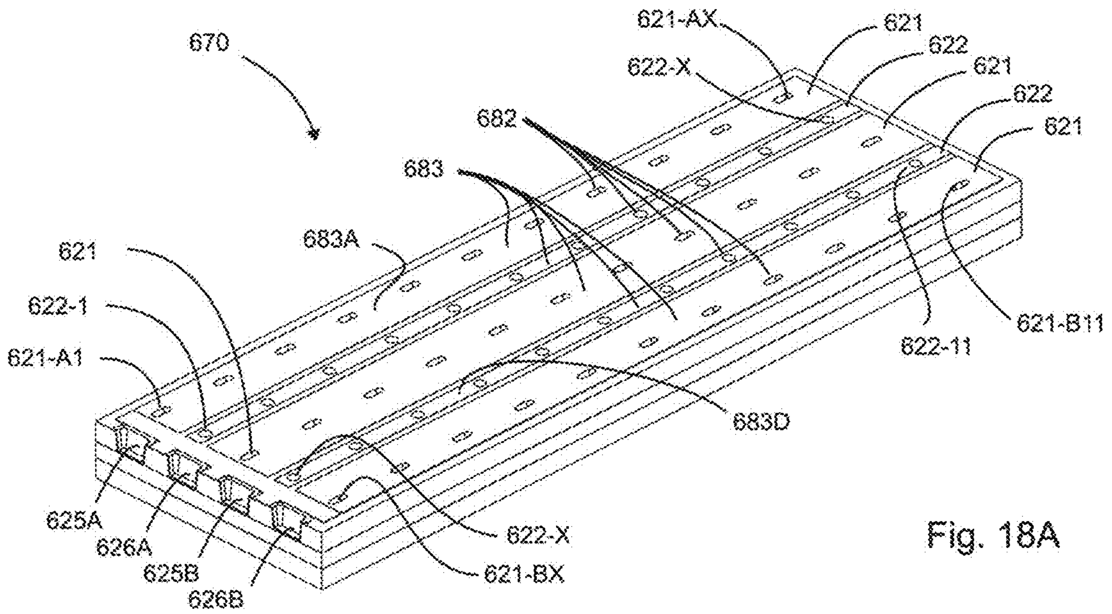
FIGS. 18A and 18B show a completed MMP converter module.
Figure 18B:
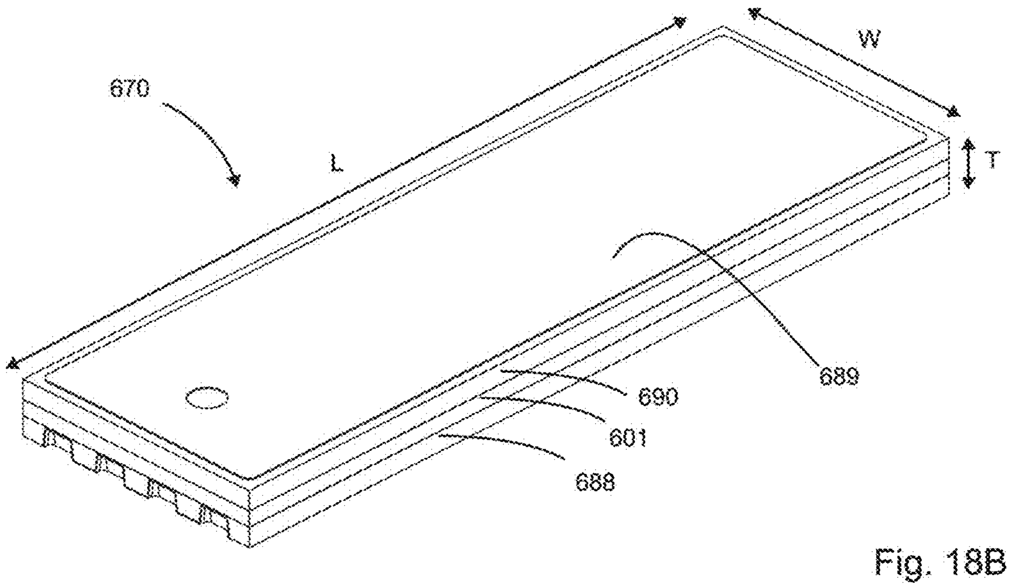

In step 714 (FIG. 20), the encapsulated panel 675 may be processed to form electrical terminations and shields at predetermined locations on the surfaces of the cured encapsulant as described in the GB Patent, the Leadless Patent and the Trench Patent. Examples of the electrical terminations are shown in the top view of FIG. 18A (top view) and a shield is shown in FIG. 18B (bottom view) of a finished MMP converter module 670 comprising the multiphase converter structure shown in FIGS. 2-6. As shown in FIG. 18A, the MMP converter module 670 may include power input terminations, 625A, 626A, 625B, 626B, and power output terminations 621, 622. The outlines of trench connections 682 (formed as described in the Trench Patent) are shown in FIG. 18A which correspond to the connections shown in FIG. 3 and are labeled accordingly. As shown, the trench terminals 682 in each row may be connected together by relatively large conductive strips 683 on the surface of the finished module 670 (described in the GB Patent and the SDS Patent). For example, conductive strip 683A connects trench terminals 621-A1 through 621-AX in the top most (first) row together to form a negative or common output terminal strip 621 and conductive strip 683D connects trench terminals 622-X through 621-11 in the fourth row (from the top) together to form a positive output terminal strip 622. A conductive layer 689 which may provide EMI shielding and/or enhance thermal performance is shown in FIG. 18B formed on the bottom of the finished MMP converter module 670.

As described in step 716, the encapsulated panel 675, may be cut to separate the individual modules 677 from the panel 675, i.e., to singulate the modules. Dashed lines 681 in FIG. 14 show the cut lines used to singulate the modules 676 from the panel 677. Cutting the panel 675 to singulate the individual converter modules 677 provides an important function of removing or eliminating magnetic permeable paths between the resulting core plates (i.e. the top 688 and bottom 690 cured encapsulation layers) at the circumference of the PCB 601. In other words, singulation eliminates magnetically permeable material between the core plates (i.e. the top 688 and bottom 690 cured encapsulation layers) that is not through a leg aperture 632, i.e. not a core leg 633.

Figure 15A:
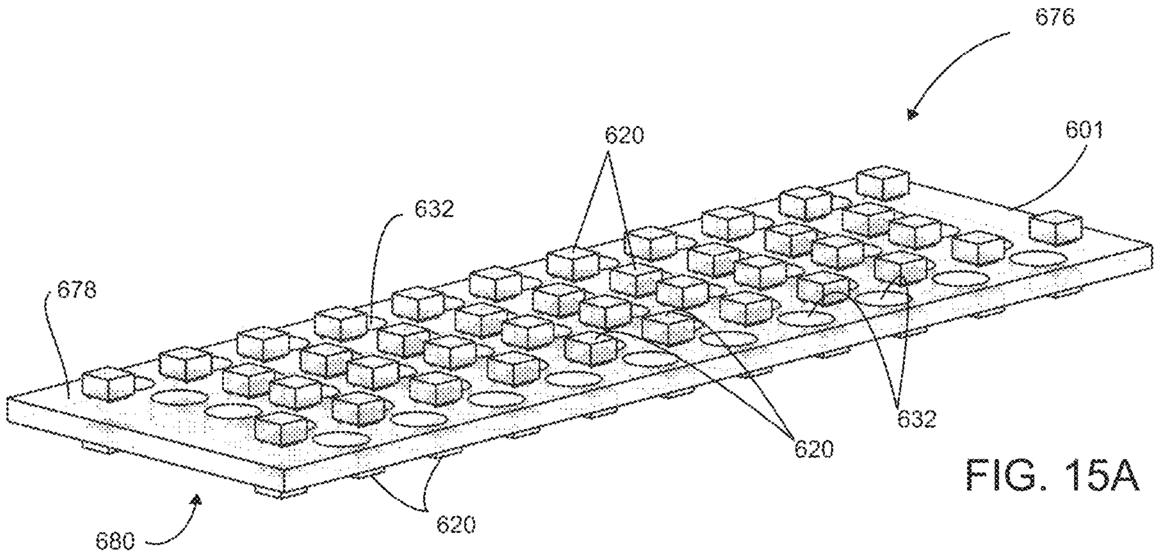
FIGS. 15A and 15B show an individual converter module before and after encapsulation.
Figure 15B:
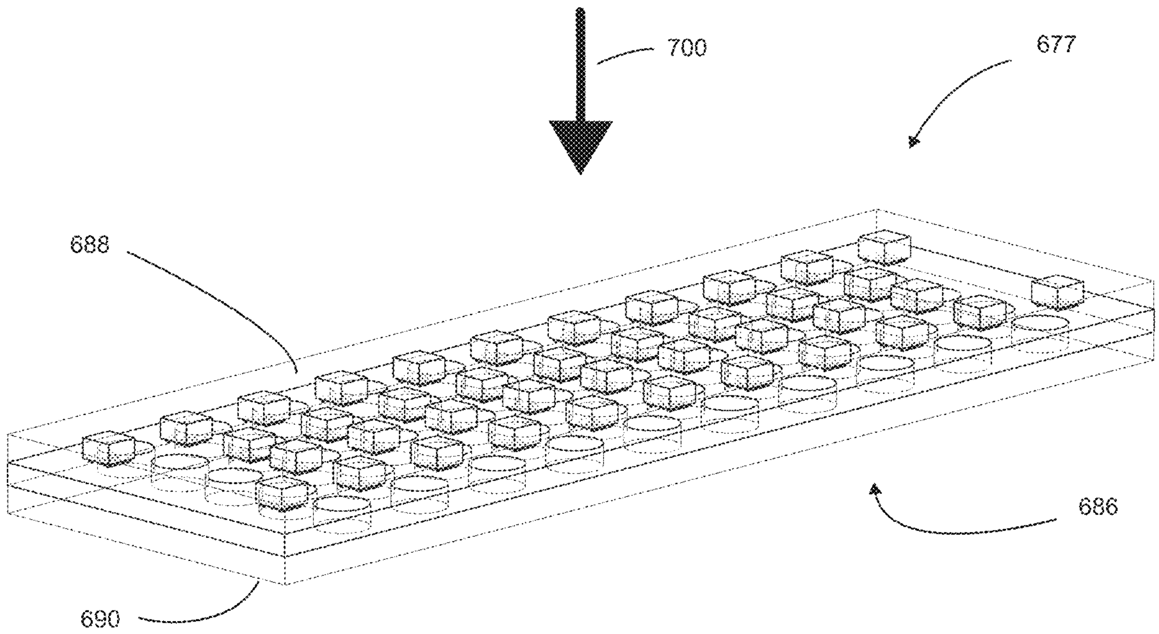

As shown in FIG. 15B and in FIGS. 18A and 18B, the singulated MMP converter module may have a generally rectangular shape, including two large surfaces that may include a plurality of electrical terminations and/or shields. The two-phase distributed-output converter example shown in FIGS. 14-19 (using the converter layout shown in FIGS. 2-6) includes twenty output cells for each primary phase arranged in four horizontal rows and ten vertical columns (as shown, e.g. in FIGS. 2A and 2B). Different configurations are also possible. The upper 688 and lower 690 encapsulant layers encapsulate the electronic switches (e.g., SDS-R/SDS-S devices) and PCB (including internal PCB winding elements) to form the MMP as shown in FIGS. 18A and 18B (See also FIG. 15). A large portion of the MMP 670 comprising the cured magnetically-permeable encapsulation compound becomes the magnetically permeable core, e.g. the top 688 and bottom 690 cured encapsulation layers form core plates having a plurality of legs 633 formed in legs holes 632. The MMP 670 enables finer features and closer spacing of the core legs and SDS-R/SDS-S rectifying components by avoiding the tolerance and spacing requirements of discrete magnetic components, the PCB and pick and place assembly clearances, substantially improving current density. Absence of pre-formed core pieces allows for scaling of the cell size according to the volt-second requirements of the current multiplier, e.g. lower K factors (K=1/80 vs. K=1/40), allowing for higher cell pitch and higher current density.

The finished MMP two-phase distributed-output converter 670 example (FIG. 18) includes a magnetic core structure with fifty core legs arranged in five rows by ten columns (as depicted in FIGS. 2-6, and 14-15), two conductive layers forming the primary windings, two conductive layers forming the first-polarity secondary windings, and two conductive layers forming the second-polarity secondary windings. In this example, the leg openings 632 in the PCB 601 are nominally 1.1 mm in diameter, and the output capacitors have been eliminated from the converter module allowing the upper and lower encapsulant layers 688 and 690, and thus the overall converter, to be reduced in thickness. Referring to FIG. 18 B, the package dimensions for the finished MMP two-phase distributed-output converter 670 example shown are: L=24 mm×W=8 mm×T=1.5 mm. These values are merely examples, the MMP two-phase distributed-output converter 670 can also have other dimensions.

Ferrite Stand-Offs

In the panel mold process, high-profile components, such as magnetic core structures and capacitors, which may protrude sufficiently from the surfaces of the PCB 601 in the populated panel 674 may have been used to establish uniform spacing between the populated panel and the inner surfaces of the mold cavity during injection of the molding compound. The components may rest against the inner surfaces of the mold cavity to prevent or reduce bending or bowing of the PCB panel. For example, the high-profile components on the top surface of the PCB 601 may rest against the inner surface of the upper mold 754 and on the bottom surface of the PCB 601 may rest against the inner surface of the lower mold 756.

However, most of the high-profile components, such as the magnetic permeable core components and capacitors, may be eliminated in the multi-phase converter using the MMP Panel Mold Process. The dual switches, e.g. SDS-R and SDS-S, 620 may not be sufficiently tall to provide the thickness of cured encapsulant desired for the finished product. For example, the thickness may be determined by the requisite magnetic properties and mechanical strength, etc. Therefore, the switches 620 may not be suitable for use as standoffs in all applications to provide stability to the populated panel 674 in the mold cavity 758 when injecting the magnetically-permeable mold compound. For example, the magnetically-permeable mold compound can be a ferrite mold compound with an effective permeability of 20.

To avoid warping, magnetically permeable standoffs 686 having the desired height may be mounted to the PCB 601. A populated panel 684 including standoffs 686 is shown before and after encapsulation in FIG. 16. The standoffs, which preferably may be a magnetically permeable material, such as ferrite, may preferably have a uniform height to provide spacers over the large surface of the panel 684 to provide stability to the panel 684 during the molding process, e.g. during injection and curing of the magnetically permeable molding compound. The magnetically permeable standoffs 686 may be of a uniform size and shape suitable for use with automated pick and place equipment for populating the PCB panels. FIG. 19A shows a sample placement of ferrite standoffs 686 partially covering respective pairs of leg holes 632. FIG. 19C shows a cross-sectional view of the populated panel 684 with dual switches 620 and standoffs 686 in the mold 752. As shown, the standoffs provide a uniform height (shown greater than the height of switches 620) for closing the mold against the panel 684 such that the standoffs 686 rest against the inner surfaces of the upper 754 and lower 756 molds in cavity 758.

Figure 17A:
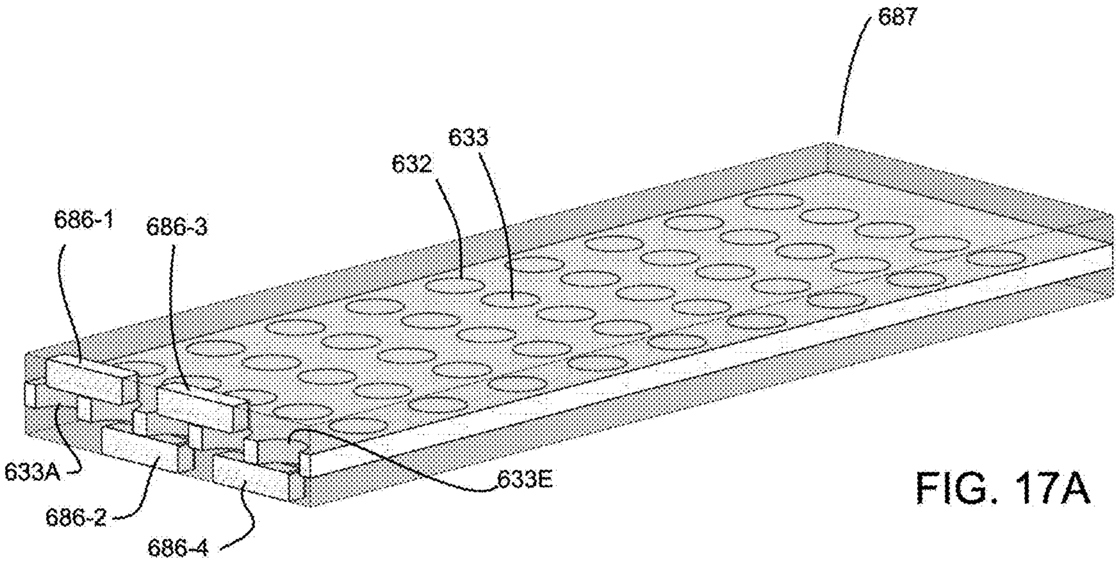
FIGS. 17A and 17B show an individual converter module in a magnetic molded package (MMP) with internal ferrite standoffs.
Figure 17B:
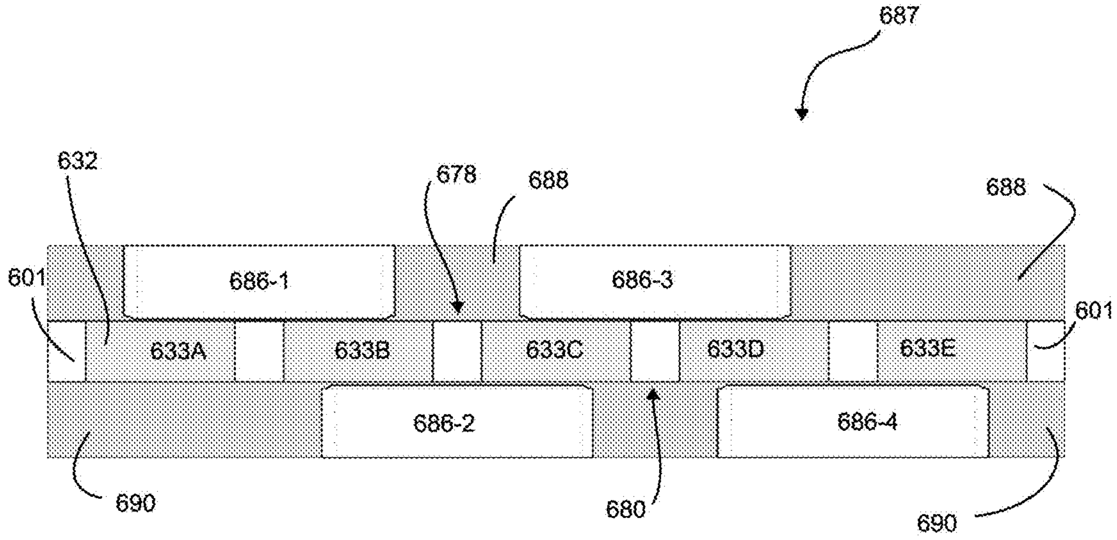

The use of magnetically permeable standoffs may be arranged to enhance the magnetic properties of the MMP. FIGS. 17A and 17B show cross-sectional views of an encapsulated module with ferrite standoffs in isometric and plan views, respectively. In FIG. 17A, a single set of ferrite standoffs 686 is shown in the first column without any other components, such as dual switches 620, to improve clarity. As shown, the standoffs may preferably be placed in staggered relation within each column to form a serpentine magnetic path. For example, starting in the bottom layer 690 near leg hole 633A, the path proceeds up through the leg formed in hole 633A, into standoff 686-1, down through the leg formed in hole 633B, into standoff 686-2, up through the leg formed in hole 633C, into standoff 686-3, down through the leg formed in hole 633D, into standoff 686-4, and up through the leg formed in hole 633E.

As shown in FIG. 16, the un-encapsulated panel 684 includes all of the internal components, e.g., dual switches 620, and the magnetically-permeable standoffs 686 mounted to both surfaces of the PCB 601. The panel includes a plurality of un-singulated converter modules 676B. The magnetically-permeable standoffs 686, which may be made of ferrite, may have a desired relative permeability, may have a height dimension designed to provide sufficient stability to the printed circuit board panel 684 during injection of the magnetically-permeable molding compound into the mold cavity. Preferably the shape, dimensions, and placement of the magnetically-permeable standoffs 686 are selected to allow the magnetically-permeable mold compound to flow around the standoffs and into the leg apertures 632. This will help ensure that the mold cavity and the leg holes 632 are completely filled with encapsulant.

Magnetic properties of the core structure 225 and resulting transformer characteristics, e.g. magnetizing inductance, may be adjusted or controlled without varying the relative permeability of the magnetic molding compound, e.g. by adjusting the top or bottom ferrite plates, or both, by adjusting the length of the standoffs, the clearance or conversely the overlap between the standoff and the leg holes, and the relative permeability of the standoffs. The ferrite plates 686 may help establish more uniform flux distribution in the magnetically permeable core material, reducing core losses. Applicant has found that use of the ferrite standoffs improves the magnetic characteristics of the MMP core structure at operating frequencies above 2 MHz (in addition to reducing or preventing warpage of the PCB during encapsulation). The ferrite standoffs, which do not require sacrifice of PCB surface area for non-function standoffs, may also enable greater panel utilization compared to other methods.

Figure 16A:
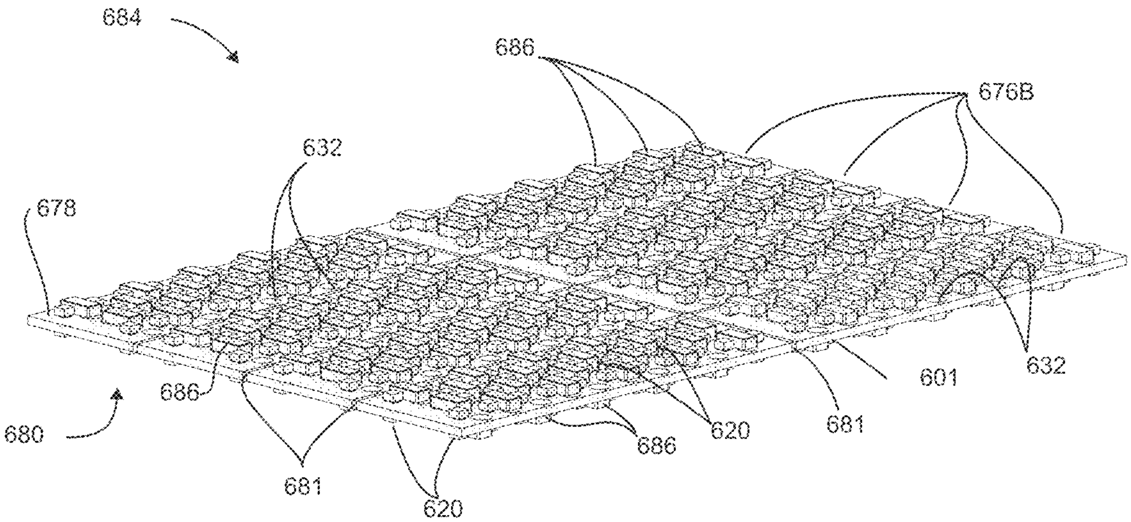
FIGS. 16A and 16B show a populated PCB panel including ferrite standoffs before and after encapsulation.
Figure 16B:
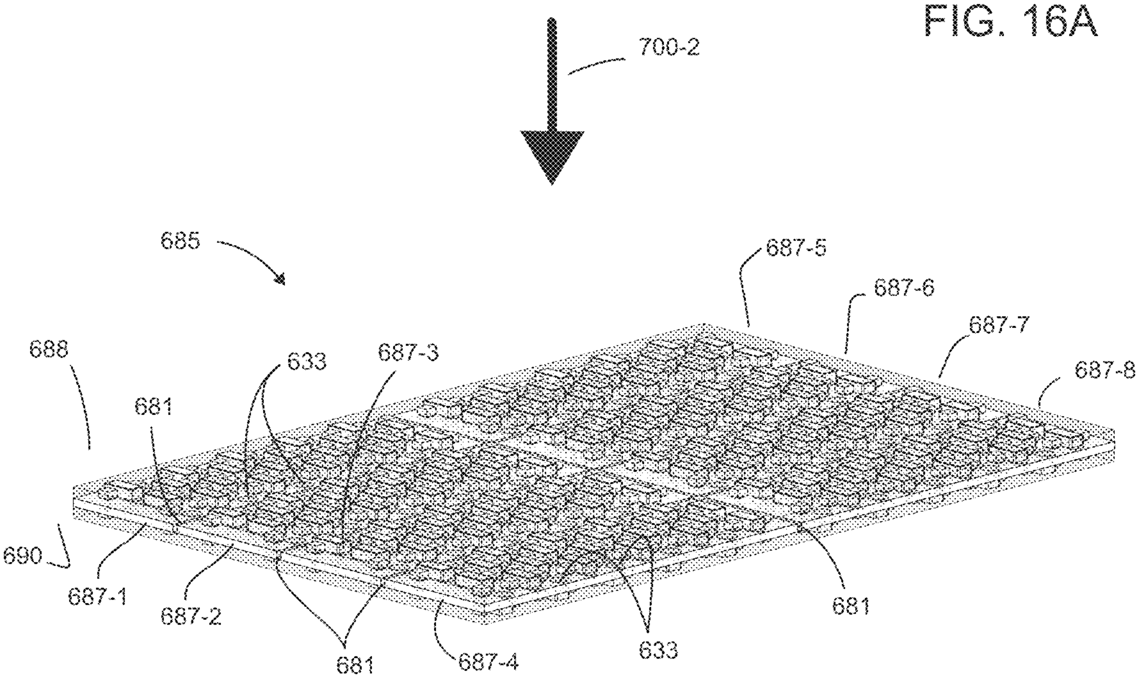

The MMP Panel Mold process 700 may be easily adapted to accommodate the permeable standoffs 686 as shown in FIG. 20 with the addition of step 704. In step 704, the magnetically permeable standoffs may be assembled to the PCB 601 to complete the assembly of the populated panel 684, e.g. as shown in FIG. 16A. Preferably, the magnetically-permeable standoffs 686 may be distributed throughout the top and bottom surfaces of the PCB 601. FIG. 19C shows a cross-sectional view of the populated panel 684 with ferrite standoffs 686 in a mold cavity. As shown, the ferrite standoffs 686 are preferably taller than the other components mounted to the PCB 601, e.g. dual switches 620. The standoffs 686 help to provide stability to the PCB panel 684 during injection of the magnetically-permeable mold compound and during curing of the compound. The magnetically permeable standoffs may be configured to reduce bending (or bowing) of the printed circuit board panel when filling the mold cavity with the magnetically-permeable mold compound, as compared to not using the at least one magnetically permeable standoff. The remaining steps of the MMP panel mold process remain the same. However, it should be noted that optional lapping step 712 (FIG. 20) may reduce the thickness of the standoffs (along with the remainder of the panel) during the optional lapping step 712. For extremely thin modules, the lapping step 712 may be used to expose, and optionally reduce the thickness of, the dual switches 620.

Figure 21:
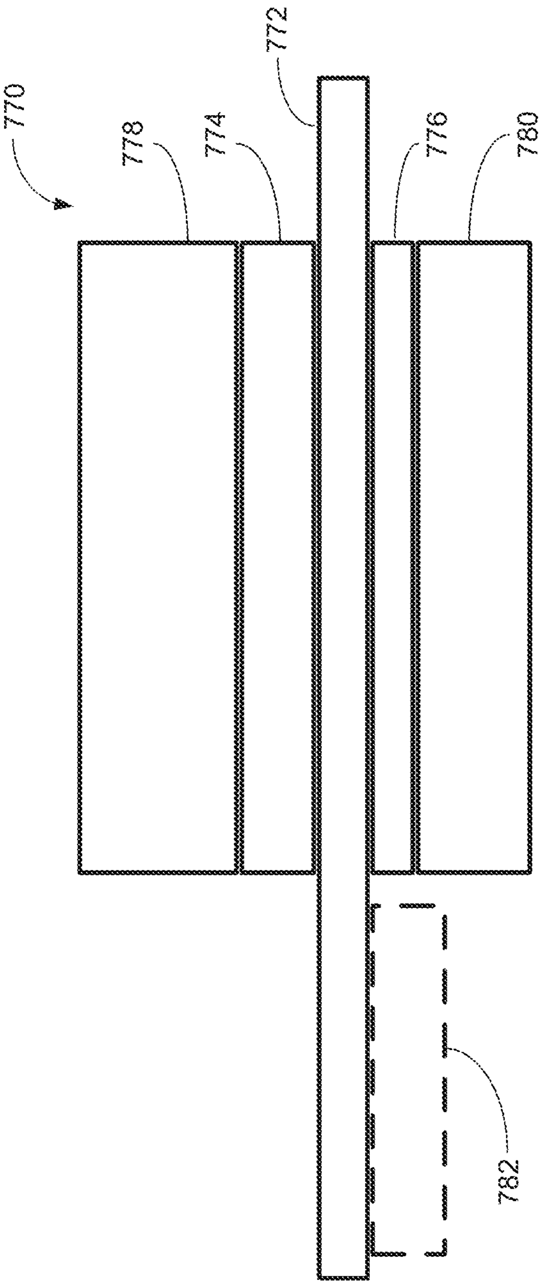
FIG. 21 shows a system in which heat is extracted from two surfaces.

Reducing the thickness of the panel results in reduction of the electrical resistance of the trench connections, e.g. by about 10-20%, and reduces the thermal resistance of the MMP by about 10-20%, reducing heat generation and enhancing heat removal, and allowing greater power to be processed by the converter. The multiphase converter in a MMP being efficient, thin, having a low thermal resistance, may be used to extract some of the heat generated by a semiconductor load through the bottom of the semiconductor device. FIG. 21 shows an example of an electronic system 770 that includes a substrate or PCB 772, a large scale semiconductor device 774, e.g. a GPU, CPU or application specification integrated circuit (ASIC) (which is the load in this example), mounted on a top surface of the substrate or PCB 772, a multiphase converter in a MMP 776 mounted on the bottom side of the substrate or PCB 722, a first heat sink/cooling device 778 thermally coupled to the semiconductor device 774, and a second heat sink/cooling device 780 thermally coupled to the bottom surface of the MMP 776.

A driver circuit for driving the MMP 776 may be placed in another package separate from the MMP 776. In the example of FIG. 21, a driver circuit 782 (which may be similar to the driver circuitry 112 of FIG. 2C) is provided in a second package external to the MMP 776 and mounted to the substrate or PCB 772 for driving the MMP 776. The driver circuit 782 may be mounted on the top side or the bottom side of the substrate or PCB 772. In another example, the driver circuit 782 may be mounted on a second substrate or PCB separate from the substrate or PCB 772. The driver circuit 782 is shown in dashed lines indicating an optional mounting location on the substrate 772. Alternative mounting locations may include the top of the substrate 772 or on another PCB to which substrate 772 may be mounted.

The printed circuit board 772 includes conductive vias for transmitting electric power from the MMP 776 to the application specification integrated circuit 774. Each of the first heat sink/cooling device 778 and the second heat sink/cooling device 780 can be air cooled or liquid cooled. For example, the MMP may be direct liquid cooled using the liquid cooling systems described in U.S. provisional patent application Ser. No. 18/201,725, filed on May 24, 2023 (assigned to Vicor Corporation), the entire content of which is herein incorporated by reference. Alternatively liquid cooled heat sinks may be used for heat removal devices 778 and 780.

The system 770 is unique in its ability to extract heat from the semiconductor load through both surfaces, in the case of the bottom surface through the power converter.

Figures of Merit ("FOM")

The Specific Output Resistance of the two-phase cells as modeled is as low as 15 mOhm×mm$^2$ (MCM Rout×Area) in a K=1/80 converter, 17 mOhm×mm$^2$ in a K=1/60 converter, and 20 mOhm×mm$^2$ in a K=1/60 converter using the MMP. For comparison, the Specific Output Resistance of the single-phase discrete-magnetic component version is as much as 2.5 times greater: 56 mOhm×mm$^2$. In other words, owing to multi-phase interleaving of an MCM including SDRs within a MMP with finer cell lithography, the new MCM cell structure provides nearly 3.7 times increased current density. The FOM based upon volume is even more dramatic using a total package thickness of approximately 1.5 mm.

Three-Phase Example 2

A second embodiment of a three-phase distributed-output converter structure is schematically shown in FIGS. 22 and 23A, 23B and 23C. Like the first embodiment (FIGS. 8-11), the second three-phase embodiment has alternating LW columns (magnetically permeable core legs 633 represented as circles) and TS columns in a step-and-repeat pattern, however, the primary windings are each straight through. As a result, the primary windings are not looped or interleaved as described above. The four LW columns are shown including four core legs 633 each in FIG. 23 having a total of 16 core legs. Each of three primary windings (phases A, B, C) as shown passes between a respective pair of core legs 633 in each column. The TS columns are shown including dual switches 620 represented by squares, positive terminals 622 represented by stars, and negative or common terminals 621 represented by solid ovals. Five TS columns are shown in FIGS. 23A through 23D, each containing four switches 620, four positive terminals 622, and six common terminals 621 for a total of 20 switches, 20 positive terminals, and 30 common terminals. In this embodiment the common terminals 621 are shown on each side (straddling) the dual switches 620.

As discussed in the examples above, preferred embodiments of the converters include electrically conductive plating on the surface of the encapsulant. In this embodiment the surface plating may form rows of alternating output terminals, e.g. the top row may connect the top positive terminals 622 in each column to form a positive output terminal and similarly, the next row may connect the top common terminals 621 in each column to form a common output terminal, and so on. The secondary winding configuration in this embodiment (FIG. 23) enables connections between positive terminals in each column in the respective secondary layers as discussed below. The positive terminals 622 and negative terminals 621 may be considered output terminals, across which the load may be connected.

Figure 22:
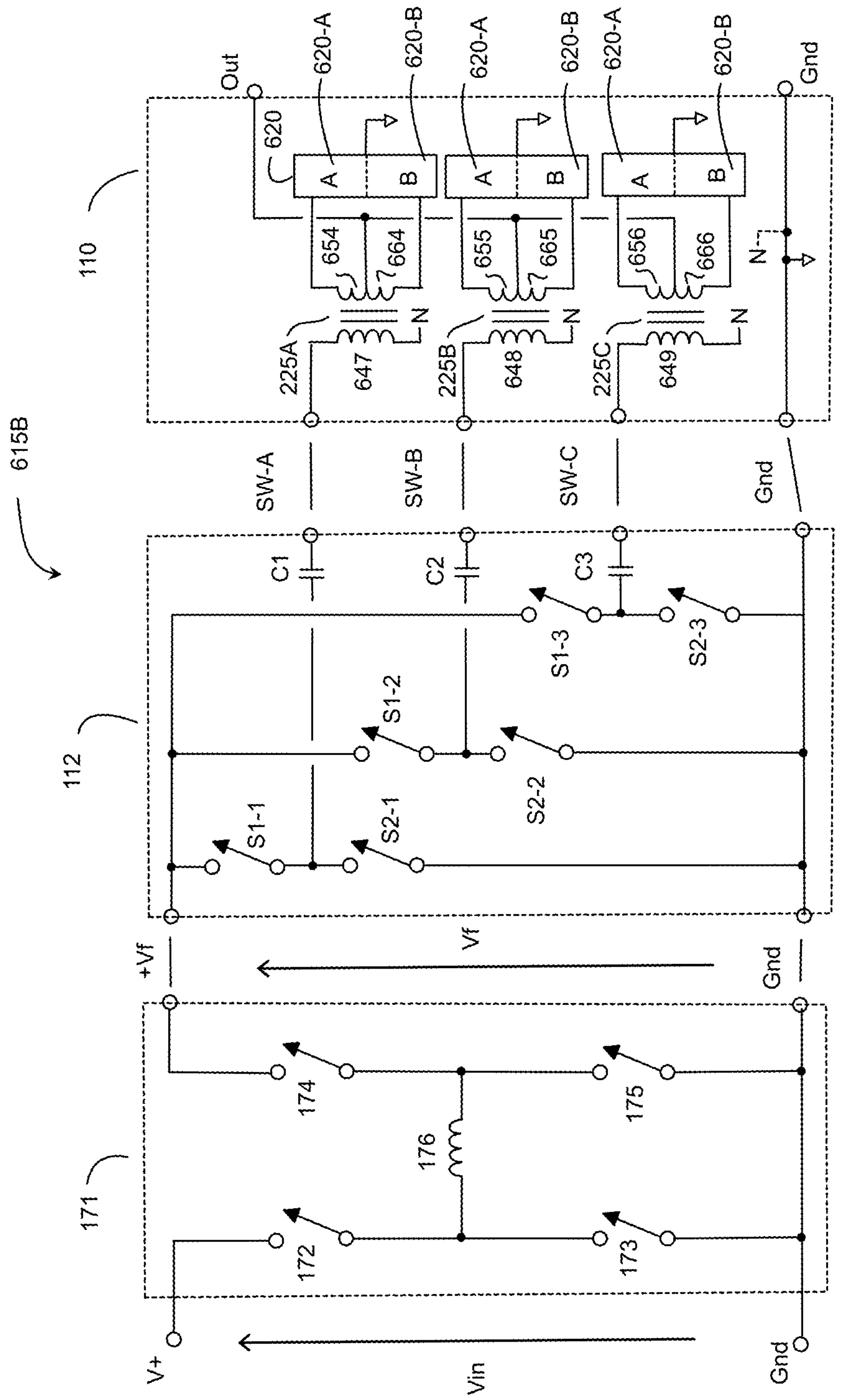
FIG. 22 shows a simplified schematic diagram of another three-phase distributed-output power converter, including an internal primary winding neutral node and a three-phase integrated driver.
Figure 23A:
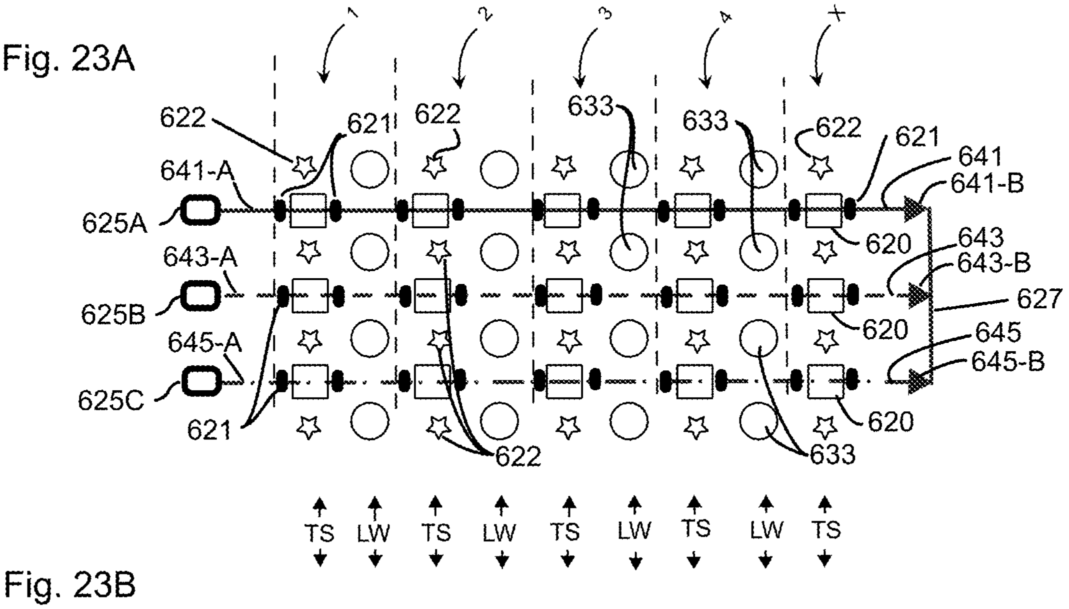
FIG. 23A shows a top view schematic layout of non-interleaved straight primary windings of a three-phase distributed-output power converter having four core legs per column, three primary input terminals, and a primary winding neutral node.
Figure 23B:
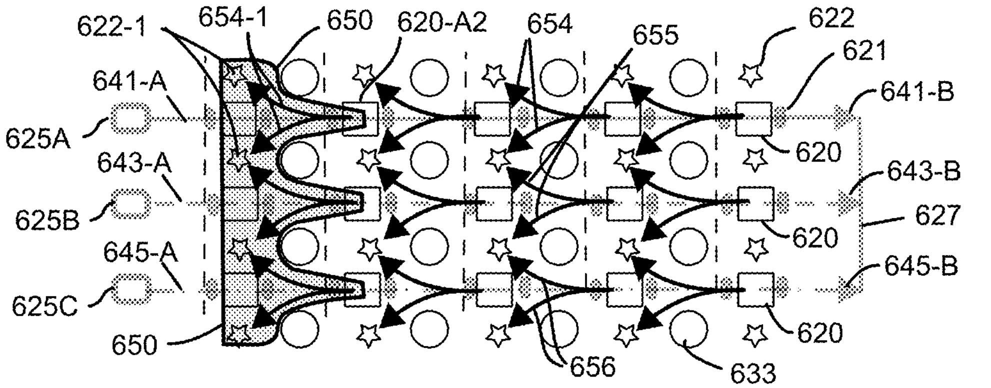
FIG. 23B shows a top view schematic layout of secondary windings for the first output polarity phase of the three-phase distributed output converter of FIG. 23A.
Figure 23C:
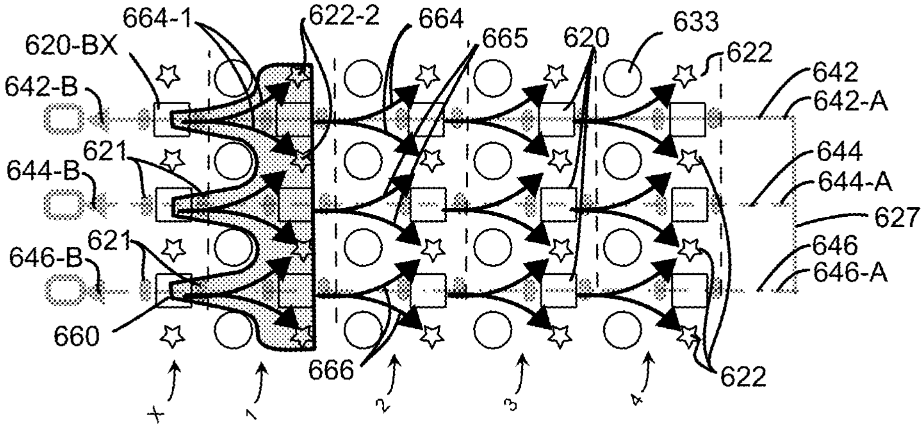
FIG. 23C shows a top view schematic layout of secondary windings for the second output (opposite) polarity phase of the three-phase distributed output converter of FIG. 23A.

The primary windings are schematically represented in FIGS. 23A, 23B, and 23C by arrows, 641-646. The arrow direction illustrates the polarity of primary current flow in each winding. For example, the arrows 641, 643, 645, in FIGS. 23A and 23B show the primary current (flowing left to right) during polarity phase, A, and the arrows 642, 644, 646, in FIG. 23C show the primary current (flowing right to left) during polarity phase B. As shown in FIG. 23A, the primary windings are each connected to a respective primary input terminal (625A, 625B, 625C) and a common neutral connection 627 (N in FIG. 22). As with the primary currents, the secondary currents are represented by arrows illustrating the direction and path of current flow during each polarity phase in FIGS. 23B and 23C. Preferably, the current in each primary winding may be either 120 or 240 degrees out of phase with the current in each of the other two primary windings as illustrated in FIG. 7B. Of course, the primary currents, being out of phase with each other will never all flow in the same direction at the same time in contrast to the illustrations in FIGS. 23A, 23B, 23C. During normal 3-phase operation the primary winding currents, which are summed at the common neutral node 627, will nearly cancel, i.e., the net primary current at the common neutral node 627 will be nearly zero. Substantial cancellation among primary currents eliminates the need for primary return terminals (e.g. compare FIG. 8) and further the need for an external connection to the common neutral node 627, thereby reducing the number of connections for the primary windings to three terminals as shown in FIG. 23A, 23B, and 23C. As shown in FIG. 22, the primary common node N (627 in FIGS. 23A-23C) may optionally be electrically connected to the ground terminal, e.g. to allow current to return in the event phase shedding is employed.

Dashed lines illustrate imaginary boundaries between each cell in the distributed output structure for polarity A (FIGS. 23A, 23B) and polarity B (FIG. 23C). As shown four output cells, numbered 1 to 4 (along the top of FIG. 23A and the bottom of FIG. 23C), each including cell elements for each respective primary A, primary B, and primary C, including a dual switch 620, negative output terminals 621, a small vertical loop in the magnetic core structure (represented as an adjacent pair of core legs 633), and positive output terminals 622.

The secondary windings (and the currents flowing in the secondary windings) of the three-phase structure are schematically represented by arrows, e.g. 654, 664, 655, 665, 656, and 666, in FIGS. 23B and 23C. For example, FIG. 23B shows the secondary winding currents 654 (for primary A, polarity A), 655 (for primary B, polarity A), and 656 for primary C, polarity A); and FIG. 23C shows the secondary winding currents 664 (for primary A, polarity B), 665 (for primary B, polarity B), and 666 (for primary C, polarity B). As shown, all of polarity A secondary winding elements 654, 655, 656, may be combined in a single PCB layer and all of polarity B secondary winding elements 664, 665, 666 may be combined in another single PCB layer (as described for the two-phase example above). Examples of the patterned conductive layers 650, 660, forming the secondary winding elements in output cell 1 for each polarity phase (Polarity A: 650, FIG. 23B; Polarity B: 660, FIG. 23C) are shown by the shaded areas. As illustrated, each secondary winding element approximates an isosceles triangle with the respective switch 620 at the apex and the respective positive terminals 622 at the ends of the base. The resulting secondary winding element approximates a straight line (between its respective switch 620 and the midpoint between its two respective positive terminals 622) along the center of the triangle overlapping its respective primary winding almost perfectly. The secondary winding elements associated with all three primary phases may be combined in each cell as shown by the generally comb-shaped shaded areas 650, 660, in FIGS. 23B and 23C.

In some examples, each secondary winding element is substantially symmetric with respect to an axis of symmetry that is substantially parallel to the primary winding. The term "substantially symmetric" means that the secondary winding element has a first portion to one side of the axis of symmetry and a second portion to the other side of the axis of symmetry, when the secondary winding element is folded along the axis of symmetry, at least 90%, preferably at least 95%, of the first portion overlaps the second portion. The term "substantially parallel" means that the angle between the axis of symmetry and the primary winding is less than 10 degrees, preferably less than 5 degrees.

The shaded areas in FIGS. 23B and 23C are approximate representations of the conductive layers 650, 660. In the example of FIG. 23B, the conductive layer 650 includes four generally comb-shaped conductive regions 650 associated with cells 1 to 4, respectively, in which the four generally comb-shaped conductive regions 650 do not overlap each other. Similarly, in the example of FIG. 23C, the conductive layer 660 includes four generally comb-shaped conductive regions 660 associated with cells 1 to 4, respectively, in which the four generally comb-shaped conductive regions 650 do not overlap each other.

Each comb-shaped conductive region includes teeth regions that are connected to corresponding switches. For example, the comb-shaped conductive region 650 shown in FIG. 23B includes three teeth regions that are connected to the three switches, respectively, in cell 2. The comb-shaped conductive region 660 shown in FIG. 23C includes three teeth regions that are connected to the three switches, respectively, in cell X.

Referring to FIG. 23B, the currents 654, e.g. 654-1, induced in a first set of secondary winding elements during polarity phase A of the primary current 641 flowing in primary winding A are shown flowing from a respective switch 620, e.g. 620-A2, to respective positive terminals 622, e.g. 622-1. The secondary currents, 655 and 656, induced in the secondary winding elements during polarity phase A of the other two primary currents, 643 (Primary B) and 645 (Primary C) respectively, are also shown flowing from a respective switch 620 to respective positive terminals 622.

FIG. 23C shows the secondary currents 664, e.g. 664-1, induced in a second set of secondary winding elements, e.g. 660, during polarity phase B of the primary current 642 (in primary winding A), flowing in the opposite direction from a respective switch 620, e.g., 620-BX to respective positive terminals 622, e.g. 622-2. The secondary currents, 665 and 666, induced in the secondary winding elements during polarity phase B of the other two primary currents, 644 (Primary B) and 646 (Primary C) respectively, are also shown flowing from a respective switch 620 to respective positive terminals 622.

Like the other multi-phase examples described above, the three-phase converter embodiment illustrated in FIG. 23A-C preferably employs smart-dual-switching (SDS) devices, e.g. SDS-R or SDS-S, for the output switches 620. In some three-phase converter embodiments, the SDS-R (compared to SDS-S) is the preferred dual switching device. Advantages of using the self-controlled SDS-R or SDS-S devices in a distributed output structure, which are more fully described in the SDS Patent, include elimination of external synchronous rectifier control signals. However, in the multi-phase structure, the benefits extend further to provide advantages in packaging, control, and scalability as described herein. As described in detail in the SDS Patent, the printed circuit board may be free of control signals (which are instead generated within each self-contained electronic switching device), allowing greater utilization of the PCB layers for enhancing performance, density, and efficiency.

As shown in FIGS. 23B and 23C, the positive terminals 622 may be shared with neighboring cells, e.g. the upper-middle positive terminals are shared by the secondary winding elements for the A and B primaries, and the lower-middle positive terminals are shared by the secondary windings for the B and C primaries. The vertically-neighboring cell element(s) are as shown associated with different primary winding(s), e.g., the output cell elements for primary B are located between output cell elements for primary A above and output cell elements for primary C below. The positive terminals 622 are also shared by the polarity A and polarity B output cells, e.g. positive terminals 622-2 used by the windings 664-1 in cell 1 of the polarity B output circuit (FIG. 23C) are shared by the windings 654-2 in cell 2 of the polarity A output circuit (FIG. 23B).

Improvements in the example of FIG. 23 compared to the two-phase embodiment (FIGS. 3-6) include reduction in the number of primary winding terminals from 4 (2 phase) to 3 (3 phase), reduction the number of core legs per column from 5 (2 phase) to 4 (3 phase), increase in core leg diameter, increase in the width of the primary and secondary windings between the core legs, reduction in secondary winding length and resistance, and increase in the secondary winding element overlap with the primary winding.

Figure 25:
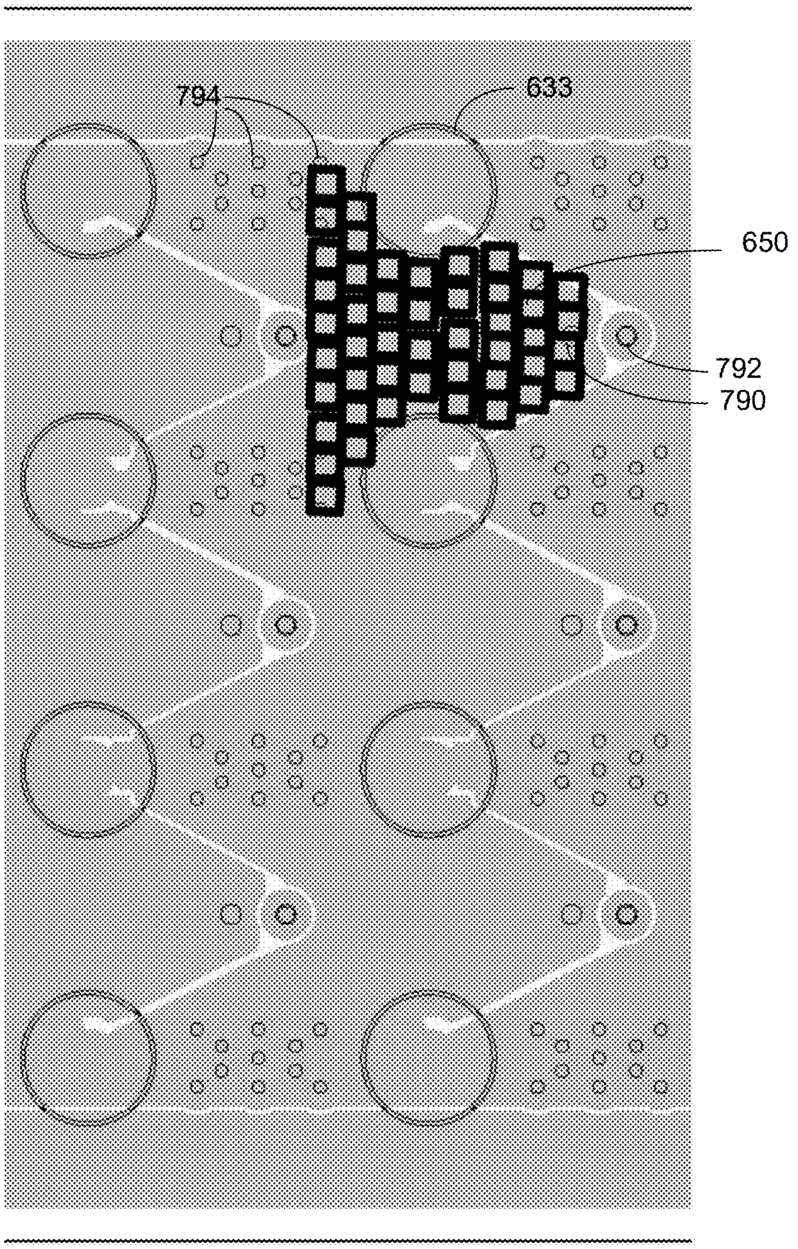
FIG. 25 shows a winding element of FIG. 23B having a plurality of squares placed as an approximation.

The three-phase converter example of FIG. 23 enables further improvement of the cell and winding structure, including: shorter winding elements and greater winding overlap with the primary winding, and further reduction in the number of squares required to form a transformer turn. The reduction in squares is illustrated in FIG. 25 which shows the winding element 650 of one cell element (FIG. 23B) having a plurality of squares placed (as an approximation) on the winding element. As can be seen clearly in FIG. 25, the length of the winding element 650 is approximately 8 squares and the number of the squares summed over that length is approximately 47, yielding a weighted average width of 5.9 squares. The winding elements 650, 660 of the cell structure of FIGS. 23B and 23C, therefore require 8/5.9 or approximately 1.4 squares of conductor. This represents approximately 25% improvement compared to the 1.9 squares in the single-phase converter 500 in FIGS. 28, 29, and 32 of the SDS Patent. Computer simulation results show improvements comparable to those revealed by the rough graphical approximation of FIG. 25, e.g. the number of squares required for the secondary winding elements in the improved three-phase converter may be 1.8 squares, 1.6 squares, or less, e.g. 1.4 squares per winding element.

In FIG. 25, the winding element 650 extends from the positive terminal (connected through vias 794) to a respective drain terminal of the SDS device. Any metal in the area occupied by the core leg 633 is removed when the leg holes are formed as described in the Self-Aligned Patent. In FIG. 25, the drain terminals are represented by the two vias, one via 790 is connected to the winding 650 and the other via 792 (which is for the other phase) is isolated from the winding 650. The SDS device is disposed on the outer conductive layers, and the winding elements 650 are disposed on internal conductive layers. The vias pass through the PCB layers and connect to the area on the outer layer to which the positive trench terminals are formed. The winding layers are internal PCB layers and are not in physical contact with the trench plating.

Cascaded 3 Phase PoLs

Figure 23D:
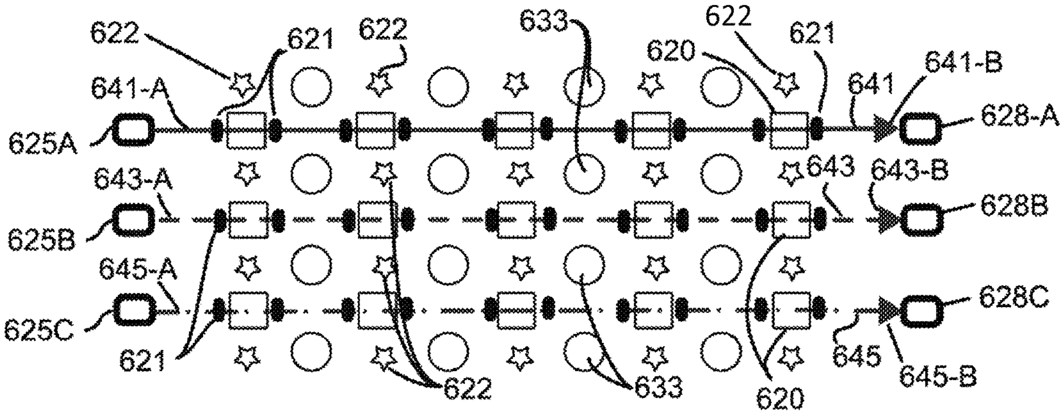
FIG. 23D shows a top view schematic layout of another non-interleaved straight-primary winding three-phase distributed-output power converter having four core legs per column, three primary winding input terminals, and three primary winding output terminals.
Figure 24:
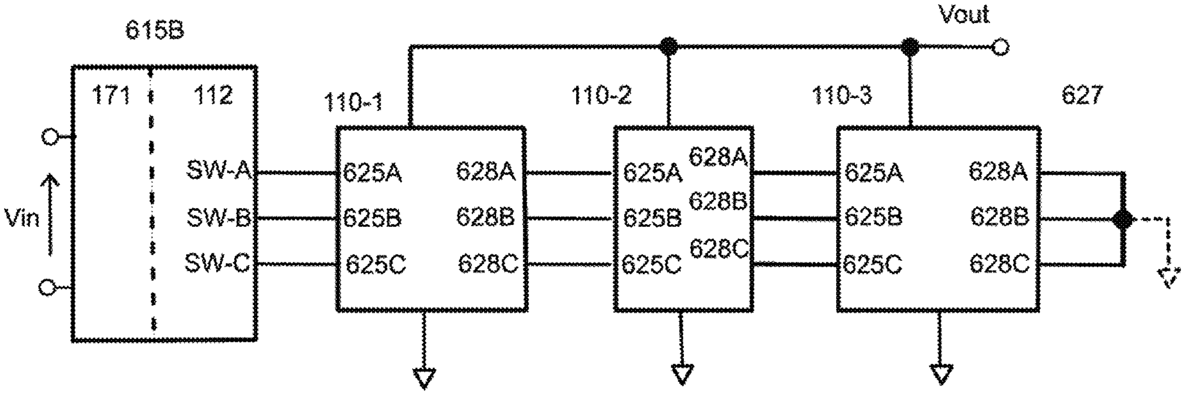
FIG. 24 shows a simplified schematic diagram of a three-phase integrated driver driving three cascaded three-phase distributed-output power converters of the type illustrated in FIG. 23D.

Another option, illustrated schematically in FIGS. 23D and 24, provides terminals for each end of the primary windings, e.g. input side terminals 625A, 625B, 625C, on the left and output side terminals, 628A, 628B, 628C, on the right of each module, modules 110-1, 110-2, and 110-3 (FIG. 24). FIG. 23D shows an example of the layout used in each of the modules 110-1, 110-2, 110-3. As shown, multiple modules may be driven by a single driver, 615B. The driver outputs, SW-A, SW-B, SW-C, are connected to the inputs, 625A, 625B, 625C, of a first module 110-1. The outputs, 628A, 628B, 628C, of the first module 110-1 are connected to the inputs, 625A, 625B, 625C, of the second module 110-2 and so on. The outputs of the last module in the chain are connected together to form the primary neutral node, and optionally may be connected to the system ground (as shown by the dashed ground connection in FIG. 24).

The cascaded connection shown in FIG. 24 connects the primary windings in each phase of each module in series with the others, effectively increasing the number of output cells and scaling the voltage transformation ratio (K=Vout/Vin) of the system. Providing a few common building blocks, K=1/3, K=1/4, and K=1/5, enables designers to generate multiple system K-factors. For example, using one of each of the three modules above (1/3, 1/4, 1/5) provides a system K=1/12 voltage transformation ratio or three of the K=1/3 modules provides a system K=1/9 voltage transformation ratio. Although the example of FIG. 24 shows the primary windings of three modules connected in series, fewer or more than three modules may be connected in series. For example, two modules (K=1/4 and K=1/5) may be used to provide a system voltage transformation ratio of K=1/9, or (K=1/5 and K=1/5) may be used to provides a system voltage transformation ratio of K=1/10 and so on. Similarly, four modules (K=1/3) may be used to provide a system voltage transformation ratio of K=1/12, and so on.

Phase Shedding

As noted above, the three-phase primary currents will cancel; however, if one or more primary phases are turned off (shed) to increase light-load efficiency, the primary currents will not cancel and thus require a return. As shown in FIGS. 22 and 24, an optional connection of the primary neutral node to the common terminal may be used to provide a return path for the uncancelled primary current. The uncancelled primary current during light load will be relatively small and should not be problematic.

Self-Aligned Trench Terminals

As discussed above, the electrical terminals, 621, 622, 625A-C, and 628A-C, shown schematically in FIGS. 23A-23D may be formed as trench connections described in the Leadless Patent and in the Trench Patent. (The following description assumes a basic familiarity with the panel molding process and conductive termination processes described in the Leadless and Trench Patents.) Preferred methods for forming the trench terminals in small spaces with controlled tolerances will be described in connection with FIGS. 26A to 26D.

Figure 26A:
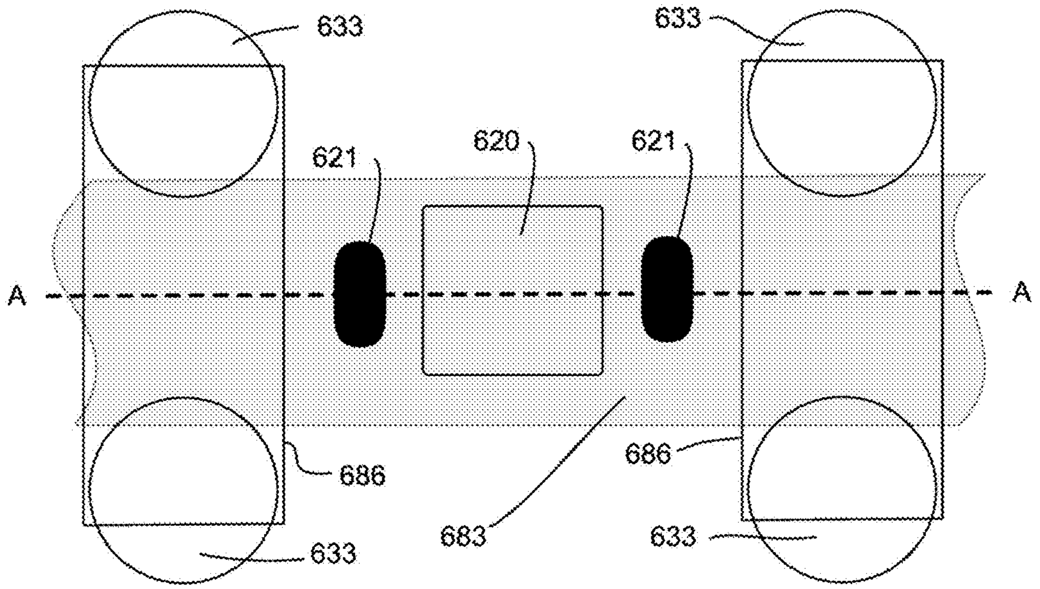
FIG. 26A shows an example of a single row of the structures in FIGS. 23A and 23D, including a dual switch and two neighboring common output terminals and two adjacent magnetically permeable core legs.
Figure 26B:
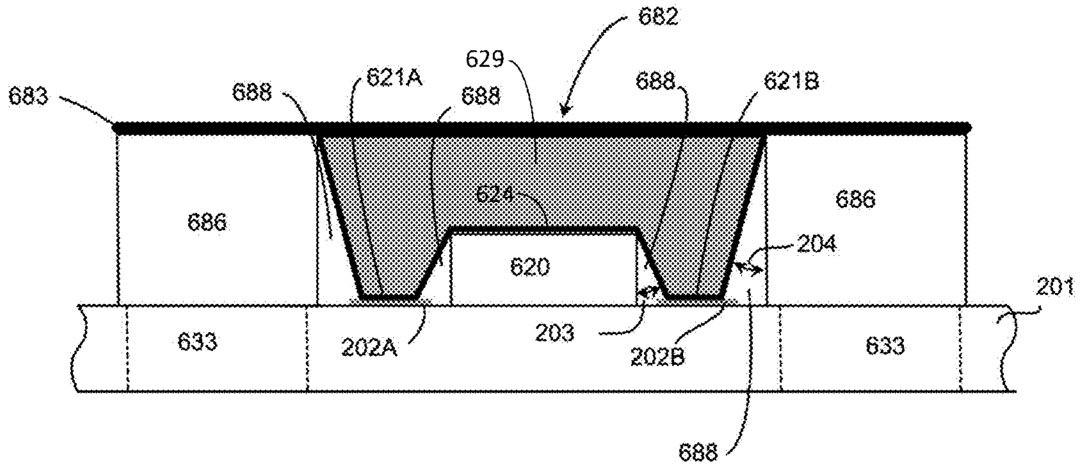
FIG. 26B shows a cross-section of the structure shown in FIG. 26A following encapsulation and formation of trench terminal.

The enlarged view of FIG. 26A shows a portion of a single row of the structures in FIGS. 23A and 23D including one representative TS column (including a dual switch 620 and two neighboring common output terminals 621) and two adjacent LW columns (each including magnetically permeable core legs 633 and magnetically permeable core pieces or standoffs 686) for clarity. The shaded area represents a metal layer on the exterior surface of the encapsulated converter patterned to form a surface terminal 683. In the configuration shown in FIGS. 23A, 23B, 23C, and 23D, the surface terminal preferably forms electrical connections to all of the common terminals in the same row. An example of a patterned metal layer on the exterior surface of an encapsulated module is shown in FIG. 18A. As shown, the metal layer is patterned to form strips 683, each of which connects to all of the positive 622 or common 621 terminals in the respective row, e.g. 683A connects all of the 621 terminals 621-A1 through 621-AX shown in the topmost row and 683D connects all of the positive terminals 622-1 through 622-X in the row adjacent to the topmost row. Note that windings, which are preferably formed in the inner layers of the PCB 201, are not shown in FIG. 26A or 26B. FIG. 26B shows a cross-section (taken along line A-A) of the structure shown in FIG. 26A following encapsulation and following formation of trench terminal 682.

As shown, trench terminal 682 may be formed over the dual switch 620, electrically connecting to multiple, electrically conductive lands, 202A and 202B, e.g. copper, located on the surface of PCB 201 adjacent to the dual switch 620. In this example, the electrically conductive lands 202A and 202B represent the negative output terminals 621 shown in FIGS. 23A-23C. As shown, the trench terminal 682 occupies the space between adjacent core pieces 686, connecting to common terminals 621A and 621B on the PCB surface and forming a bridge on the exposed surface of the dual switch 620. Exposing the dual switch to the subsequent plating step improves thermal performance, e.g. as described in the Leadless Patent. The structure shown in FIG. 26B improves manufacturability and electrical performance (reduced resistance). The converter examples discussed herein may preferably have very small cell dimensions, e.g. the combination of one TS and one LW column may be as small as 2.1 mm, e.g. requiring very tight control of the trench terminals which may have some features smaller than 0.5 mm.

A preferred process for accurately forming such trench terminals uses one or more of the components on the surface of the PCB 201 to guide removal of the encapsulation material 688 in the locations desired. For example, a laser may be used to remove encapsulant 688 from the PCB surface in the areas adjacent to the dual switch 620 and on top of the dual switch 620. Proper selection of the power and wavelength of the laser to remove encapsulant much faster than material from the core pieces/standoffs 686 and dual switch 620 allows those structures to contain the removal area for formation of the trench. In other words, the laser may repeatedly pass over the core pieces 686 and dual switches 620 leaving them unharmed as any encapsulant 688 gets removed. In this way, the components on the PCB control the location of the trench terminals greatly increasing positional accuracy.

As shown in FIG. 26B, the encapsulant forms walls adjacent to the dual switch 620 and the core pieces 686 sloped at angles 203 and 204, respectively. Sloping at angles of 3 to 4 degrees may naturally arise from orthogonal orientation of the laser during excavation of the encapsulant. Greater angles may be achieved optically altering the laser, e.g. angle of incidence or focal point.

Figure 26C:
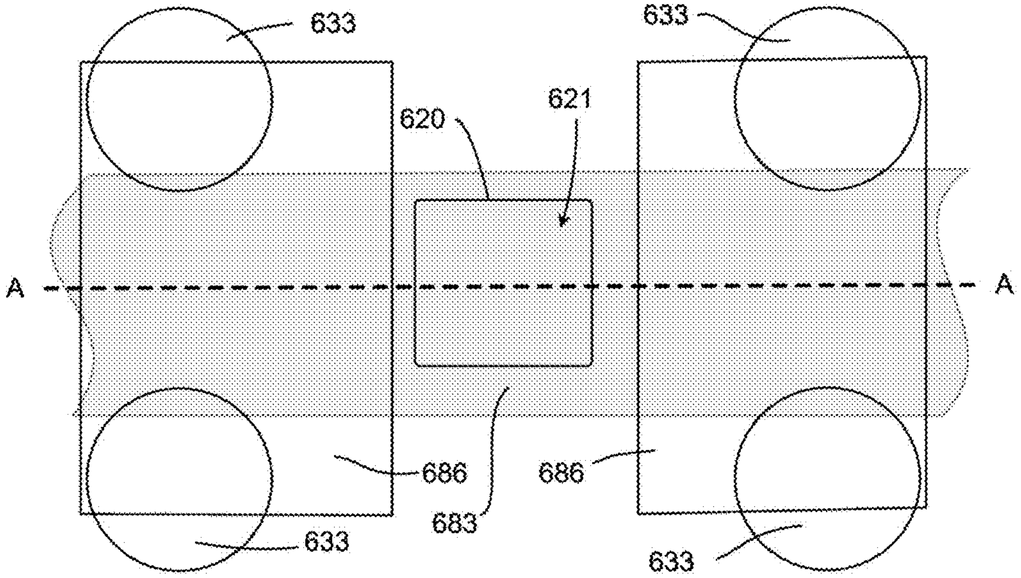
FIG. 26C shows an example of a portion of a power converter including a switch and two adjacent magnetically permeable core legs.
Figure 26D:
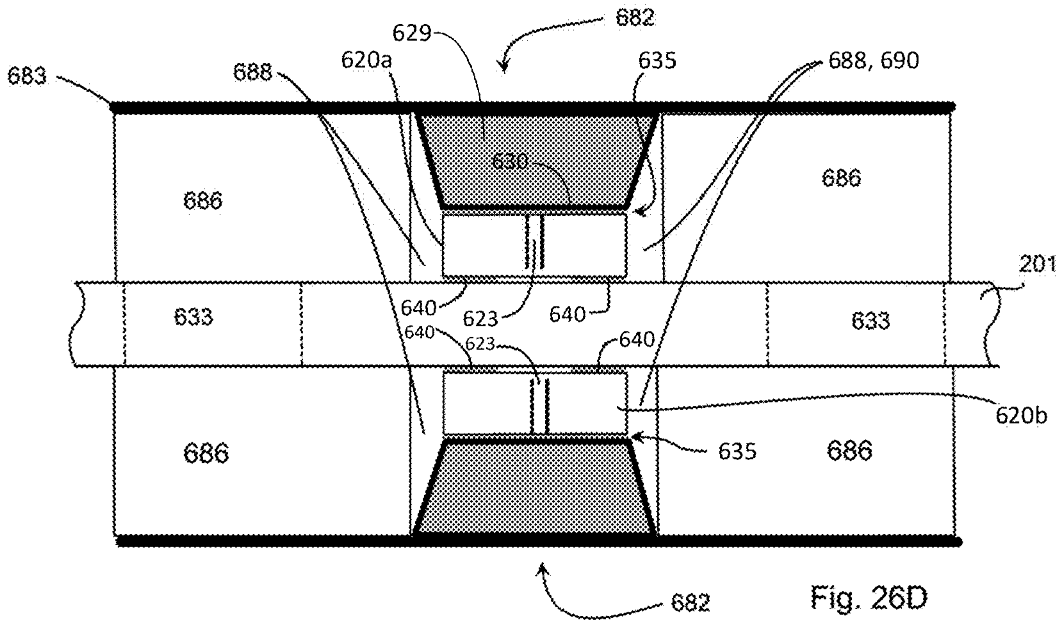
FIG. 26D shows a cross-section of the structure shown in FIG. 26C.

Referring to FIGS. 26C and 26D, in some examples, the dual switch 620 may optionally include an electrically-conductive layer 635, e.g. metal, formed on the surface of the dual switch opposite the PCB 201. Such a metal layer 635 may be connected to the negative, common terminals of the dual switch 620 with through-silicon vias 623 to enhance the electrical connection between the trench terminal 682 and the respective circuitry, further reducing electrical resistance. FIG. 26D shows an example in which a first dual switch 620*a* is mounted on the top side of the PCB 201, and optionally, a second dual switch 620*b* is mounted on the bottom side of the PCB 201.

Referring to FIGS. 26A and 26B, for example, a first plated conductive metal layer 624 is applied to the encapsulated converter on the exterior surface and in the bottom of the trenches, including above the top surface of the dual switches 620 and onto the electrically conductive lands 202A, 202B. The first plated conductive metal layer 624 is continuous along the contours shown in the trench 682 and on the exterior surface of the module. The trenches 682 may optionally be partially or completely filled, e.g. with one or more conductive or non-conductive (e.g. curable) compound 629 (such as an epoxy, fillers which are cured) before an additional plating step to help smooth the resulting metal surface. Alternatively, the trenches 682 may be filled with solder paste for subsequent attachment to a system board or other device. Alternatively, the metal may be formed in and over the trench to a desired thickness without fillers. After the desired metal layer(s) are formed in the trench 682 and on the exterior surface, the metal layer(s) may be etched to form terminal patterns, e.g. conductive terminal strips 683 as shown in FIGS. 18A and 26A.

Referring to FIGS. 26C and 26D, for example, a first plated conductive metal layer 630 is applied to the encapsulated converter on the exterior surface and in the bottom of the trenches 682, including above the metal layer 635 formed on the surface of the dual switches 620 opposite the PCB 201. The first plated conductive metal layer 630 is continuous along the contours shown in the trench 682 and on the exterior surface of the module. The trenches 682 may optionally be partially or completely filled, e.g. with one or more conductive or non-conductive (e.g. curable) compound 629 (such as an epoxy, fillers which are cured) before an additional plating step to help smooth the resulting metal surface. Alternatively, the trenches 682 may be filled with solder paste for subsequent attachment to a system board or other device. Alternatively, the metal may be formed in and over the trench to a desired thickness without fillers. After the desired metal layer(s) are formed in the trench 682 and on the exterior surface, the metal layer(s) may be etched to form terminal patterns, e.g. conductive terminal strips 683 as shown in FIGS. 18A and 26C.

Comparing the second example shown in FIGS. 26C and 26D versus the first example shown in FIGS. 26A and 26B, in the second example, the negative connection pads on both sides of the dual switch 620 are eliminated, and the core pieces 686 may be made wider to take advantage of the elimination of the negative contact pads on the surface of the PCB 201. The dual switch 620 has drain terminals 640 formed on the surface facing the PCB 201. By moving the common terminal (which is connected to the source of the dual switch 620) to the surface opposite the PCB 201, the drain pads 640 (i.e., contact pads for the drains) may be made larger.

In some implementations, as shown in the example of FIG. 26D, the first dual switch 620*a* has a footprint that overlaps the footprint of the second dual switch 620*b*. For example, the first dual switch 620*a* and the second dual switch 620*b* may be aligned in the vertical direction. For example, the first dual switch 620*a* and the second dual switch 620*b* may be symmetrical with respect to each other with the center plane of the PCB 201 as the plane of symmetry. In some examples, the first dual switch 620*a* and the second dual switch 620*b* are connected in parallel using vias that pass through the PCB 201. In some examples, the first dual switch 620*a* and the second dual switch 620*b* are independently connected to secondary windings on respective separate layers. For example, the first dual switch 620*a* may be connected to secondary windings formed on a first metal layer near the top side of the PCB 201, and the second dual switch 620*b* may be connected to secondary windings formed on a second metal layer near the bottom side of the PCB 201.

Variations

A number of embodiments of the invention have been described. Nevertheless, it will be understood that various modifications may be made without departing from the spirit and scope of the invention. For example, each phase of each cell element may include multiple winding elements on multiple layers connected in parallel. Each output cell element may include winding elements coupling to a number, Ns, of magnetic loop paths, where N may be 1, 2, or greater. The cell elements may be physically arranged in a number of rows, preferably an even number of rows, e.g. 2, 4, or more rows. The power converters described above can have a specific output resistance divided by Ns that is different from the exemplary values provided above. In some examples, the specific output resistance divided by Ns can be less than or equal to 20 mΩ $mm^2$ based upon area. In some examples, the specific output resistance divided by Ns can be less than or equal to 60 mΩ $mm^2$ based upon area.

In the examples of magnetic molded packages shown in FIGS. 15 and 18, the magnetically-permeable encapsulation compound encapsulates substantially the entire top and bottom surfaces of the populated PCB panel or module (e.g., 676 of FIG. 15, 706 of FIG. 20), including the top 678 and bottom 680 surfaces of the multilayer printed circuit board and the components (e.g., dual electronic switches 620) mounted on the PCB, except for allowing the input terminals and the positive and common terminals (that function as output terminals for connecting to the load) to be connected to the exterior surface of the MMP. In some implementations, the magnetically-permeable encapsulation compound can encapsulate portions of the top and bottom sides of the partially finished converter module (e.g., 676, 706), including portions of the top and bottom surfaces of the multilayer printed circuit board (e.g., 678, 708) and some of the components (e.g., electronic switches) mounted on the multilayer printed circuit board. The magnetically-permeable encapsulation compound fills in the core leg apertures 632 forming the core legs 633 in each column, and although preferred, does not necessarily have to, cover the entire top and bottom surfaces of the multilayer printed circuit board.

The term "approximate" is used to mean that the value can vary from a predefined value by a certain percentage due to manufacturing tolerances, variations in components, or variations in the operating conditions. The amount of variation depends on context, some circuitry can operate with a smaller variance (e.g., 10% variation), and some circuitry can operate with a larger variance (e.g., 30%). For example, with a 10% variation, the phrase "the switch controller is configured to operate the primary switches to cause current flowing in each primary winding to be approximately 90 or 270 degrees out of phase with current flowing in the other primary winding" means that each primary winding is in a range of 90×0.9 to 90×1.1 degrees or in a range of 120×0.9 to 120×1.1 degrees out of phase with current flowing in the other primary winding.

In some examples, the system includes a switching power converter for powering a semiconductor load including at least one GPU, CPU, or ASIC. The semiconductor load has a load footprint, and a plurality of power input terminals located within the load footprint. The switching power converter has a converter footprint, in which the output terminals of the switching power converter are arranged within the converter footprint, and the switching power converter is configured to occupy, in whole or in part, the load footprint. For example, the semiconductor load may be mounted on a top side of a substrate or PCB, and the switching power converter may be mounted on a bottom side of the substrate or PCB, in which the footprint of the switching power converter overlaps the footprint of the semiconductor load. The switching power converter delivers power through conductive traces or vias in the substrate or PCB.

The examples of switching power converters described above include multi-layer printed circuit boards having components formed in or mounted to the printed circuit boards. It is understood that the printed circuit boards can be replaced with other types of substrates depending on the applications.

Accordingly, other embodiments are within the scope of the following claims.

What is claimed is:

1. A method of powering a semiconductor load, the method comprising:

providing a first package including a printed circuit board and an output circuit mounted to the printed circuit board, the output circuit including a plurality of electronic switches and a plurality of magnetically coupled windings, wherein the printed circuit board and the output circuit are encapsulated in a magnetically permeable medium that forms a magnetic core structure configured to enable magnetic coupling between the magnetically coupled windings; and operating the electronic switches to drive the magnetically coupled windings in a series of converter operating cycles to generate power that is provided to the semiconductor load, wherein the electronic switches do not receive control signals from a source external to the first package.

2. The method of claim 1 wherein the printed circuit board comprises a plurality of conductive layers and a plurality of insulation layers, each conductive layer being separated from one or more adjacent conductive layers by one or more respective insulation layers, wherein the printed circuit board defines a plurality of core leg apertures at a plurality of leg locations; and wherein the magnetically permeable core structure comprises a plurality of core legs that pass through the core leg apertures, the magnetically permeable core structure defining magnetic paths that pass through the conductive layers in at least two of the leg locations.

3. The method of claim 2 wherein the plurality of magnetically coupled windings comprise:

a plurality of primary windings formed in the conductive layers, each primary winding extending between respective leg locations; and a plurality of secondary windings formed in the conductive layers, each secondary winding passing between respective leg locations.

4. The method of claim 3 wherein the output circuit comprises a plurality of converter cell elements, each converter cell element including one of the electronic switches, one of the secondary windings, and an output terminal, wherein the secondary winding of each converter cell element is arranged between respective leg locations and overlaps a respective primary winding, the secondary winding has a first end connected to a terminal of the respective electronic switch and a second end connected to the respective output terminal.

5. The method of claim 4 wherein the output circuit comprises:

a plurality of smart dual switching ("SDS") devices, each SDS device including SDS circuitry constructed and arranged as a self-contained electronic switching device, the SDS circuitry including:

a first electronic switch having a first control terminal, a first switched terminal, and a first common terminal;

a second electronic switch having a second control terminal, a second switched terminal, and a second common terminal;

a first SDS control circuit having an input connected to the first switched terminal, an input connected to the second switched terminal, and an output connected to the first control terminal; and a second SDS control circuit having an input connected to the first switched terminal, an input connected to the second switched terminal, and an output connected to the second control terminal;

wherein the electronic switch of each of the plurality of converter cell elements comprises a respective electronic switch in a respective SDS device; and wherein the method comprises using the first SDS control circuit to turn the first electronic switch ON and OFF under first predetermined conditions, and using the second SDS control circuit to turn the second electronic switch ON and OFF under second predetermined conditions.

6. An apparatus comprising:

a switching power converter including a transformer including a magnetically permeable core structure, the power converter including a multi-layer printed circuit board having a plurality of conductive layers and a plurality of insulation layers, and each conductive layer being separated from one or more adjacent conductive layers by one or more respective insulation layers;

the transformer including at least one primary winding and a plurality of secondary windings formed in one or more of the conductive layers in the printed circuit board, the secondary windings being magnetically coupled to the at least one primary winding through the magnetically permeable core structure;

a plurality of self-controlled semiconductor switching devices electrically connected to selectively connect a respective secondary winding to an output terminal, each self-controlled semiconductor switching device including internal circuitry configured to control turning ON and OFF of one or more switches within the device based upon signals at terminals of the respective one or more switches;

a first package, including the magnetically permeable core structure, encapsulating the printed circuit board and the plurality of self-controlled semiconductor switching devices mounted to the printed circuit board, the first package including a cured magnetically-permeable encapsulation compound having a relative magnetic permeability of at least 10;

the PCB being free of control signals; and a driver circuit, external to the first package including one or more power switches and a switch controller configured and arranged to operate the power switches to drive the at least one primary winding in a series of converter operating cycles during which power is converted from an input to the driver via the primary and secondary windings for delivery to the output terminal.

7. The apparatus of claim 6 wherein the internal circuitry configured to control turning ON and OFF of the one or more switches within the device does not receive control signals from a source external to the first package.

8. The apparatus of claim 6 wherein the printed circuit board lacks conductive traces for transmitting control signals to the one or more switches within the self-controlled semiconductor switching device from a source that is external to the first package; and wherein the apparatus further comprises driver circuitry comprising primary switches configured to drive the at least one primary winding, and the driver circuitry is enclosed in a second package that is separate from the first package.

9. The apparatus of claim 6, further comprising a resonant circuit including the transformer, having a characteristic resonant period and wherein the driver circuit is configured to operate the switches in a series of converter operating cycles that include power transfer intervals having a duration approximately equal to one half of the characteristic resonant period of the resonant circuit separated by energy recycling intervals during which parasitic capacitances in the converter are charged and discharged reducing a voltage across a respective switch prior to turning the respective switch ON.

10. The apparatus of claim 6, further comprising a resonant power train including the transformer and having a multi-phase buck converter topology.

11. The apparatus of claim 6 wherein the magnetic core structure comprises a plurality of core legs;

wherein the first package comprises a plurality of magnetically-permeable core pieces disposed on at least one of a top surface or a bottom surface of the printed circuit board; and wherein the magnetically-permeable core pieces are configured to protrude a predetermined distance from the at least one surface of the PCB and are located to increase the relative permeability of a magnetic path between adjacent core legs.

12. The apparatus of claim 6 wherein the first package comprises one or more conductive metal layers on at least one exterior surface, the one or more conductive metal layers forming a plurality of electrical contacts on the at least one exterior surface of the first package;

wherein the cured magnetically-permeable encapsulation compound defines a plurality of terminal holes that extend from the at least one exterior surface to plurality of the conductive layers in the printed circuit board, the terminal holes exposing respective portions of the conductive layers; and wherein the first package comprises a conductive terminal in each of the terminal holes, and an electrical connection between the conductive terminal and a respective electrical contact on the exterior surface of the first package.

13. The apparatus of claim 6 wherein the first package comprises a first cured magnetically-permeable layer and a second cured magnetically-permeable layer, and the printed circuit board is positioned between the first cured magnetically-permeable layer and the second cured magnetically-permeable layer.

14. The apparatus of claim 13 wherein the first package comprises one or more conductive metal layers on at least one exterior surface, the one or more conductive metal layers forming a plurality of electrical contacts on the at least one exterior surface of the first package;

wherein the cured magnetically-permeable encapsulation compound defines a plurality of terminal holes that extend from the at least one exterior surface to the conductive layers in the printed circuit board, the terminal holes exposing respective portions of the conductive layers; and wherein the first package comprises a conductive terminal in each of the terminal holes, and an electrical connection between the conductive terminal and a respective electrical contact on the exterior surface of the first package.

15. An apparatus comprising:

a switching power converter comprising:

a multi-layer printed circuit board ("PCB") including a plurality of conductive layers and a plurality of insulation layers, each conductive layer being separated from one or more adjacent conductive layers by one or more respective insulation layers;

wherein the multi-layer printed circuit board defines a plurality of core leg apertures;

a magnetically permeable core structure comprising magnetically-permeable encapsulation compound that encapsulates at least a portion of the multi-layer printed circuit board and fills in the core leg apertures, wherein the magnetically permeable core structure includes magnetic paths that pass through the conductive layers in at least two leg locations;

at least one main winding formed in one or more of the conductive layers;

a plurality of winding elements formed in the conductive layers; and a plurality of converter cell elements, each including a switch and a respective winding element, the converter cell elements being physically arranged in a step and repeat pattern, in a plurality of groups, the winding elements in each group of cell elements being arranged to overlap a respective main winding;

wherein the respective winding element associated with each cell element has a first end connected to a terminal of the switch in the cell element and a second end connected to an output terminal.

16. The apparatus of claim 15 wherein the plurality of core leg apertures comprise five rows of core leg apertures;

wherein the at least one main winding comprises at least a first main winding and a second main winding, the first main winding has a first segment that passes through a first region between the first and second rows of core leg apertures, the first main winding has a second segment that passes through a third region between the third and fourth rows of the core leg apertures.

17. The apparatus of claim 16 wherein the second main winding has a first segment that passes through a second region between the second and third rows of core leg apertures, the second main winding has a second segment that passes through a fourth region between the fourth and fifth rows of the core leg apertures.

18. The apparatus of claim 16 wherein the plurality of windings comprise a first set of secondary windings, a second set of secondary windings, a third set of secondary windings, and a fourth set of secondary windings;

wherein the first main winding overlaps at least a portion of each of the first and second sets of secondary windings;

wherein the second main winding overlaps at least a portion of each of the third and fourth sets of secondary windings.

19. The apparatus of claim 16 wherein the switching power converter is configured to operate in a first phase and a second phase;

wherein during the first phase, a first set of primary switches are configured to drive the first main winding and cause output current to flow from the first and second sets of secondary windings;

wherein during the second phase, a second set of primary switches are configured to drive the second main winding and cause output current to flow from the third and fourth sets of secondary windings.

20. The apparatus of claim 16 wherein the switching power converter is configured to operate in a first phase, a second phase, and a third phase;

wherein during the first phase, a first set of primary switches are configured to drive the first main winding and cause output current to flow from the first and second sets of secondary windings;

wherein during the second phase, a second set of primary switches are configured to drive the second main winding and cause output current to flow from the second and third sets of secondary windings;

wherein during the third phase, a third set of primary switches are configured to drive the third main winding and cause output current to flow from the fifth and sixth sets of secondary windings.

21. The apparatus of claim 15 wherein the plurality of core leg apertures comprise seven rows of core leg apertures;

wherein the at least one main winding comprises at least a first main winding, a second main winding, and a third main winding, wherein the first main winding has a first segment that passes through a first region between the first and second rows of core leg apertures, the first main winding has a second segment that passes through a fourth region between the fourth and fifth rows of the core leg apertures;

wherein the second main winding has a first segment that passes through a second region between the second and third rows of core leg apertures, the second main winding has a second segment that passes through a fifth region between the fifth and sixth rows of the core leg apertures;

wherein the third main winding has a first segment that passes through a third region between the third and fourth rows of core leg apertures, the third main winding has a second segment that passes through a sixth region between the sixth and seventh rows of the core leg apertures.

22. The apparatus of claim 21 wherein the plurality of windings comprise a first set of secondary windings, a second set of secondary windings, a third set of secondary windings, a fourth set of secondary windings, a fifth set of secondary windings, and a sixth set of secondary windings;

wherein the first main winding overlaps at least a portion of each of the first and second sets of secondary windings;

wherein the second main winding overlaps at least a portion of each of the third and fourth sets of secondary windings;

wherein the third main winding overlaps at least a portion of each of the fifth and sixth sets of secondary windings.

23. An apparatus comprising:

an N-phase switching power converter including a multi-layer printed circuit board ("PCB") including a plurality of conductive layers and a plurality of insulation layers, each conductive layer being separated from one or more adjacent conductive layers by one or more respective insulation layers, wherein N≥2;

wherein at least two main windings and at least four sets of secondary winding elements are formed in the conductive layers;

wherein the switching power converter has a specific output resistance not more than 50 $mOhm \times mm^2$.

24. The apparatus of claim 23 wherein the switching power converter has a specific output resistance not more than 30 $mOhm \times mm^2$.

25. The apparatus of claim 23 wherein the switching power converter has a specific output resistance not more than 20 $mOhm \times mm^2$.

26. An apparatus comprising:

a multi-layer printed circuit board ("PCB") including a plurality of conductive layers and a plurality of insulation layers, each conductive layer being separated from one or more adjacent conductive layers by one or more respective insulation layers, in which the printed circuit board has a top surface and a bottom surface;

wherein the multi-layer printed circuit board defines a plurality of core leg apertures;

at least one main winding formed in one or more of the conductive layers;

a plurality of winding elements formed in the conductive layers, in which portions of the winding elements are arranged to overlap respective portions of the at least one main winding;

at least one electronic component disposed on at least one of the top surface or the bottom surface of the printed circuit board;

a magnetically-permeable core structure comprising a cured magnetically-permeable encapsulation compound that encapsulates at least a portion of the multi-layer printed circuit board and fills in core leg apertures;

wherein the magnetically-permeable core structure includes magnetic paths that pass through the conductive layers in at least two leg locations;

wherein the at least one electronic component is configured to enhance stability of the printed circuit board when the printed circuit board is disposed in a mold cavity during an encapsulation process in which a magnetically-permeable encapsulation compound is injected into the mold cavity to cause the printed circuit board to be encapsulated by the magnetically-permeable encapsulation compound.

27. The apparatus of claim 26 wherein the at least one electronic component comprises at least one of a switch or a capacitor.

28. The apparatus of claim 26 wherein the at least one electronic component comprises at least a first component mounted on a top surface of the printed circuit board and a second component mounted on a bottom surface of the printed circuit board, in which the first component has a footprint on the printed circuit board that overlaps a footprint of the second component on the printed circuit board.

* * * * *